(12) United States Patent
Kushiro et al.

(10) Patent No.: US 6,285,357 B1
(45) Date of Patent: Sep. 4, 2001

(54) REMOTE CONTROL DEVICE

(75) Inventors: Noriyuki Kushiro; Noriyuki Komiya; Masanori Nakata; Hidetake Watanabe, all of Tokyo; Nobuo Hata; Sayuri Fukano, both of Kanagawa, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/297,201

(22) PCT Filed: Dec. 19, 1997

(86) PCT No.: PCT/JP97/04722

§ 371 Date: Apr. 27, 1999

§ 102(e) Date: Apr. 27, 1999

(87) PCT Pub. No.: WO99/16282

PCT Pub. Date: Apr. 1, 1999

(30) Foreign Application Priority Data

Sep. 25, 1997 (JP) .................................................... 9-259700

(51) Int. Cl.$^7$ ........................................................... G09G 5/00
(52) U.S. Cl. ........................... 345/169; 345/168; 348/734
(58) Field of Search .................... 345/169, 156, 345/157, 158; 348/734

(56) References Cited

U.S. PATENT DOCUMENTS

| | | | |
|---|---|---|---|
| 5,898,398 | * | 4/1999 | Kumai .................................. 341/176 |
| 5,949,407 | * | 9/1999 | Sato ..................................... 345/169 |
| 5,956,025 | * | 9/1999 | Goulden et al. ..................... 345/327 |
| 5,956,655 | * | 9/1999 | Suzuki et al ........................ 345/169 |
| 5,959,539 | * | 9/1999 | Adolph et al. .................. 340/825.07 |
| 6,046,732 | * | 4/2000 | Nishimoto ............................ 345/169 |
| 6,072,470 | * | 6/2000 | Ishigaki ................................ 345/169 |
| 6,107,992 | * | 8/2000 | Ishigaki ................................ 345/169 |

FOREIGN PATENT DOCUMENTS 8-88883   4/1996   (JP) .

* cited by examiner

*Primary Examiner*—Richard Hjerpe
*Assistant Examiner*—Ronald Laneau
(74) *Attorney, Agent, or Firm*—Burns, Doane, Swecker & Mathis, LLP

(57) ABSTRACT

A remote control unit according to the present invention includes a display unit for displaying a function item select picture where devices to be remotely controlled which are a plurality of function items such as "lighting", "air conditioning", "TV" and so on are arranged, a function item select switch for selecting any one of the devices to be remotely controlled, for example, "air conditioning" in said function item select picture, an affirmation button for deciding said selected device to be remotely controlled, for example, "air conditioning", a denial button for canceling said selected function item, a control unit for allowing another function item select picture where a plurality of set functions which are a plurality of other function items such as "on/off", "temp.", "timer" and so on are arranged to be displayed on the display unit when, for example, "air conditioning" is decided and instructed by said affirmation button, to output an instruction code of, for example, "air conditioning" as decided and instructed, and communication section for converting said outputted instruction code into an infrared ray signal to transmit the infrared ray signal to a device to be remotely controlled, for example, "air conditioning". As a result, the number of the operating switches and buttons can be reduced, the operation procedure of various devices to be remotely controlled can be unified, thereby being capable of obtaining high operability.

22 Claims, 49 Drawing Sheets

FIG. 8

| FUNCTION ITEM | CONTINUOUS OPERATION ACCEPTANCE ADVISABILITY |
|---|---|
| NHK GENERAL | ADVISABILITY |
| NHK EDUCATION | ACCEPTANCE |
| NIPPON TV | ACCEPTANCE |
| TBS | ACCEPTANCE |
| FUJI TV | ACCEPTANCE |
| TV ASAHI | ACCEPTANCE |
| TV TOKYO | ACCEPTANCE |
| TVK TV | ADVISABILITY |
| TV SAITAMA | ACCEPTANCE |
| CHIBA TV | ACCEPTANCE |
| MX TV | ACCEPTANCE |
| NHKBS1 | ADVISABILITY |
| NHKBS2 | ACCEPTANCE |
| WOWWOW | ACCEPTANCE |

FIG. 10

| FUNCTION ITEM | SELECT FREQUENCY (TIME/WEEK) |
|---|---|
| NHK GENERAL | 10 |
| NHK EDUCATION | 5 |
| NIPPON TV | 4 |
| TBS | 2 |
| FUJI TV | 6 |
| TV ASAHI | 5 |
| TV TOKYO | 1 |
| TVK TV | 1 |
| TV SAITAMA | 0 |
| CHIBA TV | 0 |
| MX TV | 1 |
| NHKBS1 | 7 |
| NHKBS2 | 3 |
| WOWWOW | 2 |

AFTER LEARNING

HORIZONAL STATE (ON)

INCLINED STATE (OFF)

FIG. 16(a) FIG. 16(b) FIG. 16(c)
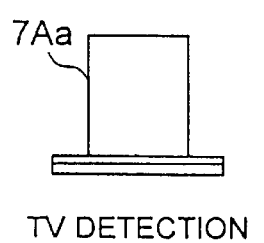
TV DETECTION
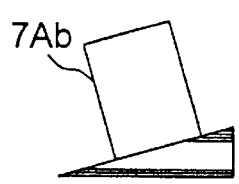
AIR CONDITION DETECTION
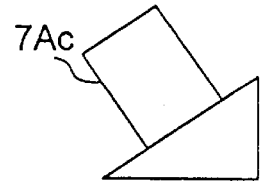
LIGHTING DETECTION
FIG. 16(d) FIG. 16(e) FIG. 16(f)
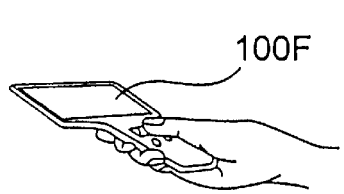
TV SELECT TIME
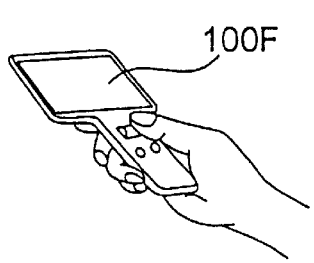
AIR CONDITION SELECT TIME
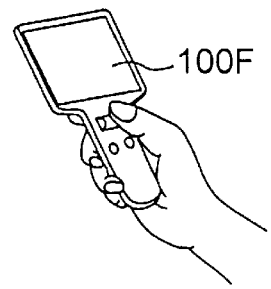
LIGHTING SELECT TIME

[AGE-PERSON MODE]

[NORMAL MODE]

[MANIA MODE]

[DEVICE SELECT OPERATION MODE]　[LIFE PATTERN OPERATION MODE]

REMOTE CONTROL DEVICE

TECHNICAL FIELD

The present invention relates to a remote control unit that remotely controls a plurality of domestic resident electric equipments such as an AV equipment, a lighting equipment or an air conditioning equipment.

BACKGROUND ART

Up to now, as a single remote control unit that remote controls a plurality of domestic resident electric equipments, there has been known a preset remote control unit of a device maker designation system, a remote control unit that learns an infrared-ray command, etc.

However, in the conventional remote control units, although a plurality of devices can be controlled, most of the remote control units are designed in such a manner that operating buttons for each of those devices are arranged on the operating surface of the remote control unit as they are. This is, the number of buttons on the operating surface is increased more as the number of operatable devices is increased. This make it difficult to identify the buttons, resulting in a lowered operability. In particular, when the operator is an aged person or a visually handicapped person, the remote control unit thus structured causes the adjustment error of an air conditioning temperature or the adjustment error of the volume of a television to occur due to misoperation.

Furthermore, there is a case in which even if the same function such as a timer is provided in the respective devices, those devices must be controlled by different buttons for the same function. This also causes the operability to be lowered.

Also, there is a remote control unit of the type in which all the operation is conducted by the depression of the operating buttons such as a tact switch from the viewpoints of the size and costs. The remote control unit of this type makes the reality of the operator's operation poor whereby the degraded response induces misoperation.

Furthermore, there has been proposed a remote control unit as disclosed in Japanese Patent Unexamined Publication No. 8-88883. This remote control unit is designed in such a manner that pad-shaped buttons where a plurality of functions can be selected by one button for each of the devices are provided on the operating surface to apparently reduce the number of the operating buttons. However, although the number of buttons can be reduced, there has not yet been solved such problems in operability that it is difficult to understand the operating method because a plurality of functions are realized by one button, and that a button by which a device to be controlled is operated must be searched on the basis of a pattern instructed on the operating button.

Also, the remote control unit that controls a plurality of devices generally increases in use frequency in comparison with a remote control unit that controls a single device. For that reason, the remote control unit which is generally operated with a battery suffers from a problem that a battery useable time is shortened so that the battery must be frequently replaced by a new one.

In general, when the lighting device is turned on, in order to allow a large amount of infrared rays to be emitted from the lighting device, it is required that the infrared rays of an amount as large as they does not lose noises occurring at the time of turning on the lighting device are outputted from the remote control device to control the lighting device. Compared with such a lighting device, a device such as a television or an air conditioner enables stable communication with a smaller amount of light than the lighting device. In usual, in order to realize stable and sure control with respect to any devices, there are many cases in which the remote control unit that controls a plurality of devices is designed to output an infrared ray necessary for controlling the lighting device. As a result, as described above, with an increase in operation frequency and the amount of emitted light, a power consumption is increased, and the lifetime of the battery for the remote control unit is shortened.

As a measurement to prevent the lifetime of the battery from being shortened, there has been generally known that an infrared ray emission element that narrows a range in which the infrared ray is distributed is used in order to control a device located as far as possible with a little amount of light. However, because the distribution of the infrared ray is narrowed in range, the remote control unit needs to be directed to the device to be controlled with an extreme accuracy at the time of controlling the remote control unit, as a result of which an operator frequently feels stress.

The button manipulation causes the remote control unit to be vibrated by an operator's hand to slightly shift the center of an optical axis, resulting in a problem that communication cannot be conducted. In particular, in the case of an aged person, the power of his arms and fingers becomes weak because he/she is aged, with the result that large vibrations are caused so that those phenomenons remarkably appear.

Also, assuming that a scene where the remote control unit is used in a toilet, a bath room, or the like, there is a case where the operator does not want the remote control using his hands or cannot conduct the remote control for the reason that the operator's hands are unclean or wet, or other reasons. Thus, there is a strong demand that he/she wants to realize the operation according to the operator's intention without directly touching the switch.

SUMMARY OF THE INVENTION

The present invention has been made to solve the above-described subjects, problems, demands and so on, and therefore an object of the present invention is to provide a remote control unit high in operability by reducing the number of buttons and switches as large as possible and unifying the operation between a plurality of devices.

Another object of the present invention is to provide a remote control unit high in operability which prevents misoperation by reducing the number of operating procedures.

Still another object of the present invention is to provide a remote control unit high in operability which prevents misoperation by giving more actual feeling.

Yet still another object of the present invention is to provide a remote control unit that conducts stable and sure communication and does not lose the lifetime of a battery by controlling each of devices with an optimum amount of infrared rays.

Yet still another object of the present invention is to provide a remote control unit that operates stably even if vibrations are generated by operator's hands at the time of operating by conducting infrared ray distribution control optimum to the operator or a device to be controlled.

Yet still another object of the present invention is to provide a remote control unit mounting an operation detection sensor which is capable of controlling a device in a non-contact manner even if the operator cannot use his hands according to the circumstances, by detecting specific operation.

DISCLOSURE OF THE INVENTION

A remote control unit according to the present invention includes display means for displaying a function item select picture where a plurality of function items are arranged; function item select means for selecting any function item in the above-described function item select picture; decision instruction input means for deciding the above-described selected function item; cancel instruction input means for canceling the above-described selected junction item; control means for allowing another function item select picture where a plurality of other function items are arranged to be displayed on the display means when a specific function item is decided and instructed by the above-described decision instruction input means, to output an instruction code of the above-described specific function item as decided and instructed; and communication means for converting the above-described outputted instruction code into a radio signal to transmit the radio signal to a device to be remotely controlled.

Also, in the remote control unit according to the present invention, the above-described control means includes a control processing section and a memory section. The above-described control processing section first reads the function item select picture where a plurality of devices to be remotely controlled are arranged as the plurality of function items from the above-described memory section and allows the function item select picture to be displayed on the above-described display means as an initial picture. Then, when a specific device to be remotely controlled is selected by the above-described function item select means, the above-described control processing section allows the above-described specific device to be remotely controlled to be displayed on the above-described display means in a specific manner so that the above-described specific device is distinguishable from other devices to be remotely controlled. When the above-described specific device to be remotely controlled is decided and instructed by the above-described decision instruction input means, the above-described control processing section reads another function item select picture where a plurality of set functions for the above-described decided and instructed device to be remotely controlled are arranged as the plurality of other function items from the above-described memory section and allows another function item select picture to be displayed on the above-described display means. When a transmission instruction is provided, the above-described control processing section outputs the instruction code of the above-described decided and instructed device to be remotely controlled to the above-described communication means. When a specific set function is selected by the above-described function item select means, the above-described control processing section allows the above-described specific set function to be displayed on the above-described display means in a specific manner so that the above-described specific set function is distinguishable from other set functions. When the above-described specific set function is decided and instructed by the above-described decision instruction input means, the above-described control processing section reads a set-value input picture of the above-described decided and instructed set function from the above-described memory section when a set-value input is necessary and allows the set-value input picture to be displayed on the above-described display means. When a transmission instruction is provided, the above-described control processing section outputs the instruction code of the above-described decided and instructed set function to the above-described communication means, and the above-described communication means converts the above-described instruction code into an infrared signal to transmit the infrared signal to the above-described decided and instructed device to be remotely controlled.

Also, in the remote control unit according to the present invention, the above-described function item select means includes a first function item select switch for moving a cursor of the above-described display means upward, and a second function item select switch for moving the cursor of the above-described display means downward.

Further, in the remote control unit according to the present invention, the above-described control means includes timer means for measuring a continuous operation period of the above-described first function item select switch and measuring a continuous operation period of the above-described second function item select switch, and a continuous-operation judging section for generating a signal equivalent to the operation of a predetermined number of times so that the picture of the above-described display means is scrolled when the continuous operation period measured by the above-described timer means reaches a predetermined period.

Still further, in the remote control unit according to the present invention, the above-described control means further includes continuous-operation acceptance advisability judging means for returning an acceptance enable signal or an acceptance disenable signal referring to a continuous-operation acceptance advisability data base in which continuous-operation acceptance advisability is described for each of the function items, when receiving an inquiry about the advisability of continuous operation from the above-described continuous-operation judging section, wherein the above-described continuous-operation judging section generates no signal equivalent to the operation of the predetermined number of times even if the continuous operation period measured by the above-described timer means reaches the predetermined period, when receiving the acceptance disenable signal from the above-described continuous-operation acceptance advisability judging means.

Further, in the remote control unit according to the present invention, the above-described control means includes item display order managing means for updating the select frequency of a select frequency management table in which a select frequency is described for each of the function items every time any function item is decided and instructed by the above-described decision instruction input means, and for rearranging the function item display order of a function item display list for the function item select picture into the select frequency order of the above-described select frequency management table.

Also, the remote control unit according to the present invention further comprises subject-device identifying means for identifying a device to be remotely controlled on the basis of a direction of a unit body which is directed to the device to be remotely controlled, wherein the above-described control means allows the function item select picture in which a plurality of set functions for the device to be remotely controlled which is identified by the above-described subject-device identifying means are arranged to be displayed on the above-described display means as the initial picture.

Further, in the remote control unit according to the present invention, the above-described subject-device identifying means is an angle sensor for identifying the device to be remotely controlled on the basis of an elevation angle of the unit body when the above-described subject-device identifying means is directed to the device to be remotely controlled.

Also, in the remote control unit according to the present invention, the above-described control means identifies the device to be remotely controlled on the basis of a device identification code received by the above-described communication means, and allows the function item select picture in which a plurality of set functions for the above-described identified device to be remotely controlled are arranged to be displayed on the above-described display means as the initial picture.

Also, the remote control unit according to the present invention further comprises vibration generating means for generating vibrations, wherein the above-described control means allows the above-described vibration generating means to generate the vibrations every time the picture of the above-described display means is updated and displayed.

Further, in the remote control unit according to the present invention, the above-described vibration generating means is a touch-sense response device for generating vibration by beating the unit body.

Also, the remote control unit according to the present invention further comprises sounding means for outputting a sound, wherein the above-described control means allows the above-described sounding means to output the sound every time the picture of the above-described display means is updated and displayed.

Further, in the remote control unit according to the present invention, when any function item in the function item select picture displayed on the above-described display means is selected, the above-described sounding means reads out the above-described selected function item.

Also, the remote control unit according to the present invention further comprises characteristic selecting means for selecting modes according to the number of function items, wherein when one of the above-described modes is selected by the above-described characteristic selecting means, the above-described control means allows the function item select picture where the function items of the number corresponding to the above-described selected mode are arranged to be displayed on the above-described display means.

Also, the remote control unit according to the present invention further comprises pattern operation mode selecting means for selecting an operation mode in which a plurality of devices to be remotely controlled with a predetermined relation can be operated at the same time, wherein when the above-described operation mode is selected by the above-described pattern operation mode selecting means, the above-described control means allows the function item select picture where the function items for operating the plurality of devices to be remotely controlled with the predetermined relation at the same time are arranged to be displayed on the above-described display means.

Also, in the remote control unit according to the present invention, the above-described communication means includes a plurality of infrared ray emission elements, and the above-described control means includes light emission element control means for controlling a light emission intensity of the infrared ray signal transmitted from the above-described communication means in correspondence with the selected device to be remotely controlled, referring to light emission intensity management data where a light emission intensity is described for each of the devices to be remotely controlled in advance.

Also, in the remote control unit according to the present invention, the above-described communication means includes a plurality of infrared ray emission elements different in light distribution characteristic, and the above-described control means includes light emission element control means for controlling a light distribution of the infrared ray signal transmitted from the above-described communication means in correspondence with the selected device to be remotely controlled, referring to light distribution management data base where a light distribution characteristic is described for each of the devices to be remotely controlled in advance.

Further, in the remote control unit according to the present invention, the above-described communication means includes a plurality of infrared ray emission elements different in light distribution characteristic, and the above-described control means includes light emission element control means for controlling a light distribution of the infrared ray signal transmitted from the above-described communication means in correspondence with the selected device to be remotely controlled and the mode selected by the above-described characteristic selecting means, referring to light distribution management data base where a light distribution characteristic is described for each of the devices to be remotely controlled in advance.

Further, in the remote control unit according to the present invention, the above-described control means further includes operation history memory means for storing the device to be remotely controlled which has been selected previously and its operation function, wherein when a device to be remotely controlled which is selected presently and its operation function are identical with the device to be remotely controlled which has been selected previously and its operation function which are stored in the above-described operation history memory means, the above-described light emission element control means controls the light emission intensity of the infrared ray signal transmitted from the above-described communication means to become larger than the light emission intensity of the above-described light emission intensity management data and rewrites the light emission intensity of the above-described light emission intensity management data.

Also, the remote control unit according to the present invention further comprises an operation detecting sensor for detecting specific operation, wherein when the above-described specific operation is detected by the above-described operating detecting sensor, the above-described control means allows the above-described communication means to convert the instruction code of the specific operation of the device to be remotely controlled in correspondence with the above-described specific operation into an infrared ray signal and to transmit the infrared ray signal.

BRIEF DESCRIPTION OF THE DRAWINGS

FIG. 8 is a diagram showing the structure of a data base of the remote control unit according to Embodiment 4 of the present invention;

FIG. 10 is a diagram showing the structure of a table of the remote control unit according to Embodiment 5 of the present invention;

FIG. 16 is a diagram showing the operating state of the remote control unit according to Embodiment 7 of the present invention;

BEST MODES FOR CARRYING OUT THE INVENTION

Hereinafter, the respective embodiments of the present invention will be described with reference to the accompanying drawings.

Embodiment 1

Figure 1:
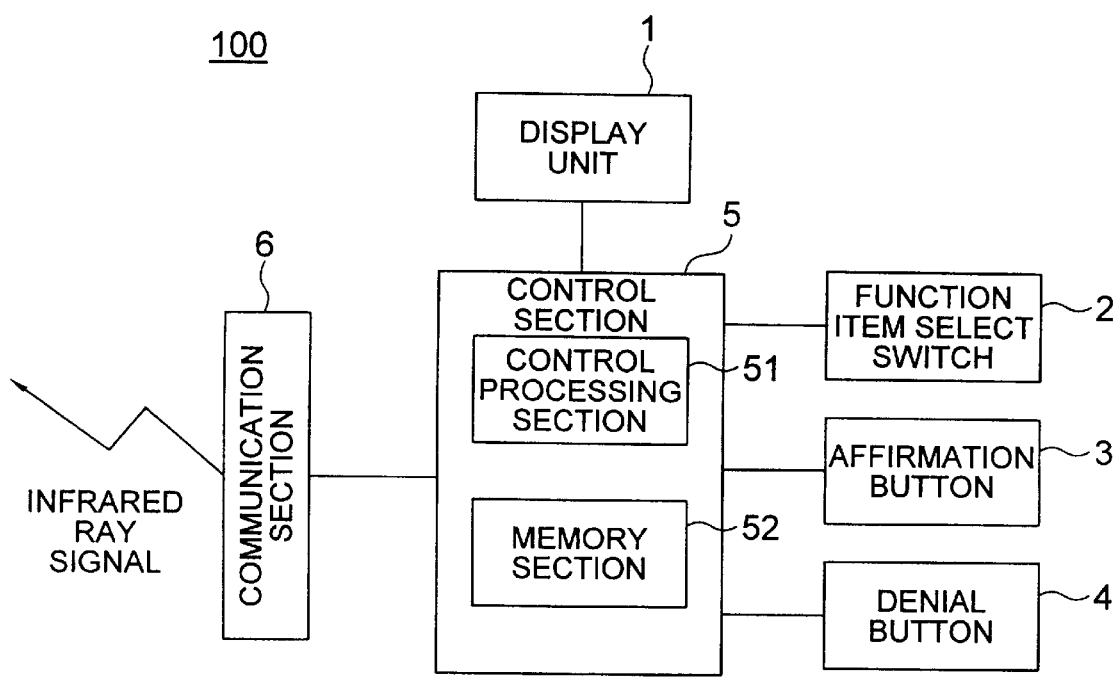
FIG. 1 is a block diagram showing the structure of a remote control unit according to Embodiment 1 of the present invention.
Figure 2:
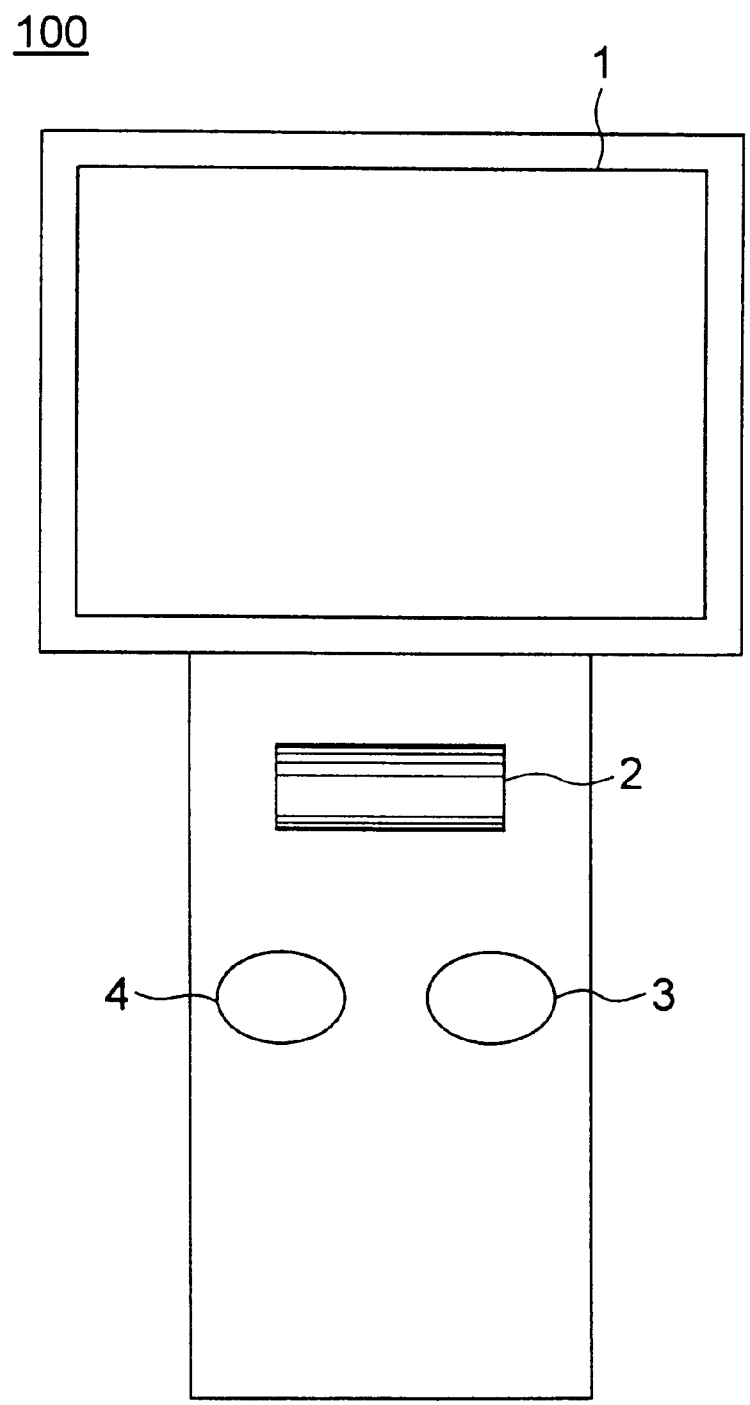
FIG. 2 is a diagram showing the appearance of the remote control unit according to Embodiment 1 of the present invention.

A remote control unit according to Embodiment 1 will be described with reference to FIGS. 1 to 3 and 36. FIG. 1 is a block diagram showing the structure of a remote control unit according to Embodiment 1 of the present invention. FIG. 2 is a diagram showing the appearance of the remote control unit according to Embodiment 1 of the present invention. In the respective drawings, the same references denote identical or like parts.

In FIGS. 1 and 2, reference numeral 100 denotes a remote control unit according to Embodiment 1, and 1 is a display unit serving as display means, which is made up of, for example, an LCD (liquid crystal device) or the like. Reference numeral 2 denotes a function item select switch of a pointing device serving as display selecting means, which is made up of, for example, a rotary encoder or the like, and designed to select any one of function items displayed on the display unit 1 by an operator.

Also, in those figures, reference numeral 3 denotes an affirmation button serving as decision instruction input means, and 4 is a denial button serving as a cancel instruction input means. Those buttons 3 and 4 are made up of a push switch or the like. The affirmation button 3 and the denial button 4 are designed to input an instruction of whether an item selected by the function item select switch 2 is executed or canceled.

Also, in those figures, reference numeral 5 denotes a control unit serving as control means. The control unit 5 is made up of a control processing section 51 and a memory section 52. The control processing section 51 allows a picture stored in the memory section 52 in advance to be displayed on the display unit 1. Also, upon inputted with an operator's instruction from the function item select switch 2, the affirmation button 3 or the denial button 4 as instruction data on the basis of that display, the control processing section 51 allows the contents of the instruction data to be displayed or allowed another picture stored in the memory section 52 to be displayed on the basis of the instruction data. Further, the control processing section 51 transmits, when the instruction data is decided, instruction codes corresponding to the respective devices to a communication section 6 on the basis of the instruction data.

Further, in those figures, reference numeral 6 denotes the communication section serving as communication means which transmits an infrared ray signal obtained by converting the instruction code transmitted from the control section 5 into an infrared ray code.

Figure 3:
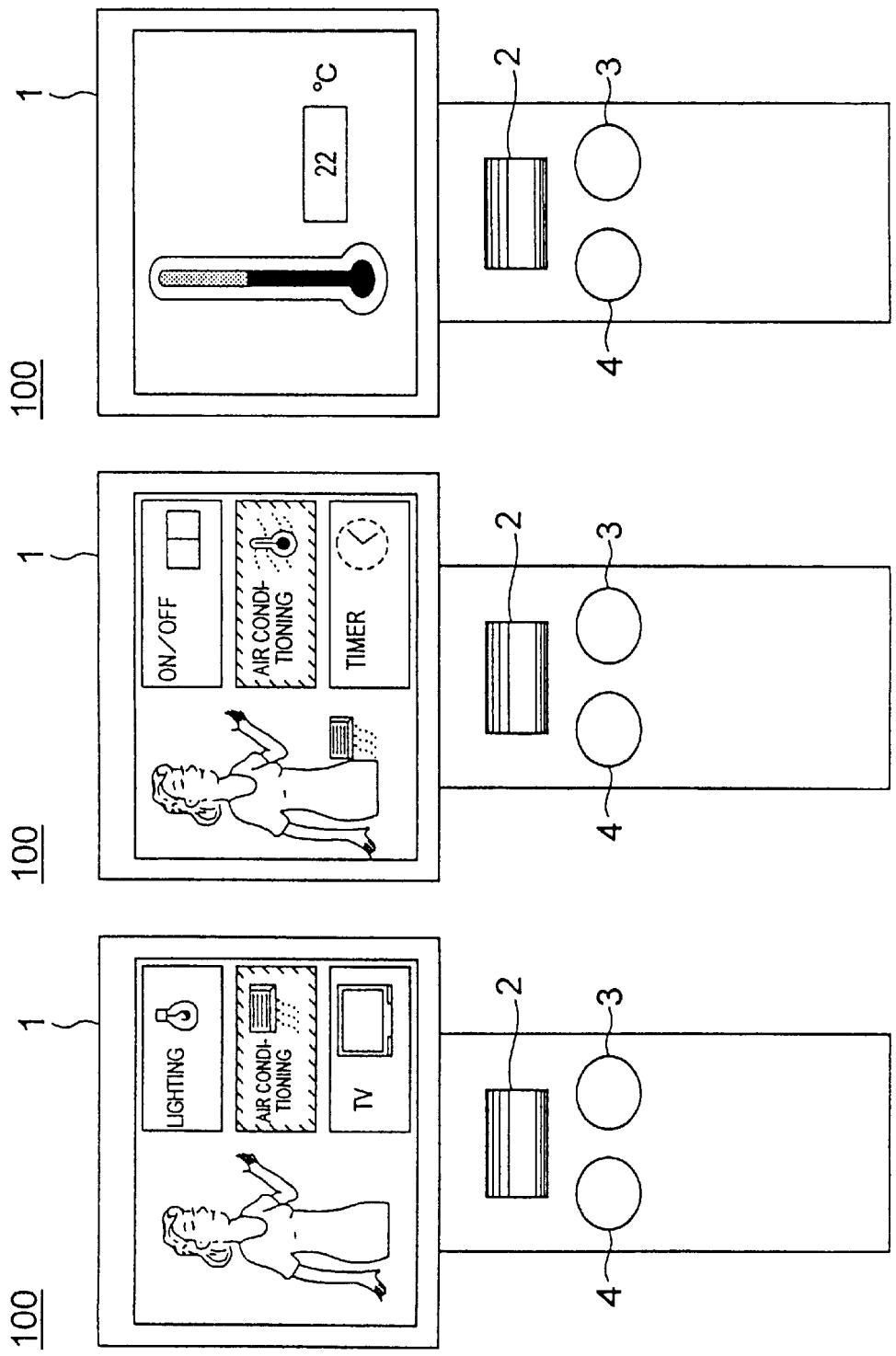
FIG. 3 is a diagram showing a display example of the remote control unit according to Embodiment 1 of the present invention.
Figure 36:
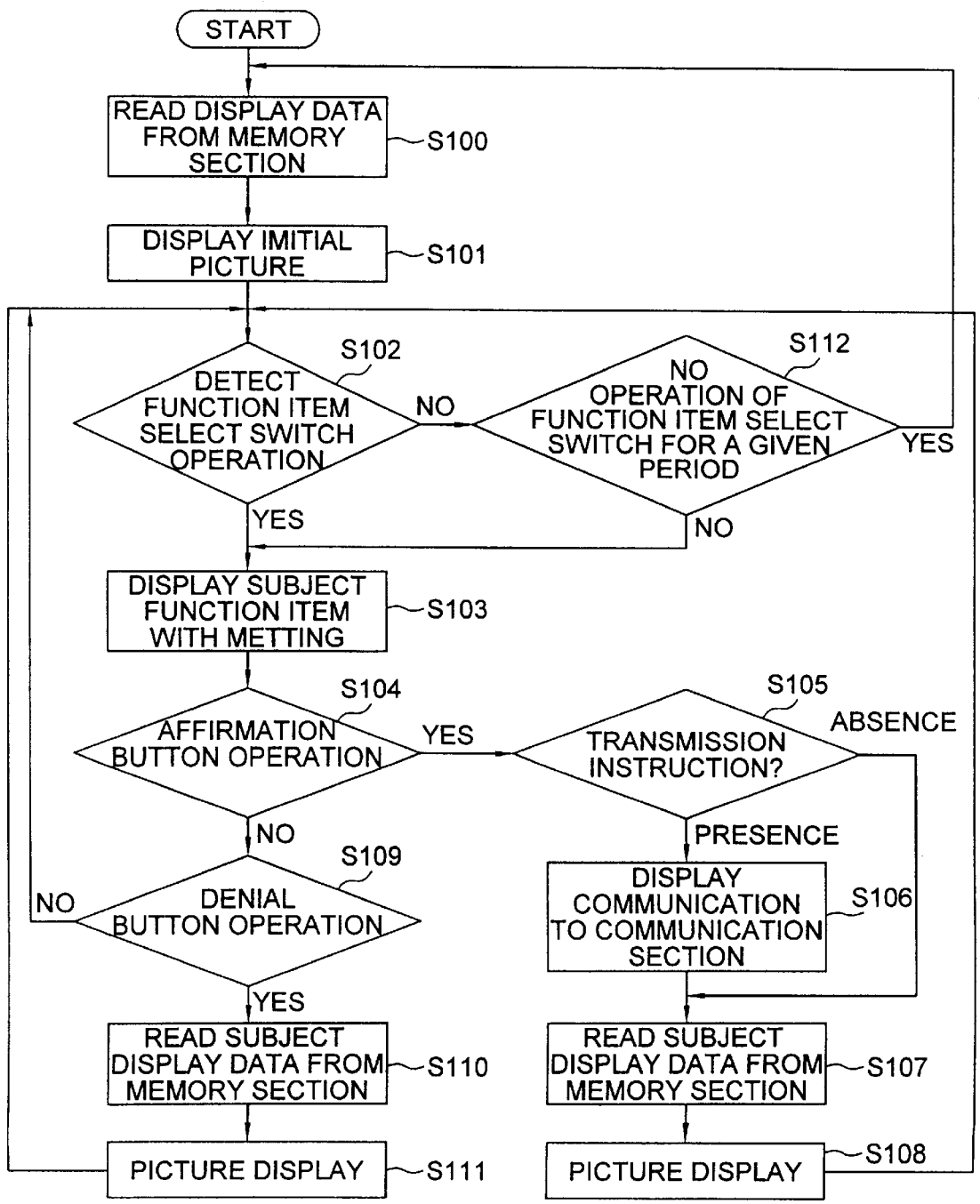
FIG. 36 is a flowchart showing the operation of a control processing section in the remote control unit according to Embodiment 1 of the present invention.

Subsequently, the operation of the remote control unit 100 according to Embodiment 1 will be described with reference to the drawings. FIG. 3 is a diagram showing a display example of the remote control unit according to Embodiment 1 of the present invention. FIG. 36 is a flowchart showing the operation of a control processing section in the remote control unit according to Embodiment 1 of the present invention.

The control processing section 51 reads data (display picture) of FIG. 3(a) which is stored in the memory section 52, and displayed on the display unit 1 (steps S100 to S101). When the operator rotates the function item select switch 2, the control processing section 51 allows one of the function items displayed on the display unit 1 to be displayed so as to be distinct from other function items with inversion, netting or the like on the basis of the amount of rotational movement (steps S102 to S103). When the function item in question is inverted or the like, the operator depresses the affirmation button 3. FIG. 3(a) shows a state in which "air condition" is selected from an initial picture providing the function items of "lighting", "air condition" and "TV".

If the control processing section 51 judges that the affirmation buttons 3 has been depressed, it reads data (display picture) of FIG. 3(b) which is stored in the memory section 52 and then displayed on the display unit 1 (steps S104 to S108). In this example, if the control processing section 51 judges that the operator has depressed the denial button 4 in the case where the selection of air condition is in failure, etc., it reads again data of FIG. 3(a) which is stored in the memory section 52, and allows the data to be displayed on the display unit 1 (steps S109 to S111). In this example, it is assumed that the selection of air condition is correct, that is, this is the function item in question. When the picture of FIG. 3(b) is displayed on the display unit 1, the operator rotates the function item select switch 2 again and selects one function item from the picture providing the function items of "on/off", "temp." and "timer", and then depresses the affirmation button 3 (steps S102 to S104). FIG. 3(b) shows a state in which the item of "temp." is selected.

If the control processing section 51 judges that the affirmation button 3 has been depressed at the temperature item, it reads data (display picture) of FIG. 3(c) which is stored in the memory section 52, and allows the data to be displayed on the display unit 1 (steps S104 to S108). In this example, if the control processing section 51 judges that the operator has depressed the denial button 4 in the case where the selection of temperature is in failure, etc., it reads again data of FIG. 3(b) which is stored in the memory section 52, and allows the data to be displayed on the display unit 1 (steps S109 to S111). In this example, it is assumed that the selection of temperature is correct, that is, this is the function item in question. When the picture of FIG. 3(c) is displayed on the display unit 1, the operator rotates the function item select switch 2. The control processing section 51 allows numerals to be displayed on the display unit 1 while the numerals are moved upward and downward in correspondence with its rotating direction and the amount of rotational movement. When a numeral of temperature to be set is displayed thereon, the operator depresses the affirmation button 3. FIG. 3(c) shows a state in which "22 C" is selected as a set temperature. When the affirmation button 3 is depressed at the respective operation stages, if a transmission instruction exists on the basis of internal information (for example, the presence/absence of the transmission instruction is described for each of the operation stages), a subject infrared ray signal is transmitted (steps S105 to S106).

In the pictures of FIGS. 3(b) and 3(c), in the case where nothing is operated for a given period of time, the control processing section 51 allows the picture of FIG. 3(a) to be displayed on the display unit 1 so that the picture automatically returns to the initial picture of FIG. 3(a) (steps S112 to S100 to S101).

As described above, the remote control unit 100 according to Embodiment 1 is designed in such a manner that the affirmation button 3 is depressed in the case where any one of the function items is selected with the rotation of the function item select switch 2 to execute the function item thus selected, but the denial button 4 is depressed in the case of canceling the selected function item, all of those operation is judged by the control processing section 51, and the picture and the instruction contents are displayed on the display unit 1. Then, since the uniform operation is conducted on all the devices to be remotely controlled which are controllable by the remote control unit 100, the number of operation buttons is reduced, the button search and the operation procedure are simplified, thereby being capable of obtaining a high operability.

Embodiment 2

Figure 4:
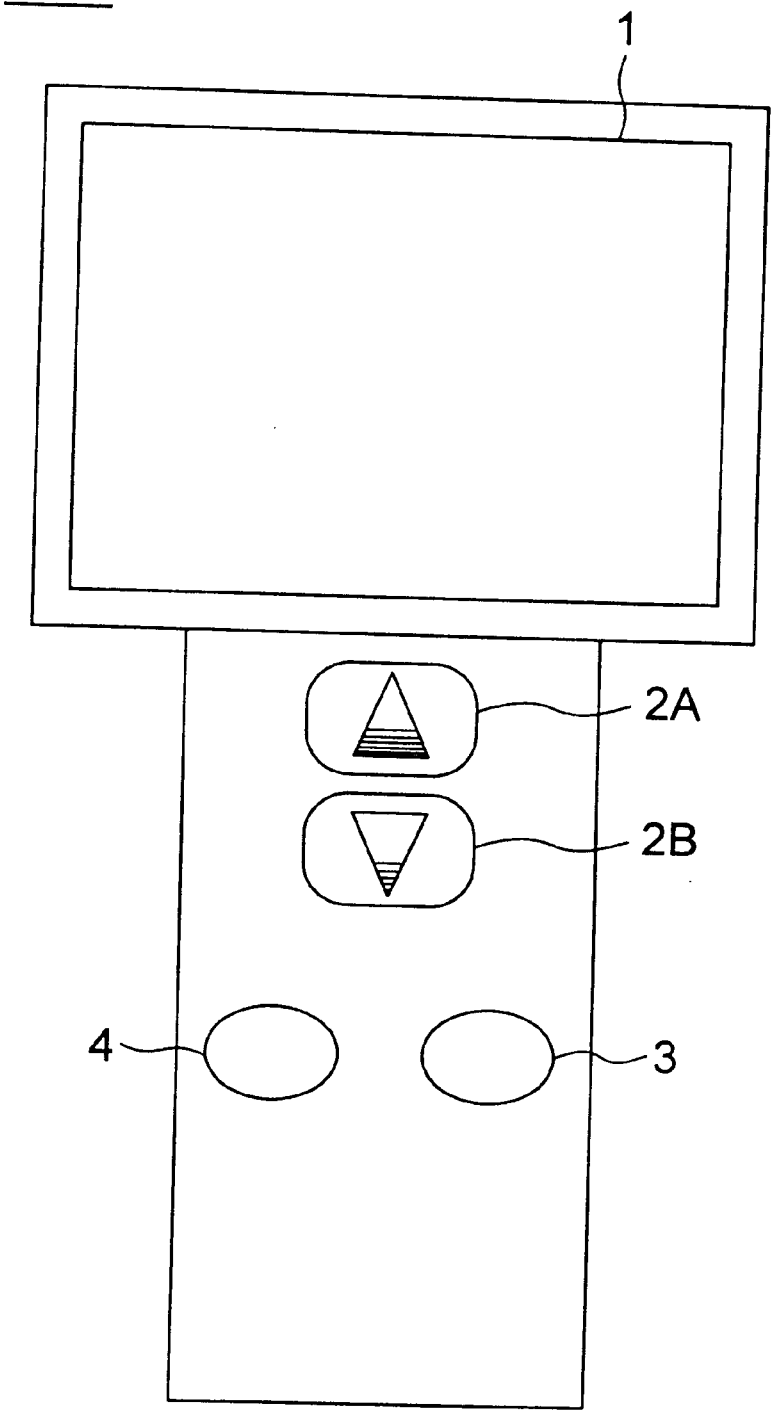
FIG. 4 is a diagram showing the appearance of a remote control unit according to Embodiment 2 of the present invention.

A remote control unit according to Embodiment 2 will be described with reference to FIG. 4. FIG. 4 is a diagram showing the appearance of a remote control unit according to Embodiment 2 of the present invention.

In FIG. 4, reference numeral 100A denotes a remote control unit according to Embodiment 2, and 1 is a display unit serving as display means. Reference numerals 2A and 2B denote function item select switches serving as display selecting means, which are made up of a pair of push switches, and designed for an operator to select any one of function items displayed on the display unit 1 while the function items are moved upward by the function select switch 2A and downward by the function select switch 2B. Reference numeral 3 denotes an affirmation button serving as decision instruction input means, and 4 is a denial button serving as a cancel instruction input means. The affirmation button 3 and the denial button 4 are designed to input an instruction of whether an item selected by the function item select switches 2A and 2B is executed or canceled. Other structures, the display picture, etc., which are not shown are identical with those in the remote control unit 100 according to the above Embodiment 1.

Subsequently, the operation of the remote control unit 100A according to Embodiment 2 will be described.

The control processing section 51 reads data (display picture) of FIG. 3(a) which is stored in the memory section 52, and displayed on the display unit 1. When the operator depresses the function item select switch 2A or 2B, the control processing section 51 allows one of the function items displayed on the display unit 1 to be displayed for each operation so as to be distinct from other function items with inversion, netting or the like. The function item select switch 2A is designed to move the function items upward whereas the function item select switch 2B is designed to move the function items downward.

In other words, in the display picture of FIG. 3(a), in the case where "air condition" is selected by the function item select switch 2A or 2B at presence, if the function item select switch 2A is depressed, the function item of "lighting" is selected, but if the function item select switch 2B is depressed, the function item of "TV" is selected. When the function item in question is inverted, etc. with the depression of the function item select switches 2A and 2B, the operator depresses the affirmation button 3. FIG. 3(a) shows a state in which "air condition" is selected from an initial picture providing the function items of "lighting", "air condition" and "TV".

The operation after the control processing section 51 judges that the affirmation button 3 has been depressed is identical with that in the above-described Embodiment 1, and therefore its description will be omitted.

In the pictures of FIGS. 3(b) and 3(c), in the case where nothing is operated for a given period of time, there is designed such that the picture automatically returns to the initial picture of FIG. 3(a). This is identical with that in the above-described Embodiment 1.

As described above, the remote control unit 100A according to Embodiment 2 is designed in such a manner that the affirmation button 3 is depressed in the case where any one of the function items is selected with the depression of the function item select switches 2A and 2B to execute the function item thus selected, but the denial button 4 is depressed in the case of canceling the selected function item, all of those operation is judged by the control processing section 51, and the picture and the instruction contents are displayed on the display unit 1. Then, since the uniform operation is conducted on all the devices to be remotely controlled which are controllable by the remote control unit 10A, the number of operation buttons is reduced, the button search and the operation procedure are simplified, thereby being capable of obtaining a high operability.

Also, in the above-described Embodiment 1, because the rotating direction of the function item select switch 2 and the moving direction of the function item selection are not intuitive, there is the possibility that the rotating direction of the function item select switch 2 is mistaken at the initial operation stage where the operator is unfamiliar with the operation. However, in Embodiment 2, since the selection of the function items can be conducted by the intuitive operation such as the depression of the upper button and the down button, the operation can be conducted at the time of selecting the items without hesitation.

Embodiment 3

Figure 5:
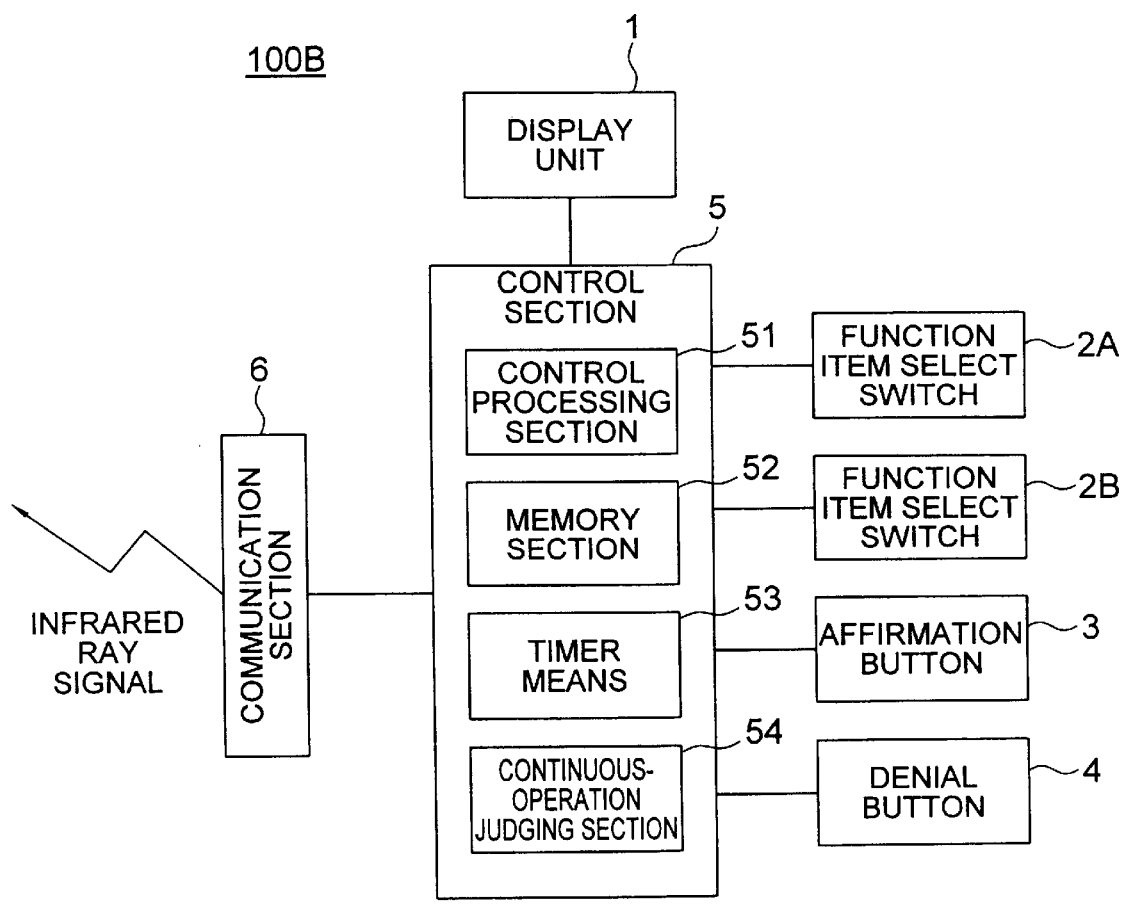
FIG. 5 is a block diagram showing the structure of a remote control unit according to Embodiment 3 of the present invention.

A remote control unit according to Embodiment 3 of the present invention will be described with reference to FIGS. 5, 6 and 37 to 39. FIG. 5 is a block diagram showing the structure of a remote control unit according to Embodiment 3 of the present invention.

In FIG. 5, reference numeral 100B denotes a remote control unit according to Embodiment 3, and 53 is timer means for measuring a continuous depression period of the function item select switches 2A and 2B. Also, reference numeral 54 denotes a continuous-operation judging section that compares a period measured by the timer means 53 with a predetermined set period to judge that the function item select switch 2A or 2B is continuously depressed every time they are identical. Then, the continuous-operation judging section 54 resets a timer period of the timer means 53, and outputs to the control processing section 51 an operation signal equivalent to that at the time of depressing the function item select switches 2A and 2B. Other structures, the display picture, etc., which are not shown are identical with those in the remote control unit 100A according to the above Embodiment 2.

Figure 6:
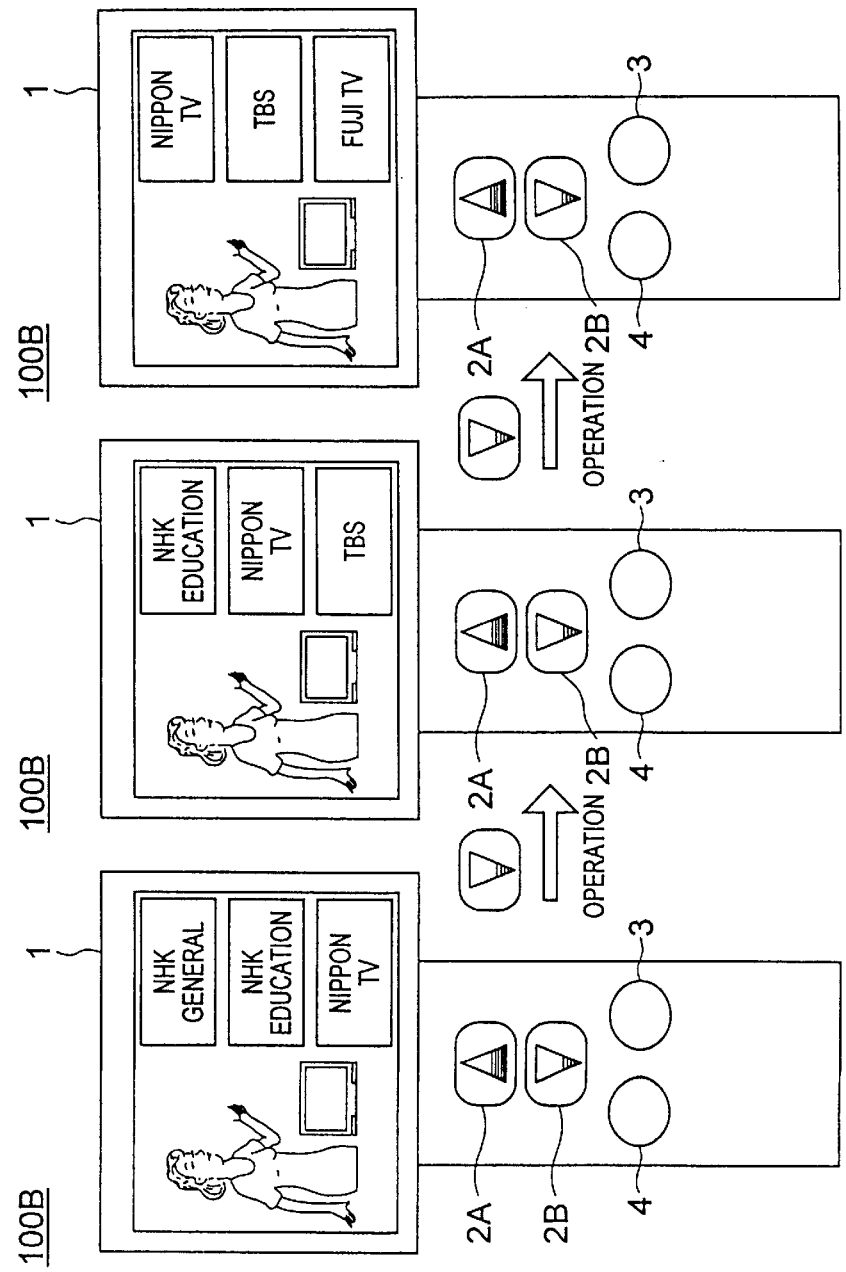
FIG. 6 is a diagram showing a display example of the remote control unit according to Embodiment 3 of the present invention.
Figure 37:
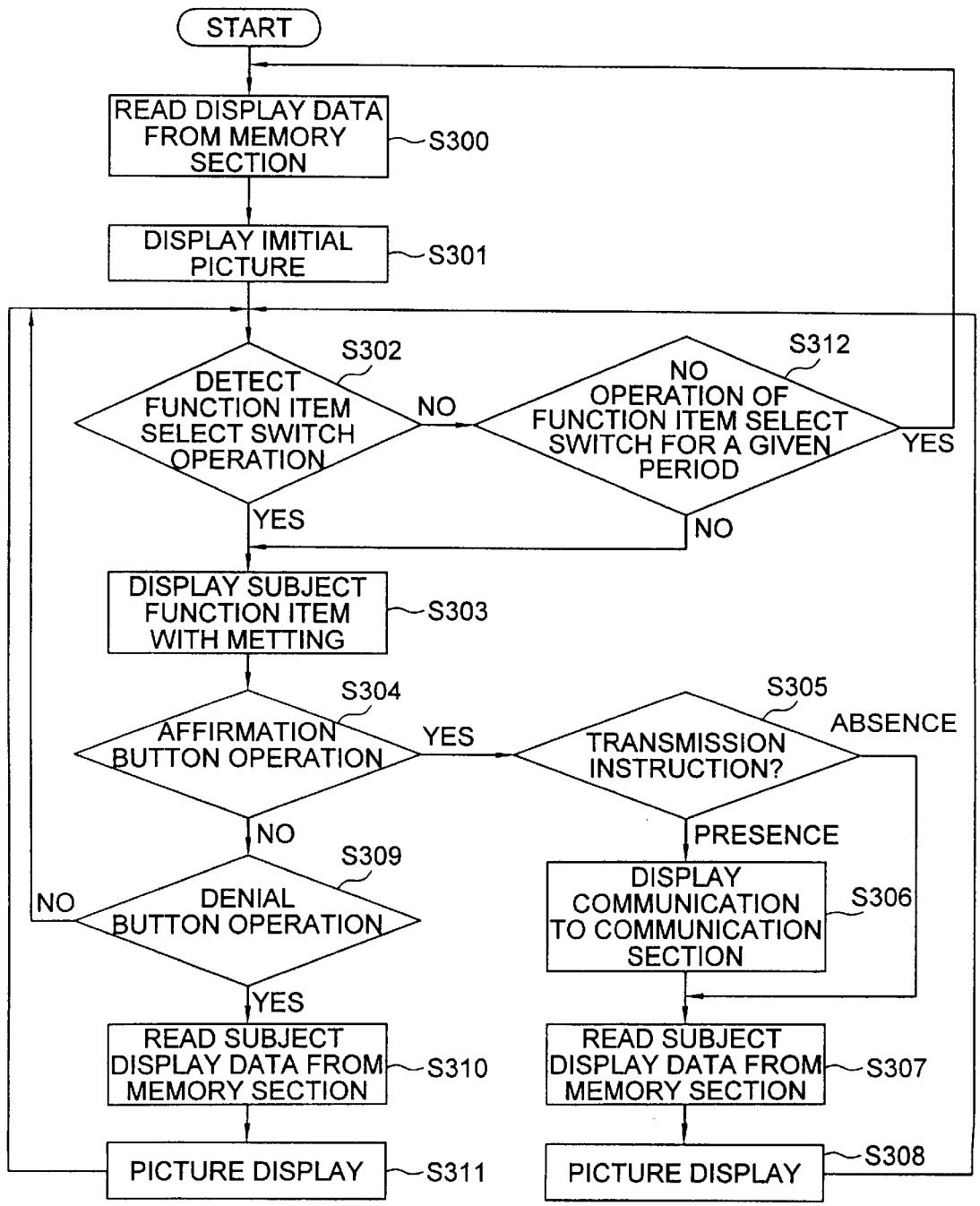
FIG. 37 is a flowchart showing the operation of a control processing section in the remote control unit according to Embodiment 3 of the present invention.
Figure 38:
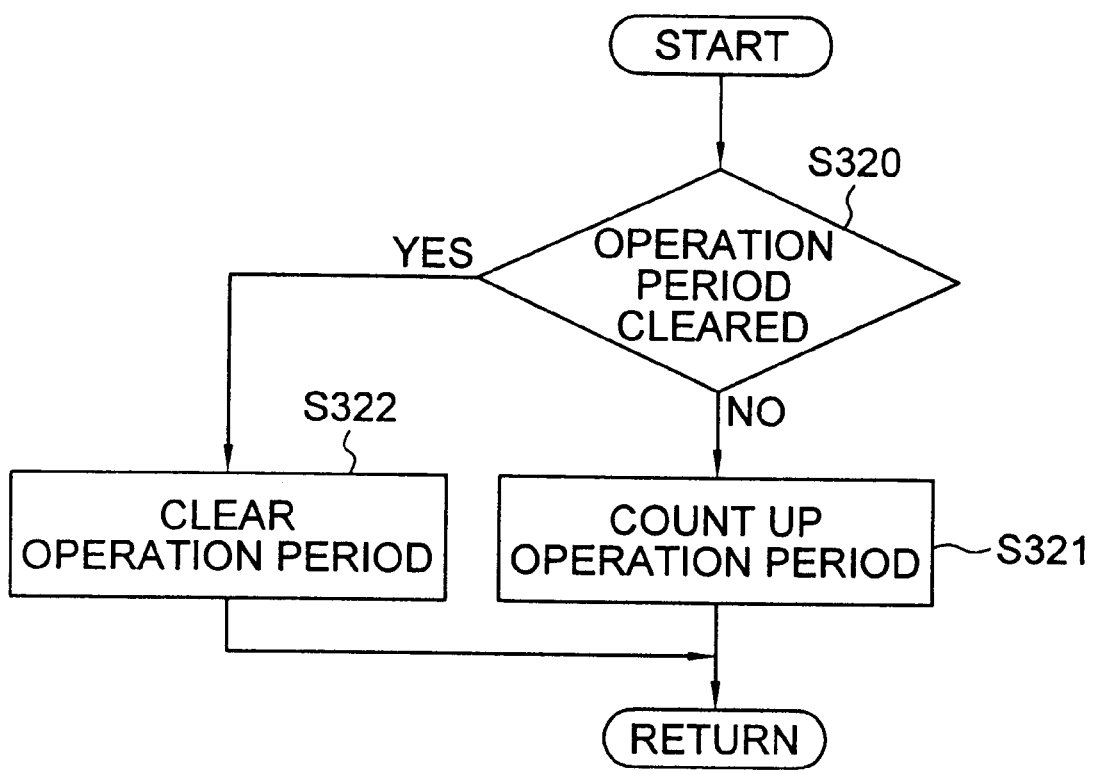
FIG. 38 is a flowchart showing the operation of timer means in the remote control unit according to Embodiment 3 of the present invention.
Figure 39:
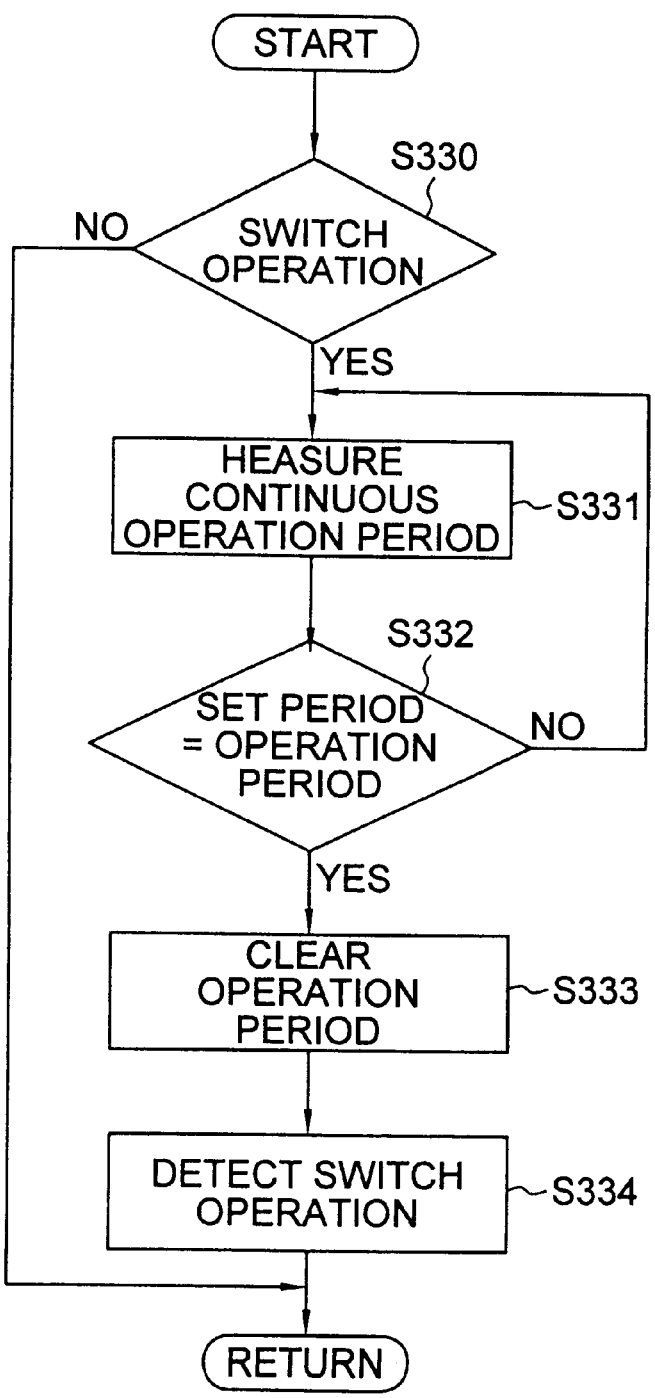
FIG. 39 is a flowchart showing the operation of a continuous-operation judging section in the remote control unit according to Embodiment 3 of the present invention.

Subsequently, the operation of the remote control unit 100B according to Embodiment 3 will be described. FIG. 6 is a diagram showing an example of a display picture and the entire select items at the time of selecting the channels of a television. Also, FIG. 37 is a flowchart showing the operation of a control processing section in the remote control unit according to Embodiment 3. FIG. 38 is a flowchart showing the operation of timer means in the remote control unit according to Embodiment 3. FIG. 39 is a flowchart showing the operation of a continuous-operation judging section in the remote control unit according to Embodiment 3.

In the remote control unit 100B, in the case where the entire function item candidates shown in FIG. 6(d) cannot be fully received in the picture of the display unit 1, when in a state where the lowest one of the function items displayed on the display unit 1 is selected, a function item lower than the lowest function item is selected by the depression of the function item select switch 2B, the function item candidates are moved up in order one by one and then displayed on the display unit 1, as shown in FIG. 6(a) to 6(c).

In the case where any one of the function items is selected from a large number of select items as in the picture of the television at the time of selecting any one of programs of the television, it is required that the function item select switches 2A and 2B are depressed the number of function items, which causes the operational load given to the operator to increase. In other words, in the remote control unit 100B according to Embodiment 3, when "NHK general channel" is set at presence, the function item select switch 2B must be depressed at least 13 times in order to change this channel to "WOWWOW channel".

With use of the remote control unit 100B according to Embodiment 3, for example, if the function item select switch 2B is continuously depressed, the continuous depression period is measured by the timer means 53 (steps S320 to S322), and the measured value is judged by the continuous-operation judging section 54. If it is judged that a given period is elapsed, the continuous-operation judging section 54 outputs to the control processing section 51 a signal identical with that at the time of depressing the function item select switch 2B plural number of times (steps S330 to S334). Since the subsequent operation is the same as that in the above-described example (steps S302 to S312), its description will be omitted. With the continuous depression of the function item select switch 2A or 2B, since the same function as that at the time of depressing the function item select switch 2A or 2B plural times can be obtained, the function item can be selected quickly without depressing the function item select switch 2A or 2B several times.

Embodiment 4

Figure 7:
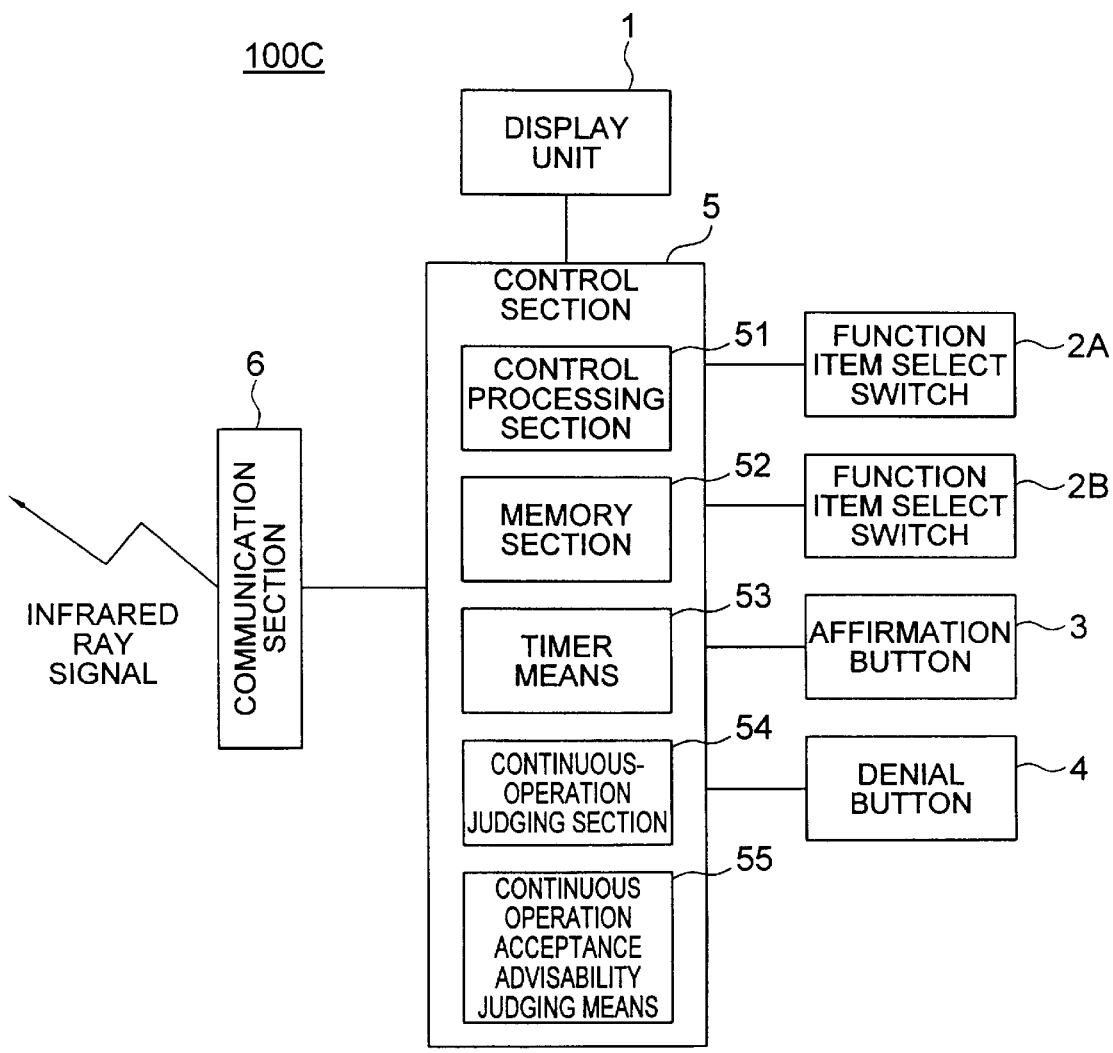
FIG. 7 is a block diagram showing the structure of a remote control unit according to Embodiment 4 of the present invention.
Figure 40:
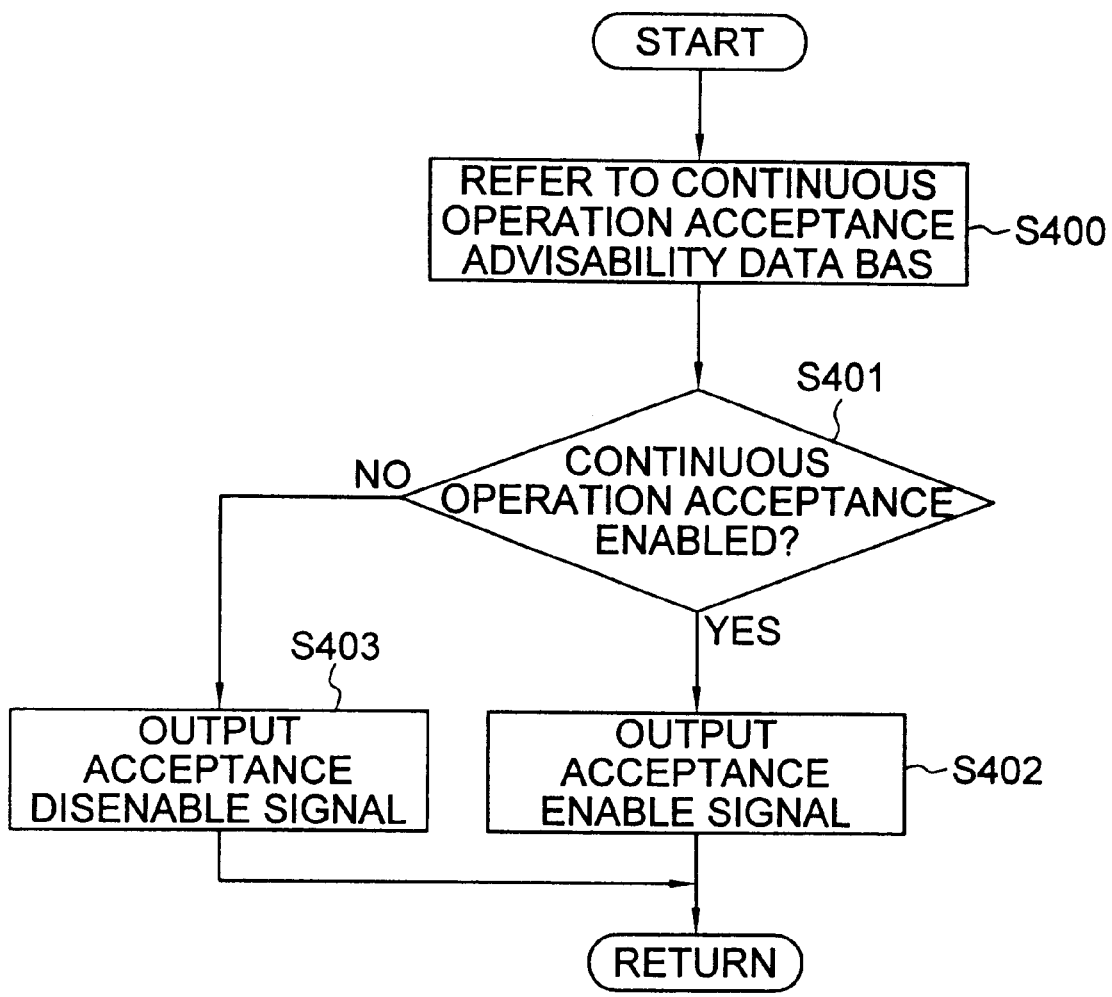
FIG. 40 is a flowchart showing the operation of continuous-operation acceptance advisability judging means in the remote control unit according to Embodiment 4 of the present invention.

A remote control unit according to Embodiment 4 of the present invention will be described with reference to FIGS. 7, 8 and 40. FIG. 7 is a block diagram showing the structure of a remote control unit according to Embodiment 4 of the present invention.

In FIG. 7, reference numeral 100C denotes a remote control unit according to Embodiment 4, and 55 is continuous-operation acceptance advisability judging means. Other parts are identical with those in the above-described embodiment.

FIG. 8 is a diagram showing the structural example of a continuous-operation acceptance advisability data base managed by a continuous-operation acceptance advisability judging means 55 as one example of the function of the remote control unit 100C. FIG. 40 is a flowchart showing the operation of the continuous-operation acceptance advisability judging means in the remote control unit according to Embodiment 4.

As an example of the above-described TV program select scene shown in FIG. 6, a case will be described in which scroll operation is interrupted for each of broadcasting groups consisting of the VHF broadcasting ("NHK general", "NHK education", "Nippon television", "TBS", "Fuji television", "Television Asahi", "Television Tokyo"), the UHF broadcasting ("TVK television", "Television Saitama", "Chiba television", "MX television"), and BS broadcasting ("NHKBS1", "NHKBS2", "WOWWOW"), and user's attention is called, etc.

Upon continuously depressing the function item select switch 2A or 2B, a continuous depression period is counted by timer means 53. The measured period is judged by the continuous-operation judging section 54, and if it is considered that a given period is elapsed, the continuous-operation judging section 54 inquires the advisability of accepting the continuous operation to the continuous acceptance advisability judging means 55.

Upon receiving the above inquiry, the continuous-operation acceptance advisability judging means 55 refers to the continuous-operation acceptance advisability data base shown in FIG. 8 to refer to an acceptance advisability state of the next function item, and outputs an acceptance enable signal to the continuous-operation judging section 54 if the acceptance is enabled (steps S400 to S402).

Upon receiving the above acceptance enable signal, the continuous-operation judging section 54 outputs a signal identical with the depression signal of the function item select switch 2A or 2B to the control processing section 51. Since the operation after receiving the depression signal was described with reference to the above Embodiment 3, its description will be omitted.

In response to an inquiry from the continuous-operation judging section 54, the continuous-operation acceptance advisability judging means 55 refers to the continuous-operation acceptance advisability data base shown in FIG. 8, and if it judges that the acceptance is disenabled, for example, in the case of moving from "Television Tokyo" to "TVK television", the continuous-operation acceptance advisability judging section 55 outputs a signal representing that the acceptance is disenabled to the continuous-operation judging section 54 (steps S400 to S401 to S403).

Subsequently, because the continuous-operation judging section 54, when receiving the above acceptance disenable signal, does not output the depression signal of the function item select switch 2B to the control processing section 51 even if the function item select switch 2B is continuously depressed, the continuous depression is not accepted so that the picture is maintained to a state where "Television Tokyo" is selected.

The operator can know the shifting from the VHF broadcasting to the UHF broadcasting since the scroll operation of the function item by continuous depression stops. When moving the channel to "TVK television" of the UHF broadcasting, since the depression signal is inputted to the control processing section 51 by depressing the function item select switch 2B again, "TVK television" of the UHF broadcasting can be selected. In this manner, the continuous-operation judging section 54 and the continuous-operation acceptance advisability judging means 55 can prevent the function items from being accidentally scrolled with the continuous depression.

Embodiment 4 shows an example of selecting the channels of the television, however, for example, even in the case where an item which is not desired to be simply operated by the user exists in the functions, a remote control unit reduced in abnormal running due to misoperation can be obtained by using the above function.

Embodiment 5

Figure 9:
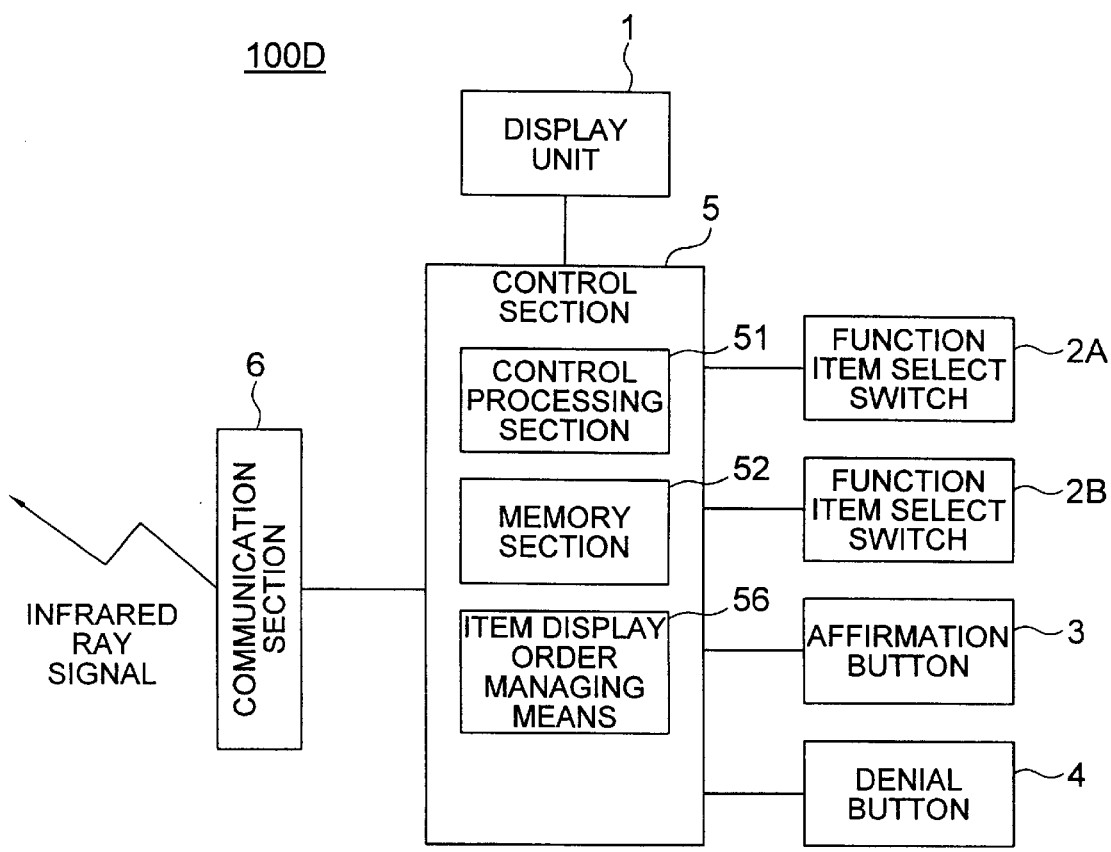
FIG. 9 is a block diagram showing the structure of a remote control unit according to Embodiment 5 of the present invention.
Figure 11A:
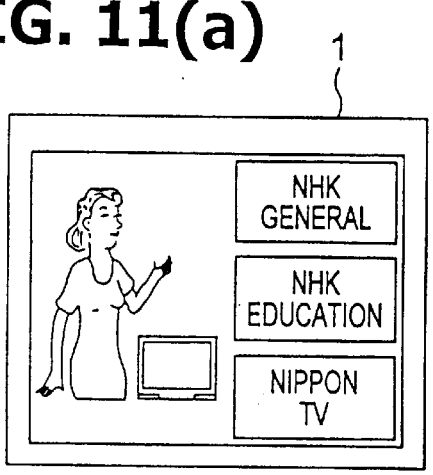
FIG. 11 is a diagram showing a display example of the remote control unit according to Embodiment 5 of the present invention.
Figure 11B:
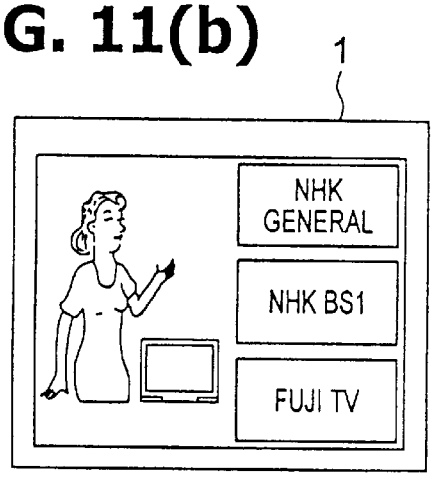
Figure 11C:
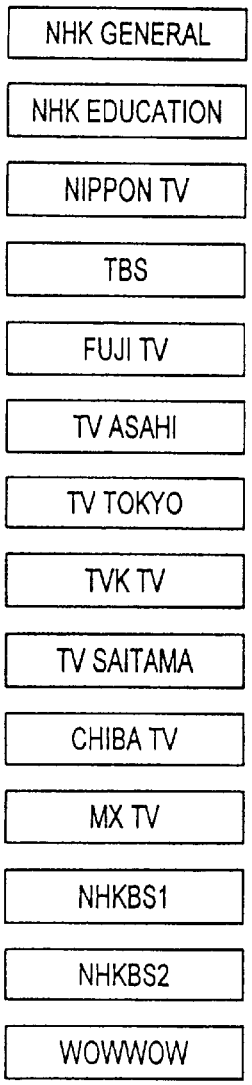
Figure 11D:
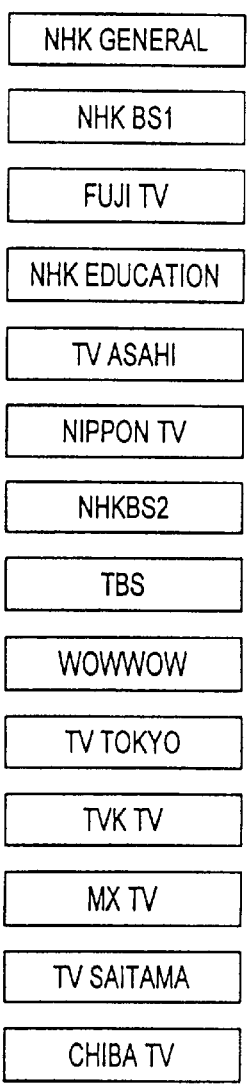

A remote control unit according to Embodiment 5 of the present invention will be described with reference to FIGS. 9 to 11 and 41. FIG. 9 is a block diagram showing the structure of a remote control unit according to Embodiment 5 of the present invention.

In FIG. 9, reference numeral 100D denotes a remote control unit according to Embodiment 5, and 56 is item display order managing means which manages how many times each of the function items stored in the memory section 52 is selected by the affirmation button 3 to replace the order of the function item list in the memory section 52 by a select frequency order. Other parts are identical with those in the above-described embodiment.

Figure 41:
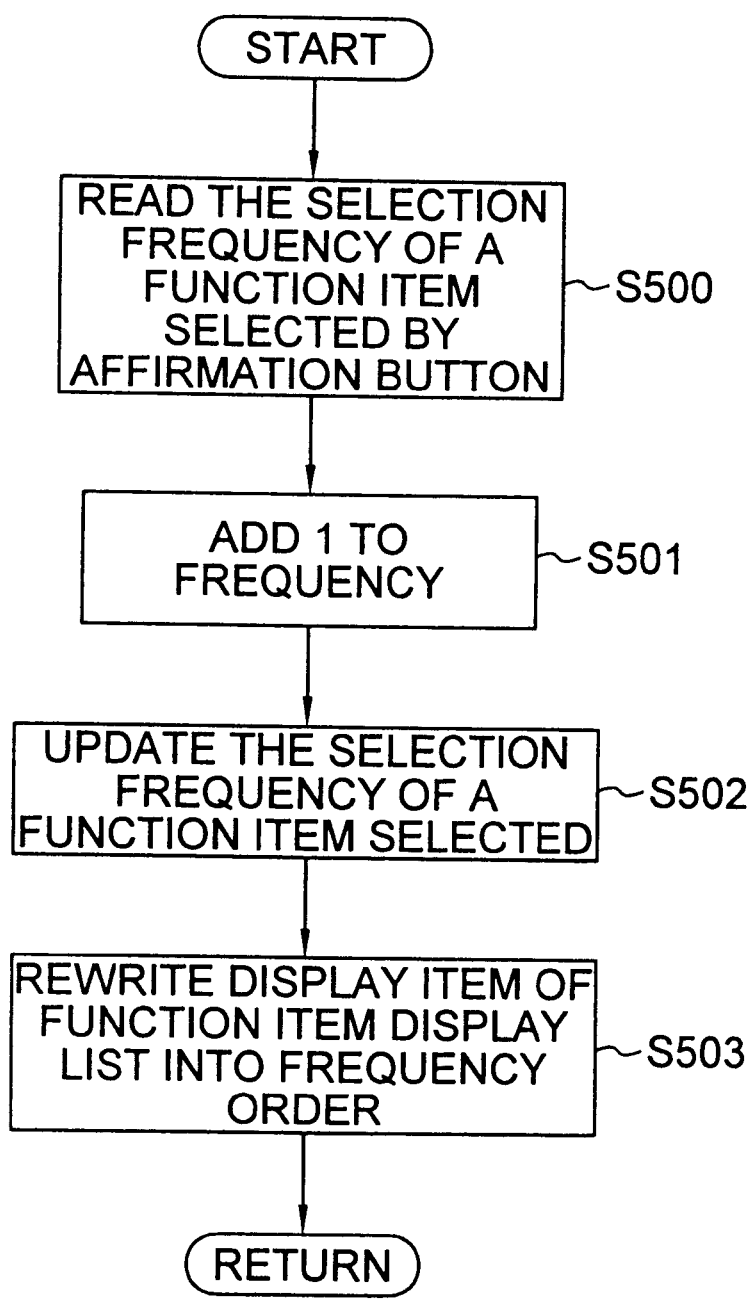
FIG. 41 is a flowchart showing the operation of item display order managing means in the remote control unit according to Embodiment 5 of the present invention.

FIG. 10 shows an example of a select frequency management table within a memory section 52. In the example shown in FIG. 10, the frequency selected per week is managed. Also, FIG. 11 shows a display example of a television program select picture. Further, FIG. 41 is a flowchart showing the operation of the item display order managing means in the remote control unit according to Embodiment 5.

Subsequently, the operation of the remote control unit 100D according to Embodiment 5 will be described. When a function item in question is selected by the function item select switch 2A or 2B and selected by the affirmation button 3, the item display order managing means 56 updates a frequency (the number of times) selected within a given term (in this example, one week) in the select frequency management table shown in FIG. 10 (steps S500 to S502).

The item display order managing means 56 refers to the select frequency management table at the same time when updating the frequency to rewrite the display item order of the function item display list managed by the memory section 52 into the select frequency order (step S503). The control processing section 51 displays the function item rearranged in the select frequency order on the display unit 1. As a result, there can be obtained an easily useable picture where the function items are arranged in the select frequency order.

In an initial stage, as shown in FIGS. 11(*a*) and 11(*c*), program candidates (function items) are arranged in the channel No. order. For example, the state of the select frequency management table within the memory section 52 after it has been elapsed for one week is shown in FIG. 10. FIG. 10 shows an example in which "NHK general" channel are selected ten times, "NHKBS1" channel is selected seven times, "Fuji television" channel is selected six times, . . . for one week.

In response to a display request from the control processing section 51, the function item (program candidates) which are rearranged by the select frequency management table within the memory section 52 in the select frequency order are displayed on the display unit 1, thereby being capable of obtaining an easily useable picture where the function items are arranged in the select frequency order as shown in FIGS. 11(*b*) and 11(*d*).

Usually, since the function items are always displayed in a predetermined order, it is required that a program which is rarely selected is also sequentially selected by the function item select switch 2A or 2B to select a program in question, resulting in a heavy load given to the operator. In the method according to Embodiment 5, since the function items can be arranged in the select frequency order, there can be provided a method of efficiently selecting the function items through minimum operation at the time of use.

Embodiment 6

Figure 12:
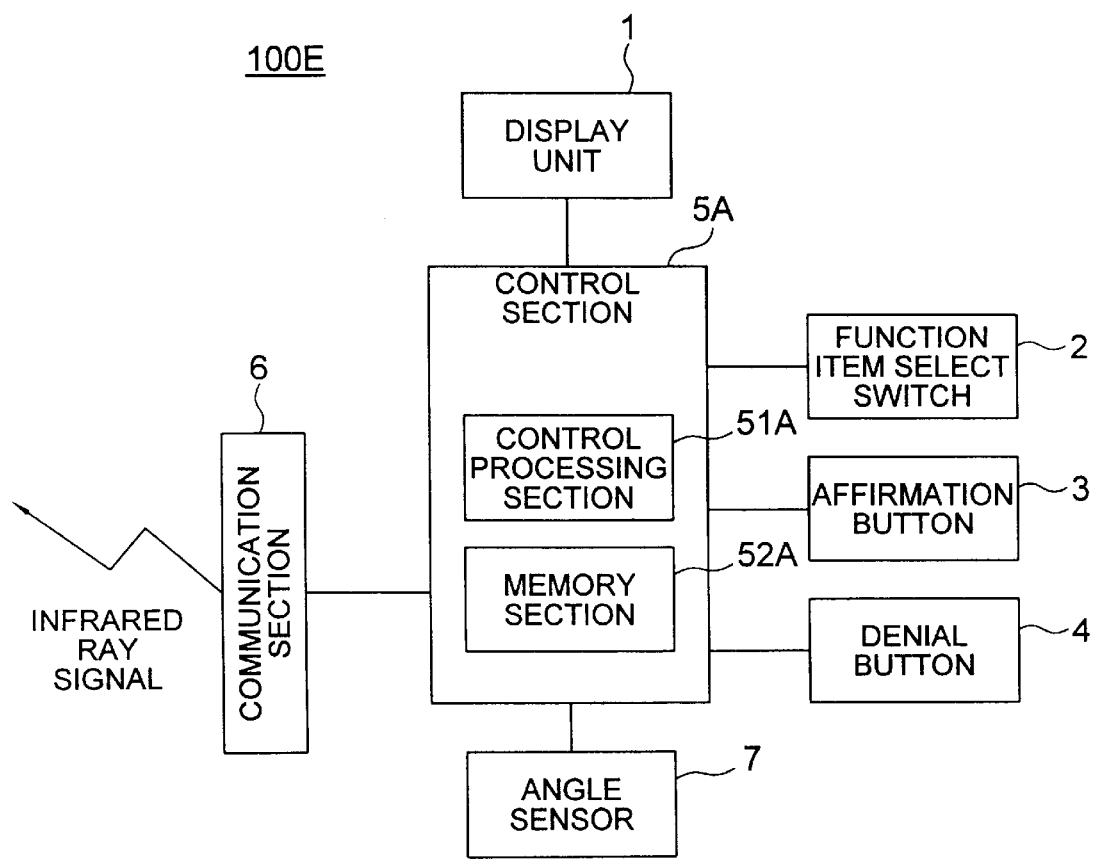
FIG. 12 is a block diagram showing the structure of a remote control unit according to Embodiment 6 of the present invention.

A remote control unit according to Embodiment 6 of the present invention will be described with reference to FIGS. 12 to 14 and 42. FIG. 12 is a block diagram showing the structure of a remote control unit according to Embodiment 6 of the present invention.

In FIG. 12, the display unit 1, the function item select switch 2, the affirmation button 3, the denial button 4 and the communication section 6 have the same functions as those shown in FIG. 1, and are described with reference to the above-described Embodiment 1, and therefore their description will be omitted. The control section 5A is made up of a control processing section 51A and a memory section 52A which are slightly different in the memory contents from the processing function of Embodiment 1.

Also, in the figure, reference numeral 100E denotes a remote control unit according to Embodiment 6, and 7 is an angle sensor that detects an elevation angle at which the operator directs the remote control unit 100E to a device to be remotely controlled to output elevation angle detection data.

The memory section 52A latches data stored in the memory section 52 of Embodiment 1 and also latches relation data between the elevation angle detection data transmitted from the angle sensor 7 and the device to be remotely controlled. The control processing section 51A selects any one of the devices to be remotely controlled from the memory section 52A on the basis of the elevation angle detection data from the angle sensor 7 in addition to the operation of the control processing section 51 in Embodiment 1, and processes the selected device. In Embodiment 6, the angle sensor 7 and the control section 5A play the role of subject device identifying means.

Figure 13:
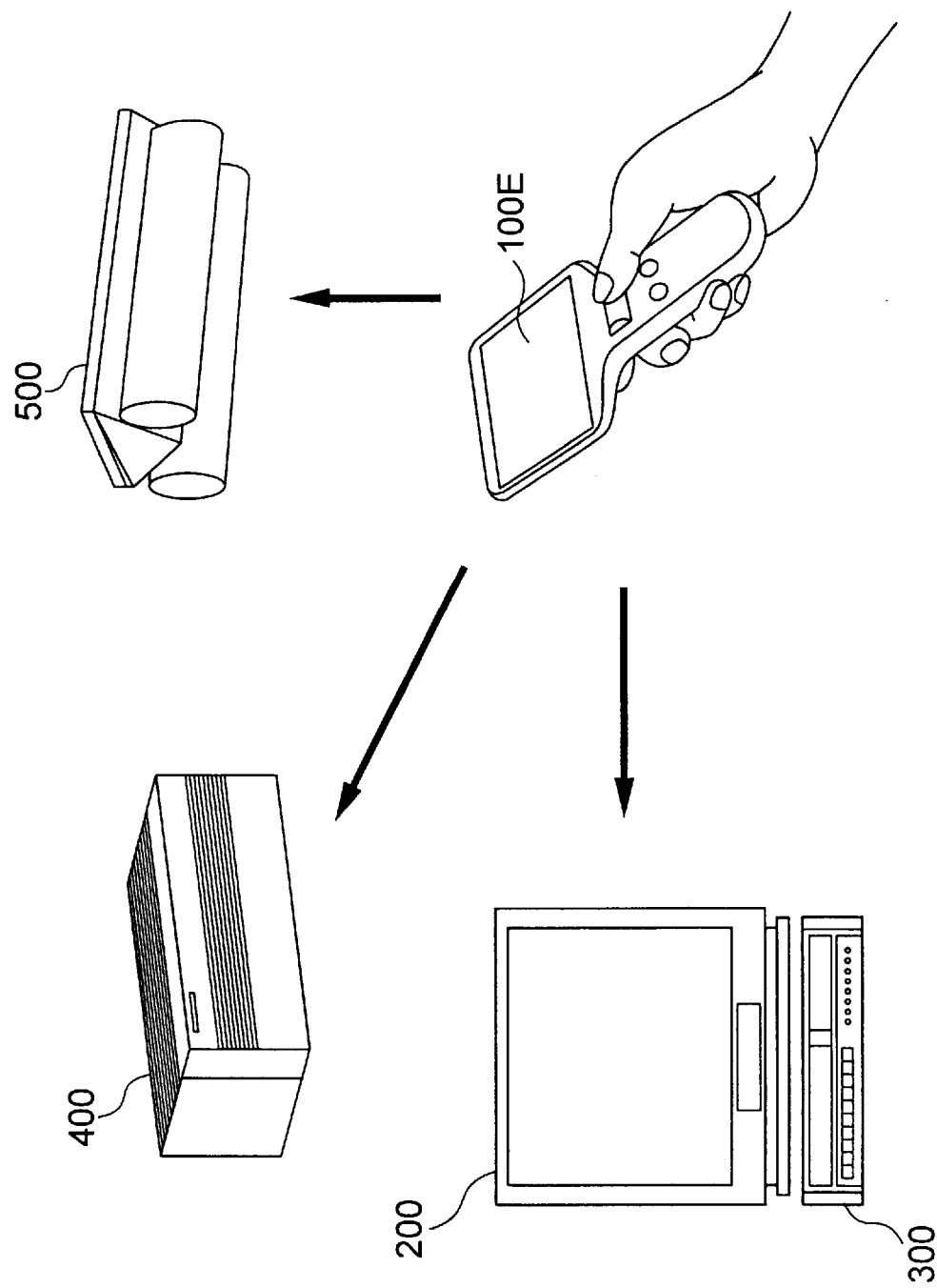
FIG. 13 is a diagram showing the operating state of the remote control unit according to Embodiment 6 of the present invention.
Figure 42:
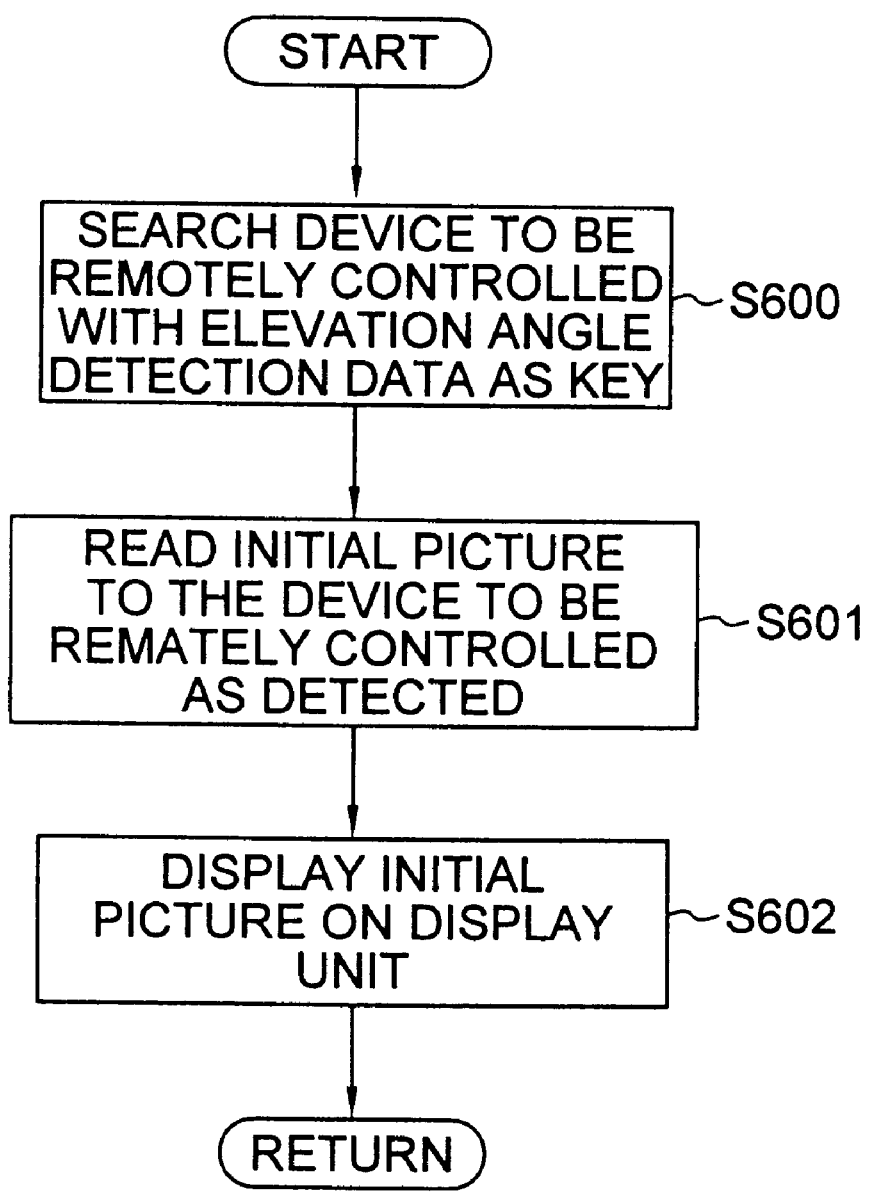
FIG. 42 is a flowchart showing the operation of a control processing section in the remote control unit according to Embodiment 6 of the present invention.

FIG. 13 is a diagram showing an appearance in which the device to be remotely controlled is selected by the remote control unit 100E according to Embodiment 6. In the figure, reference numeral 200 denotes a television (TV); 300, a video (VTR); 400, an air conditioner; and 500, a lighting device. FIG. 42 is a flowchart showing the operation of a control processing section in the remote control unit according to Embodiment 6.

Basically, the device to be remotely controlled by the remote control unit 100E is visible by the operator, and since a space where the remote control unit 100E is used is a volume limited to some degree, the number of devices located in that space is not so large. In Embodiment 6, as a method of automatically selecting any one of devices, in the case where the operator tries to remotely control the device, it is generally utilized that the remote control unit 100E is directed to the device to be remotely controlled.

In other words, the remote control unit 100E is made to automatically judge the device to be remotely controlled on the basis of an elevation angle of the remote control unit 100E which is directed to the device to be remotely controlled with the result that the display of a picture of the device selection and the operation of device selection as shown in FIG. 3(*a*) are omitted. In Embodiment 6, assuming that the devices to be remotely controlled are a television set 200, a video set 300, an air conditioner 400 and a lighting device 500 which are the most representative devices located in a living room, the remote control unit 100E judges an object to be controlled using the angle sensor 7 as the device identifying means.

Figure 14:
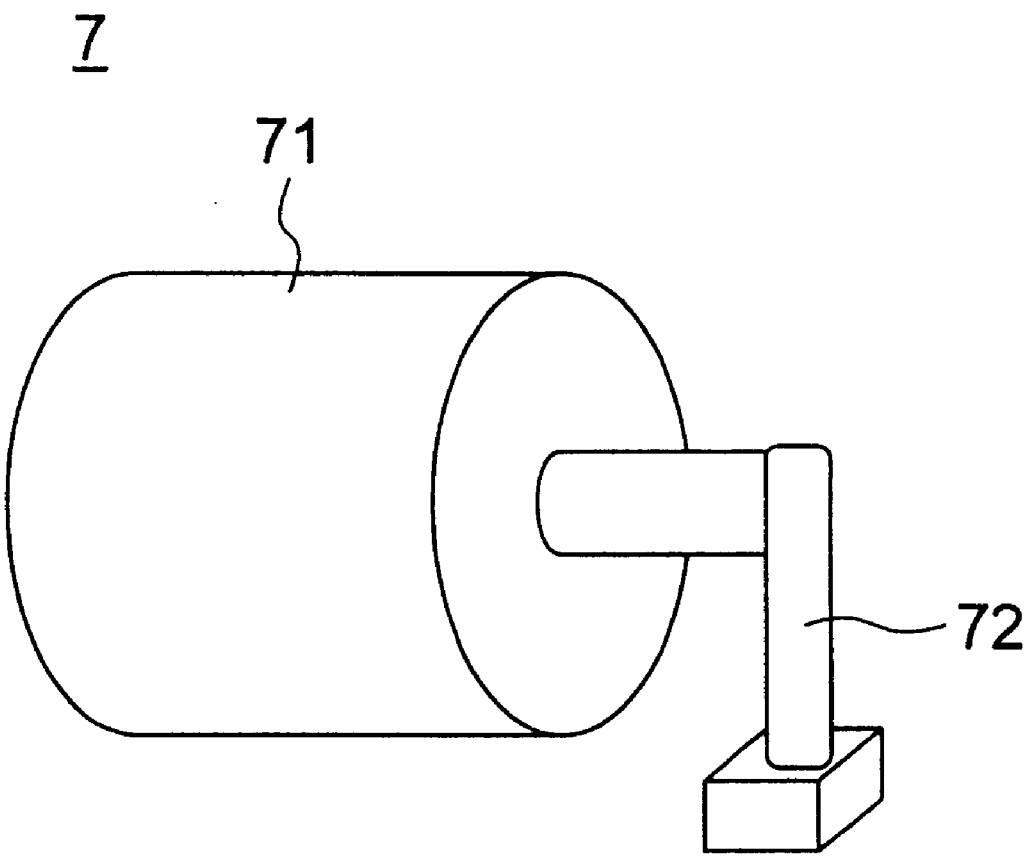
FIG. 14 is a diagram showing an angle sensor of the remote control unit according to Embodiment 6 of the present invention.

FIG. 14 is a structural diagram showing the angle sensor 7. In the figure, reference numeral 71 denotes a rotation sensor, and 72 is a pendulum. The rotation sensor 71 is not actually rotated but fixed to the remote control unit 100E. Because the pendulum 72 is held vertically, the rotation sensor 71 is relatively rotationally moved, and the amount of rotational movement enables detecting an elevation angle at which the remote control unit 100E is directed.

Upon inputting the elevation angle detection data based on the amount of rotational movement of the rotation sensor 71, the control processing section 51A searches the memory section 52A and judges the device to be remotely controlled in correspondence with the elevation angle detection data (step S600). Upon judging the device to be remotely controlled, the control processing section 51A reads the initial picture (for example, FIG. 3(*b*)) in a subject device from the memory section 52A and allows the initial picture to be displayed on the display unit 1 (steps S601 to S602). The control processing section 51A allows the initial set picture of the device to be remotely controlled to be displayed on the display unit 1 to urge the operator to input an instruction. It is assumed that this display is not changed until the denial button 4 is depressed even if the remote control unit 100E is thereafter not directed to the device to be remotely controlled so that the elevation angle is changed. The subsequent remote control operation procedure and operation are the same as those described with reference to Embodiment 1, and therefore their description will be omitted.

As described above, according to the remote control unit 100E of Embodiment 6, the control processing section 51A judges the device to be remotely controlled on the basis of the elevation angle detection data detected by the amount of relative movement between the rotation sensor 71 and the pendulum 72 by directing the remote control unit 100E to the device to be remotely controlled, and allows the function items corresponding to that device to be displayed on the display unit l as an initial picture. As a result, the operating procedure by the operator is reduced, thereby being capable of improving the operability.

Embodiment 7

Figure 15A:
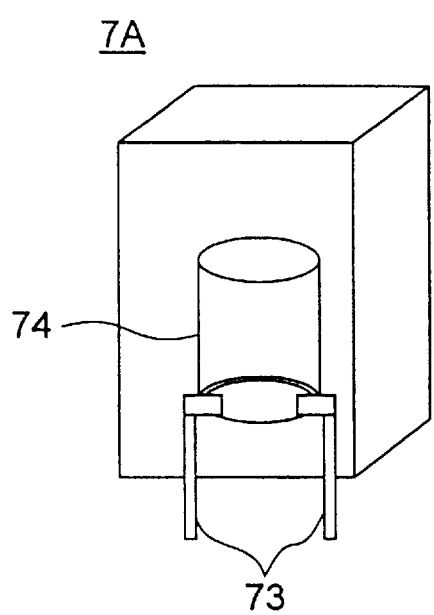
FIG. 15 is a diagram showing an angle sensor of a remote control unit according to Embodiment 7 of the present invention.
Figure 15B:
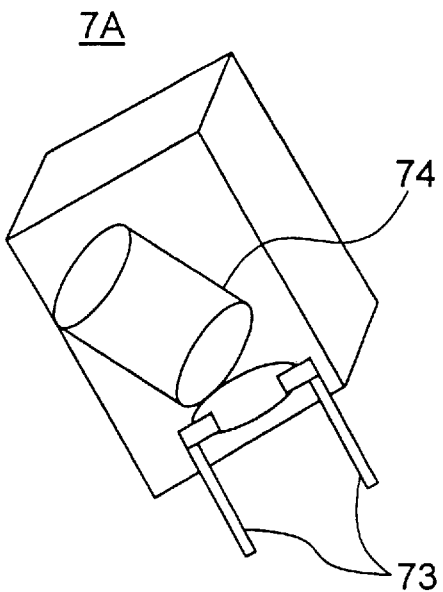

A remote control unit according to Embodiment 7 of the present invention will be described with reference to FIGS. 15 and 16. FIG. 15 is a diagram showing the structure of an angle sensor in a remote control unit according to Embodiment 7 of the present invention. Other structures and so on are the same as those in the above-described Embodiment 6.

A remote control unit 100F according to Embodiment 7 uses inversion sensors 7A of the number corresponding to the number of devices to be remotely controlled as the angle sensor.

The angle sensor shown in FIG. 15(*a*) outputs an ON signal by short-circuiting an electrode 73 when an inverted element 74 of the inversion sensor 7A is horizontal. Also, the angle sensor shown in FIG. 15(*b*) outputs an OFF signal by opening the electrode 73 when an inverted element 74 of the inversion sensor 7A is inclined with a given angle. That is, the inversion sensor 7A outputs the ON signal only when it is horizontal.

FIG. 16 is a diagram showing an example in which the inversion sensor 7A is located in the remote control unit 100F in order to detect a plurality of angles. In the figure, reference characters 7A*a*, 7A*b* and 7A*c* denote inversion sensors located in the remote control unit 100F with the different inclined angles in order to detect three kinds of elevation angles. In the example of that figure, the inversion sensor 7A*a* detects TV, the inversion sensor 7A*b* detects an air conditioner, and the inversion sensor 7A*c* detects a lighting device, respectively.

Subsequently, the operation of the remote control unit 100F according to Embodiment 7 will be described. The arranging relation of the respective devices to be remotely controlled will be described assuming that the arrangement shown in FIG. 13 is provided.

Each of the inversion sensors 7A*a* to 7A*c*, as shown in FIGS. 16(*a*) to 16(*c*), is located with an inclined angle so that the inverted element 74 is elected when the remote control unit 100F is directed to each of the devices with the elevation angle.

In other words, in the case where the remote control unit 100F is directed to a TV as shown in FIG. 16(*d*) (when the remote control main body is horizontal), only the inversion sensor 7A*a* is turned on, and other inversion sensors 7A*b* and 7A*c* come to an off state due to the inclination with which the sensors are attached.

Likewise, in the case where the remote control unit 100F is directed to an air conditioner as shown in FIG. 16(*e*), only the inversion sensor 7A*b* is turned on, and other inversion sensors 7A*a* and 7A*c* are turned off. Further, in the case where the remote control unit 100F is directed to a lighting device as shown in FIG. 16(*f*), only the inversion sensor 7A*c* is turned on, and other inversion sensors 7A*a* and 7A*b* are turned off. That is, in the case of detecting N-kinds of inclined angles, N-kinds of angles can be detected by using the inversion sensors located with N-kinds of inclined angles.

The inversion sensor 7A is simple in structure in comparison with the above-described angle sensor 7 and can be downsized. Also, because an output can be taken out from the inversion sensor 7A as simple on/off signals, a system for processing those signals is also simplified, thereby being capable of realizing an optimum angle sensor in the remote control unit low in costs and small in size.

Embodiment 8

Figure 17B:
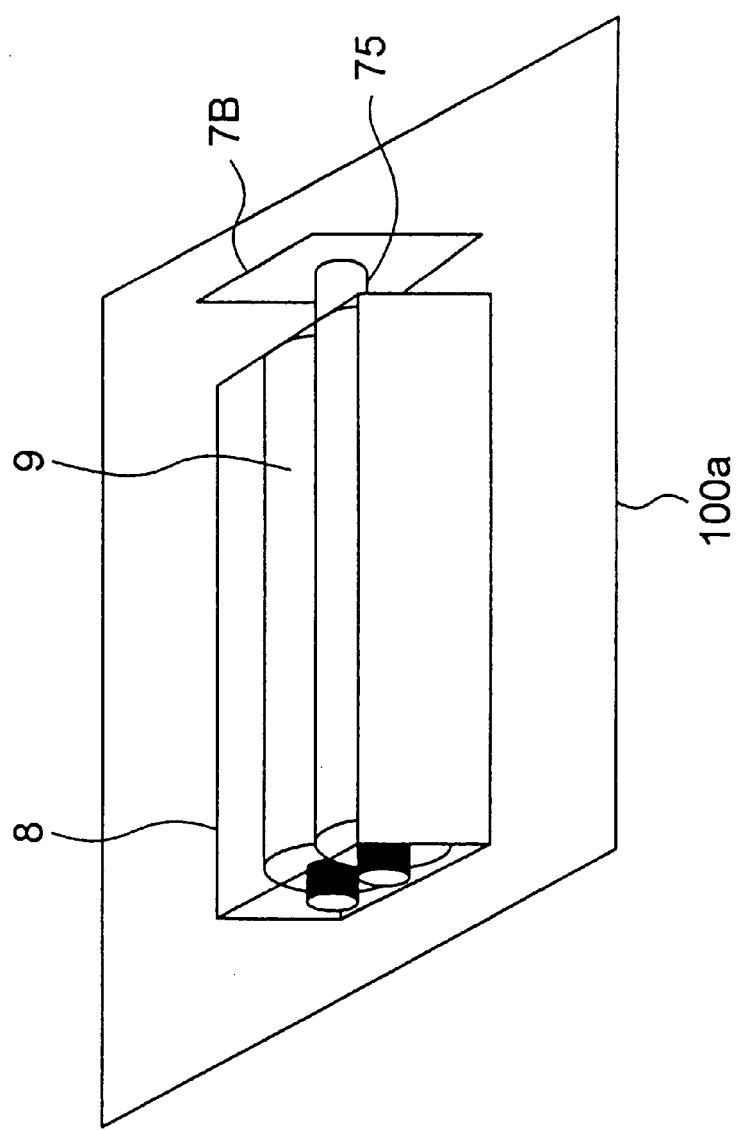
FIG. 17 is a diagram showing an angle sensor of a remote control unit according to Embodiment 8 of the present invention.
Figure 17A:
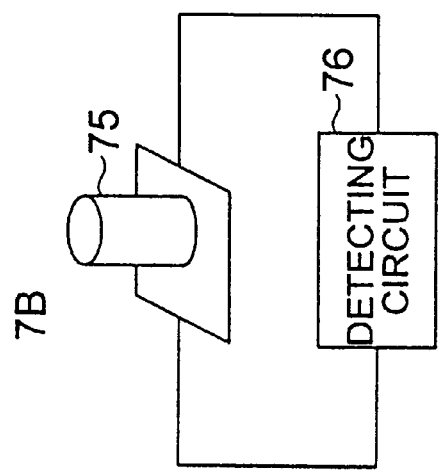

A remote control unit according to Embodiment 8 of the present invention will be described with reference to FIG. 17. FIG. 17 is a diagram showing the structure of an angle sensor in the remote control unit according to Embodiment 8 of the present invention. Other structures and so on are the same as those in the above-described Embodiment 6.

A remote control unit 100G according to Embodiment 8 uses a strain sensor 7B as the angle sensor.

In FIG. 17, reference character 7B denotes a strain sensor that detects the strain of a material according to a change of a resistant value; 75, a load support section (columnar portion) of the strain sensor 7B; and 76, a detecting circuit that detects a change in the resistant value according to the strain.

Also, in the figure, reference numeral 8 denotes a battery box; 9, a battery for a remote control unit 100G; and 100*a*, a main body (bottom plate portion of a casing) of the remote control unit 100G where the battery box 8 in which the strain sensor 7B and the battery 9 are stored is located.

Subsequently, the operation of the remote control unit 100G according to Embodiment 8 will be described. The strain sensor 7B is disposed in the main body 100*a* of the remote control unit 100G so as to be in contact with the battery box 8 in which the battery 9 that drives the remote control unit 100G is stored. The battery box 8 is located so as to freely move extremely slightly in direction perpendicular to the drawing paper according to a change in elevation angle of the remote control unit 100G.

When the operator directs the remote control unit 100G toward the device to be operated, the main body 100*a* of the remote control unit 100G is inclined whereby the battery 9 and the battery box 8 that are located in the main body 100*a* get gradually inclined. As described above, because the battery box 8 is located to provide the degree of free in the vertical direction of the figure (right and left lateral direction), a load of the battery 9 is applied to the load support section (columnar portion) 75 of the strain sensor 7B to detect a strain. Because a relation between the inclined angle (load) of the battery 9 and the strain can be decided uniquely, the strain sensor 7B can be employed as the angle sensor.

That is, the angle sensor of the remote control unit 100G according to Embodiment 8 uses the very-small-sized strain sensor 7B, and the battery 9 necessary for the operation of the remote control unit 100G and large in load as a weight for detection of an angle, thereby being capable of extremely downsizing the angle sensor. Also, as in the above-described embodiment, because there is provided no mechanical drive section, the angle sensor high in reliability and long in lifetime can be obtained.

Embodiment 9

Figure 18:
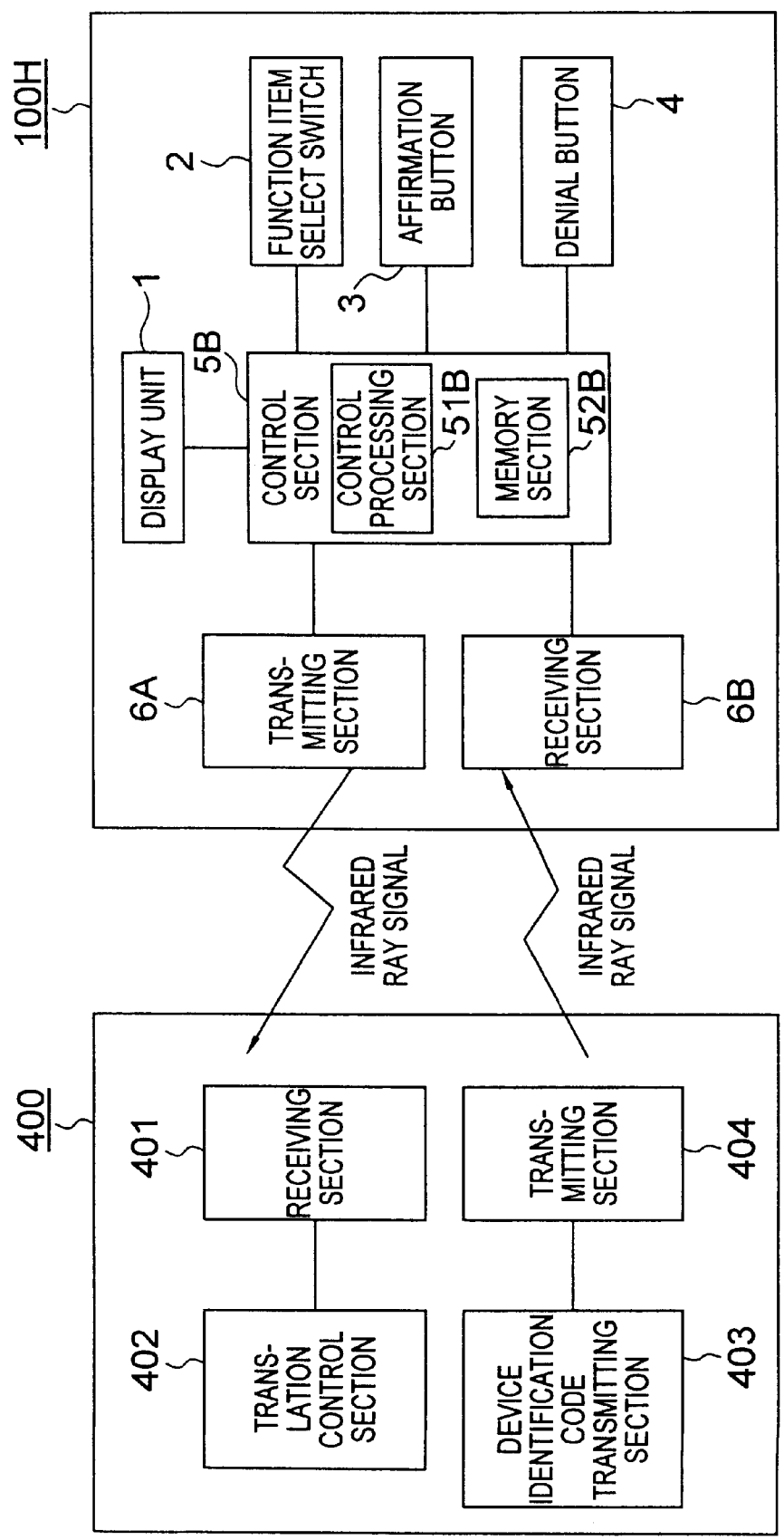
FIG. 18 is a block diagram showing the structures of a remote control unit and a device to be remotely controlled according to Embodiment 9 of the present invention.
Figure 43:
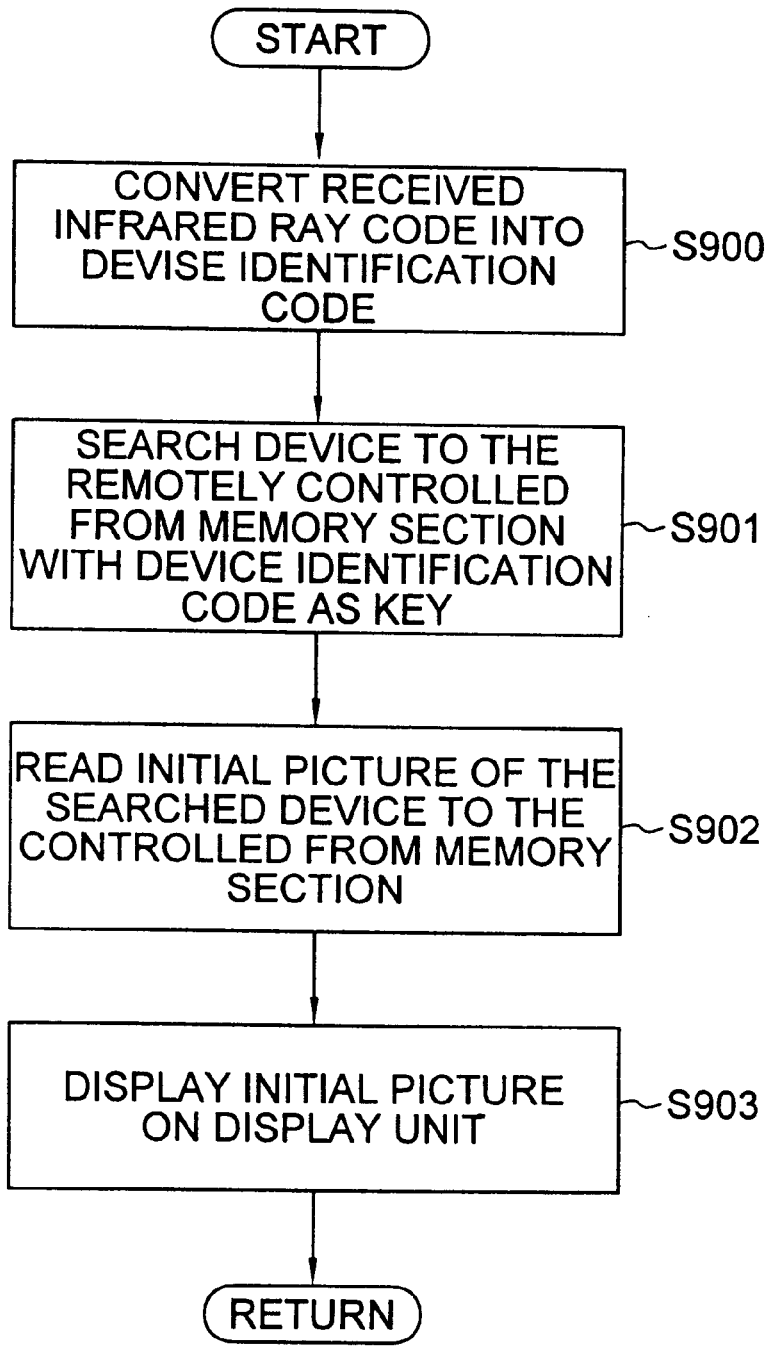
FIG. 43 is a flowchart showing the operation of a control processing section in the remote control unit according to Embodiment 9 of the present invention.

A remote control unit according to Embodiment 9 of the present invention will be described with reference to FIGS. 18 and 43. FIG. 18 is a block diagram showing the structures of a remote control unit and a device to be remotely controlled according to Embodiment 9 of the present invention. FIG. 43 is a flowchart showing the operation of a control processing section in the remote control unit according to Embodiment 9.

In FIG. 18, the display unit 1, the function item select switch 2, the affirmation button 3 and the denial button 4 have the same functions as those shown in FIG. 1, and are described with reference to the above-described Embodiment 1, and therefore their description will be omitted. Preference character 100H denotes a remote control unit according to Embodiment 9, and 400 is a device to be remotely controlled, such as an air conditioner.

Also, in the figure, reference character 6A denotes a transmitting section at the remote control side, which converts an instruction code transmitted from the processing control section 51B of the remote control unit 100H into an infrared ray signal to transmit the infrared ray signal. Reference numeral 401 denotes a receiving section at the device side, which receives the infrared ray signal transmitted from the transmitting section 6A at the remote control side.

Also, in the figure, reference numeral 404 denotes a translation control section that converts the infrared ray signal received by the receiving section 401 at the device side into a control signal for the device to output the control signal. Reference numeral 403 denotes a device identification code transmitting section that always produces a predetermined device identification code for each of the devices.

Also, in the figure, reference numeral 404 denotes a transmitting section at the device side, which converts the device identification code produced by the device identification code transmitting section 403 into an infrared ray signal to always transmit the infrared ray signal.

Further, in the figure, reference character 6B denotes a receiving section at the remote control section, which converts the infrared ray signal transmitted from the transmitting section 404 at the device side into the device identification code to output the code to the control processing section 51B.

The control processing section 51B searches the memory section 52B on the basis of the device identification code received by the receiving section 6B at the remote control side in addition to the operation of the control processing section 51 which is described with reference to the above-described Embodiment 1, and selects a device to be remotely controlled which corresponds to the device identification code for processing. The memory section 52B latches relation data between the device identification codes and the devices to be remotely controlled, in addition to data latched in the memory section 52 of Embodiment 1. In Embodiment 9, the receiving section 6B and the control section 5B at the remote control side play the role of subject-device identifying means.

Subsequently, the operation of automatically identifying the device to be remotely controlled in the remote control unit 100H according to Embodiment 9 will be described.

The transmitting section 404 at the device side converts the device identification code produced by the device identification code transmitting section 403 into the infrared ray signal and always transmits the infrared ray signal. The transmitting and receiving sections at the device side and the transmitting and receiving sections at the remote control side mutually have directivity.

When the operator directs the remote control unit 100H to the transmitting section 404 of the device to be remotely controlled (air conditioner, etc.) 400, the transmitting section 404 at the device side and the receiving section 6B at the remote control side are positionally opposed to each other so that the infrared ray signal transmitted from the transmitting section 404 at the device side is received by the receiving section 6B at the remote control side.

The receiving section 6B at the remote control side converts the received infrared ray signal into the device identification code and then transmits the code to the control processing section 51B (step S900). The control processing section 51B searches the memory section 52B on the basis of the device identification code transmitted from the receiving section 6B to judge the device to be remotely controlled which corresponds to the device identification code (step S901).

The control processing section 51B, upon judging the subject device to be remotely controlled, reads an initial picture (for example, FIG. 3(b)) in the subject device from the memory section 52B and allows the picture to be displayed on the display unit 1 (steps S902 to S903) The control processing section 51B allows the initial set picture of the device to be remotely controlled to be displayed on the display unit 1 to urge the operator to input an instruction. This display is not changed until the denial button 4 is depressed even if the remote control unit 100H and the device to be remotely controlled 400 are not thereafter opposed to each other. The subsequent operating procedure and operation of the remote control unit are the same as those described with reference to the above Embodiment 1, and therefore their description will be omitted.

As described above, according to the remote control unit 100H of Embodiment 9, the infrared ray signal converted from the device identification code produced for each of the devices is always transmitted from the transmitting section 404 at the device side, and the receiving section 6B at the remote control side which receives that infrared ray signal converts the signal into the device identification code. Then, the control processing section 51B searches the memory section 52B on the basis of that device identification code, judges the subject device to be remotely controlled 400, and allows the initial picture having the function items corresponding to the device to be displayed on the display unit 1. Therefore, the operating procedure is reduced because the operator merely directs the remote control unit to the device to be remotely controlled 400, thereby being capable of improving the operability.

Embodiment 10

Figure 19:
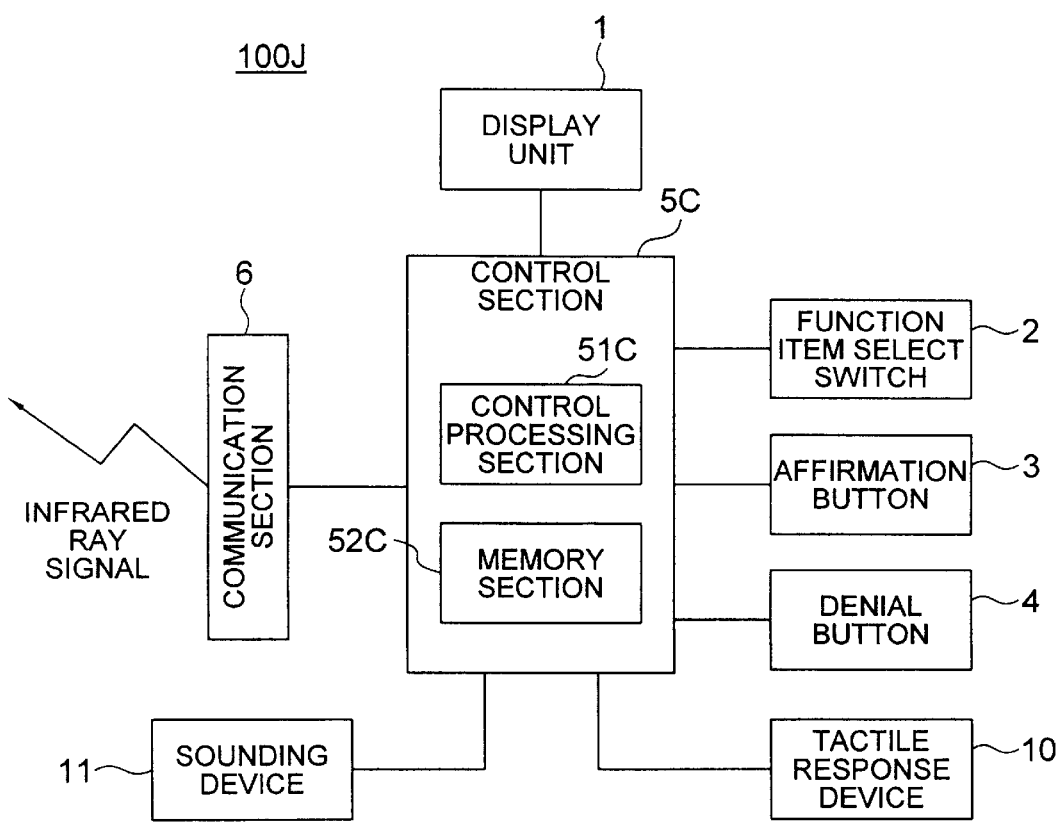
FIG. 19 is a block diagram showing the structure of a remote control unit according to Embodiment 10 of the present invention.

A remote control unit according to Embodiment 10 of the present invention will be described with reference to FIGS. 19 and 20. FIG. 19 is a block diagram showing the structure of a remote control unit according to Embodiment 10 of the present invention.

In FIG. 19, the display unit 1, the function item select switch 2, the affirmation button 3, the denial button 4 and the communication section 6 have the same functions as those described in the above-described Embodiment 1, and therefore their description will be omitted. Reference character 100J denotes a remote control unit according to Embodiment 10; 10, a tactile response device serving as vibration generating means; and 11, a sounding device serving sounding means.

Figure 20:
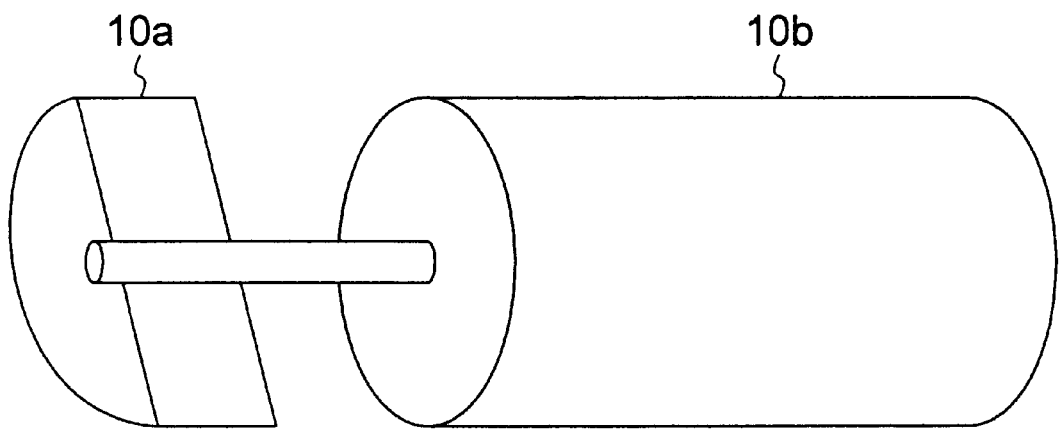
FIG. 20 is a diagram showing a vibration presentation device of the remote control unit according to Embodiment 10 of the present invention.

FIG. 20 is a diagram showing a vibration response device 10 of the remote control unit 100J according to Embodiment 10. The tactile response device 10 is designed so as to, for example, generate vibrations by rotating the rotation shaft of an eccentric weight 11 used for incoming vibrations in a pocket bell by a motor 12. The tactile response device 10 generates vibrations on the basis of vibration data transmitted from the control processing section 51C. Also, the sounding device 11 sounds on the basis of sounding data transmitted from the control processing section 51C.

Subsequently, the operation of the remote control unit 100J according to Embodiment 10 will be described. The display picture will be described with reference to FIG. 3(a). When the operator rotates the function item select switch 2, the control processing section 51C allows one of the function items displayed on the display unit 1 to be displayed so as to be distinct from other function items with inversion, netting or the like on the basis of the amount of rotational movement. As a result, visual teaching is given to the operator.

Also, the control processing section 51C transmits the vibration data and the sounding data to the tactile response device 10 and the sounding device 11, respectively, every time the amount of rotational movement of the function item select switch 2 becomes a given amount so that the operation teaching of the remote control unit 100J is tactually and auditorially conducted.

Moreover, when the operator depresses the affirmation button 3 or the denial button 4, the control processing section 51C transmits vibration data and sounding data different from those at the time of selecting any one of the function items to the tactile response device 10 and the sounding device 11 to make vibrations and sounding so that the operation teaching of the remote control unit 100J is tactually and auditorially conducted on the operator.

As described above, according to the remote control unit 100J of Embodiment 10, at the time of selecting any one of the functions by the function item select switch 2 or at the time of inputting instruction data by depressing the affirmation button 3 or the denial button 4, the tactile response device 10 is made to vibrate, or sounding is made by the sounding device 11, as a result of which teaching can be made to the operator tactually and auditorially in addition to the visual teaching, thereby being capable of preventing misoperation by giving more real feeling of the device operation. Also, the same teaching is given for the same instruction, and another teaching is given for another instruction by adding a uniform operation procedure, thereby providing the operability commonly useable even if it is difficult to obtain information visually.

Embodiment 11

Figure 21:
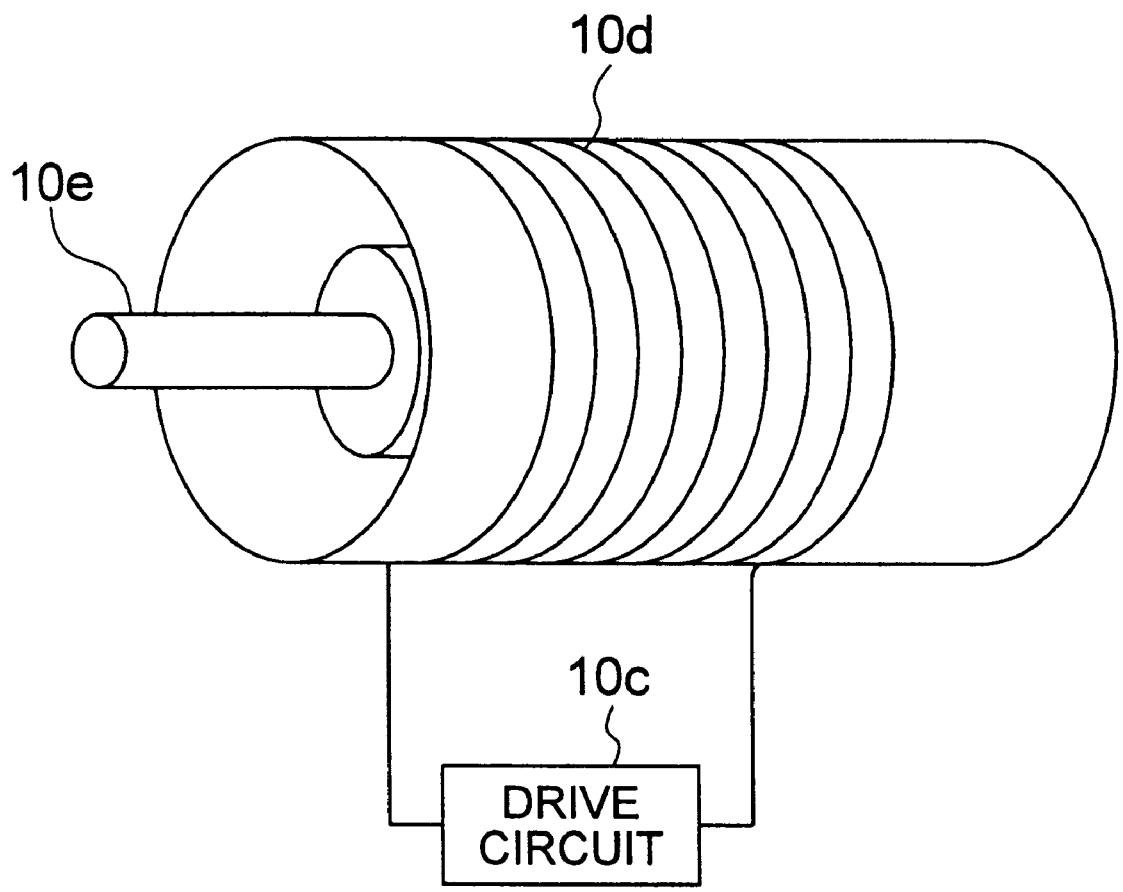
FIG. 21 is a diagram showing a vibration presentation device of a remote control unit according to Embodiment 11 of the present invention.

A remote control unit according to Embodiment 11 of the present invention will be described with reference to FIG. 21. FIG. 21 is a diagram showing a tactile response device in a remote control unit according to Embodiment 11 of the present invention. Incidentally, other structures or the like of the remote control unit are identical with those in the above-described Embodiment 10.

In FIG. 21, reference character 10A denotes a tactile response device; 10c is a drive circuit that electrically energizes a solenoid coil 10d in response to a tactile control signal from the control processing section 51C; and 10e is a drive shaft which is made of a magnetic material driven by the solenoid coil 10d.

The solenoid coil 10d is controlled according to the tactile control signal from the control processing section 51C, and when a current flows in the solenoid coil 10d, the drive shaft 10e disposed in the center of the solenoid coil 10d is moved to beat the casing of the remote control unit 100K, thereby providing the operator with tactile feeling. In other words, likewise in the remote control unit 100K described in Embodiment 11, the same effect as that of the above-described Embodiment 10 can be obtained.

Embodiment 12

Figure 22:
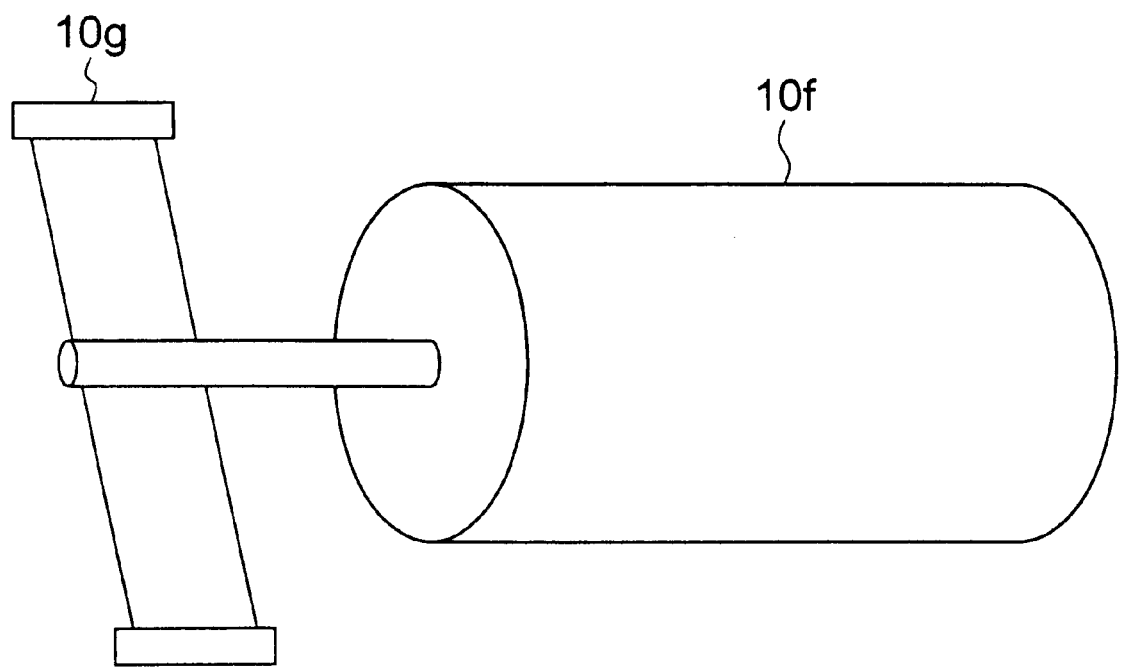
FIG. 22 is a diagram showing a vibration presentation device of a remote control unit according to Embodiment 12 of the present invention.

A remote control unit according to Embodiment 12 of the present invention will be described with reference to FIG. 22. FIG. 22 is a diagram showing a tactile response device in a remote control unit according to Embodiment 12 of the present invention. Incidentally, other structures or the like of the remote control unit are identical with those in the above-described Embodiment 10.

In FIG. 22, reference character 10B denotes a tactile response device; 10f is a motor; and 10g is a pair of blade-like springs attached to a drive shaft of the motor 10f.

The motor 10f of the tactile response device 10B is controlled according to the tactile control signal from the control processing section 51C shown in FIG. 19. When the tactile control signal is supplied to the motor 10f, the blade-like springs 10g attached to the motor 10f are rotated so that the springs 10g beat the casing of the remote control unit 100L, to thereby provide a tactile feeling. In other words, likewise in the remote control unit 100L described in Embodiment 12, the same effect as that of Embodiment 10 can be obtained.

Embodiment 13

Figure 23:
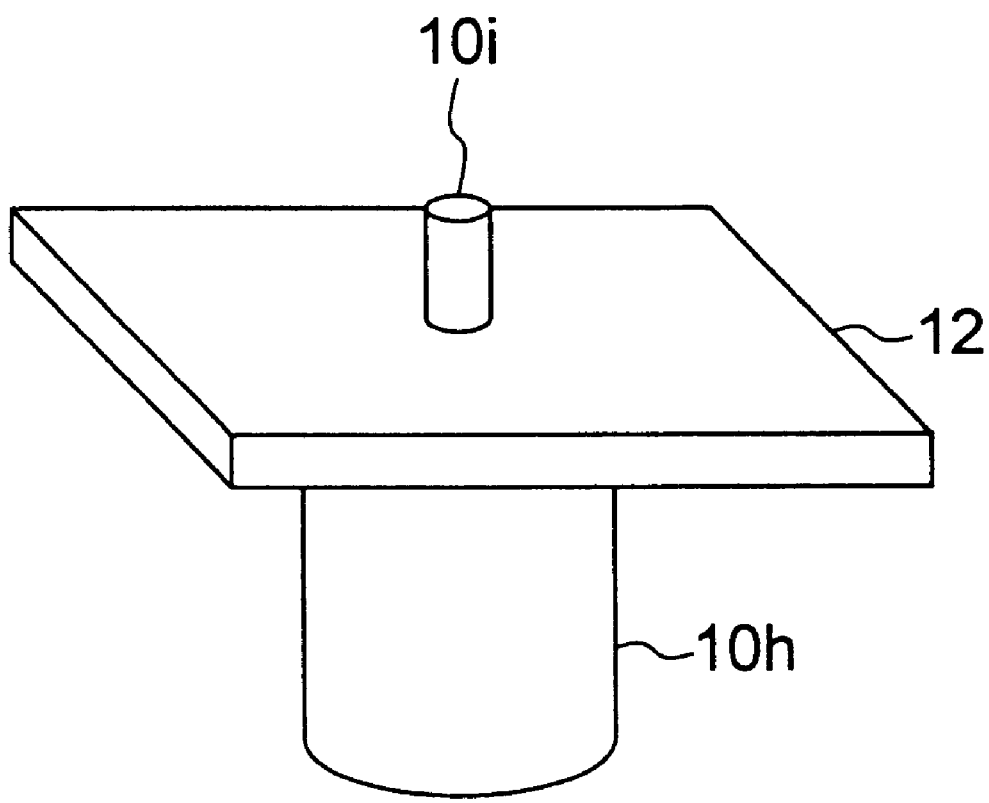
FIG. 23 is a diagram showing a vibration presentation device of a remote control unit according to Embodiment 13 of the present invention.

A remote control unit according to Embodiment 13 of the present invention will be described with reference to FIG. 23. FIG. 23 is a diagram showing a tactile response device in the remote control unit according to Embodiment 13 of the present invention. Incidentally, other structures or the like of the remote control unit are identical with those in the above-described Embodiment 10.

In FIG. 23, reference character 10C denotes a tactile response device; 10h is a solenoid coil; and 10i is a drive shaft which is made of a magnetic material driven by the solenoid coil 10h.

The solenoid coil 10h and the drive shaft 10i provide a tactile feeling and are located under the operating switch 12 such as the affirmation button 3 or the denial button 4. Also, the drive shaft 10i of the solenoid coil 10h is arranged so as to penetrate a key top of the operating switch 12 and to be abutted directly against finger tip of the operator.

The solenoid coil 10h is controlled according to the tactile control signal from the control processing section 51C shown in FIG. 19. With the tactile control signal being supplied to the solenoid coil 10h, a current flows in the solenoid coil 10h so that the drive shaft 10i disposed in the center of the solenoid coil 10h is moved. As a result, the drive shaft 10i penetrates the operating switch 12 operated by the operator so as to directly stimulate the finger tip of the operator, to thereby provide a tactile feeling. In other words, likewise in the remote control unit 100M described in Embodiment 13, the same effect as that of Embodiment 10 can be obtained.

Embodiment 14

A remote control unit according to Embodiment 14 of the present invention will be described with reference to FIG. 19. A difference between Embodiment 14 and the above-described embodiment 10 is only the function of a sounding device.

The remote control unit 100N according to Embodiment 14 is designed in such a manner that at the time of selecting any one of the function items by the rotation of the function item select switch 2, or at the time of inputting instruction data by the depression of the affirmation button 3 or the denial button 4, the selected function item, a selected value in the select range, or the like is read out by the sounding device 11.

For example, in the display picture shown in FIG. 3(*a*), the sounding device 11 sounds "lighting", "air conditioning" or "television" every time any one of the function items "lighting", "air conditioning" and "TV" is selected by the function item select switch 2.

Similarly, in the display picture shown in FIG. 3(*c*), the sounding device 11 reads out the function items "22 C", "21 C" and "20 C" directly by voice as "twenty-two degrees", "twenty-one degrees" or "twenty degrees", to thereby announce the function items.

According to Embodiment 14, because the operation contents are understood by only voice, there can be obtained the remote control unit that enables the remote control operation in the dark and also can be operated auditorially and tactually by even an operator who is visually handicapped.

Embodiment 15

Figure 24:
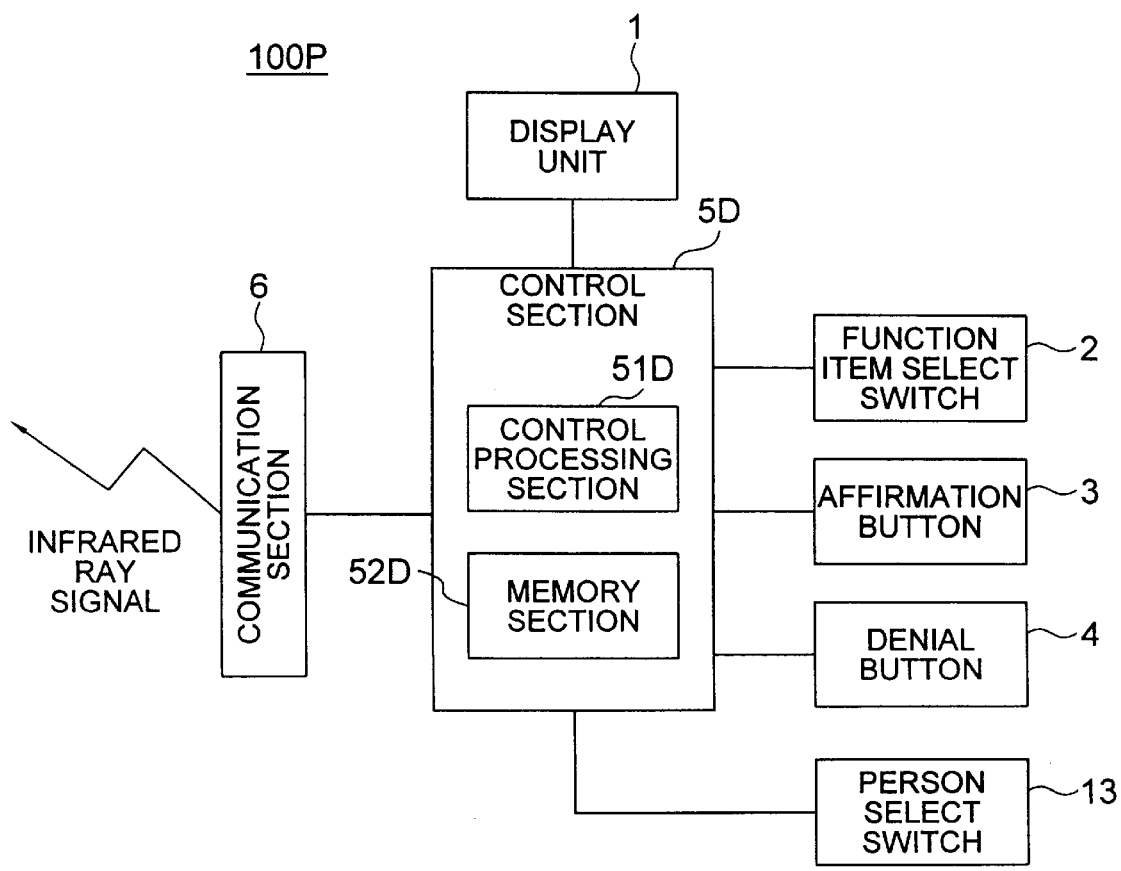
FIG. 24 is a block diagram showing the structure of a remote control unit according to Embodiment 14 of the present invention.
Figure 25:
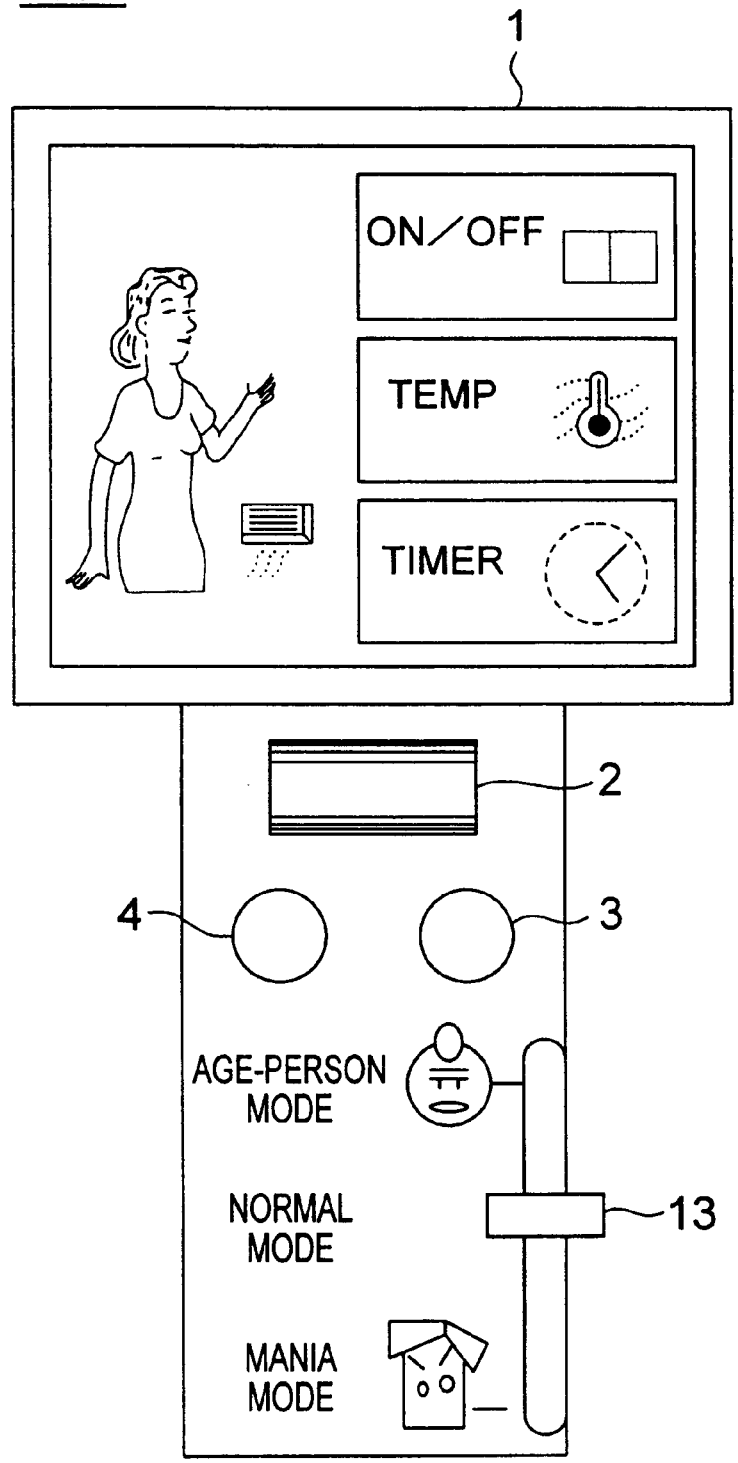
FIG. 25 is a diagram showing the appearance of the remote control unit according to Embodiment 14 of the present invention.

A remote control unit according to Embodiment 15 of the present invention will be described with reference to FIGS. 24 to 26 and FIG. 44. FIG. 24 is a block diagram showing a structure of the remote control unit according to Embodiment 15 of the present invention. FIG. 25 is a diagram showing the appearance of the remote control unit according to Embodiment 15 of the present invention.

In FIGS. 24 and 25, the display unit 1, the function item select switch 2, the affirmation button 3, the denial button 4 and the communication section 6 have the same functions as those described in the above-described Embodiment 1, and therefore their description will be omitted. Reference character 100P denotes a remote control unit according to Embodiment 15; 13, a person select switch that serves characteristic selecting means, which is a switch enabling the operator to select the number of the select functions according to the subject plan of the operator. In Embodiment 15, the person select switch 13 is classified into three according to age layers.

In Embodiment 15, an example of using the remote control unit 100P in a home of an average family structure will be described. In the home, those who use the remote control unit 100P include young men who has a strong demand to want to use the device at a high level and aged men who generally conduct only basic operation.

For example, at the time of operating the television, the functions required by many persons including an old man are generally only the on/off operation of a power supply, the adjustment of a volume or the selection of channels. Therefore, other functions are merely obstructive in operation. Further, the display area for the respective function items is unavoidably relatively reduced every time functions are added because the display area on the display device 1 is restricted, thereby making it difficult to identify the function items or the like as the select functions are increased, which causes the operability to be degraded.

On the other hand, there is a case in which a person who has maniac preference such as a young man demands the remote control unit to which not only the above-described basic functions but also high-level functions that enable an output from a video source such as a video deck to be selected, or enable fine setting of an image such as brightness or hue to be selected are added.

Thus, in order to satisfy the remote control unit that allows any one of the functions to be selected according to the plan of any operators, the remote control unit 100P according to Embodiment 15 provides the person select switch 13 that can change the number of function items according to the plan required by the operator so as to change the number of function items and the size of the function items which are displayed on the display unit 1 according to information set in the person select switch 13.

Figure 26C:
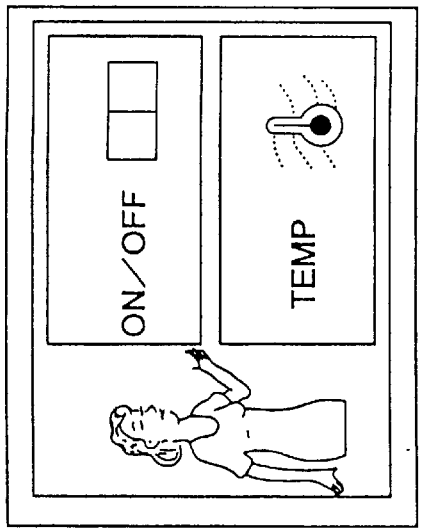
FIG. 26 is a diagram showing a display example of the remote control unit according to Embodiment 14 of the present invention.
Figure 26B:
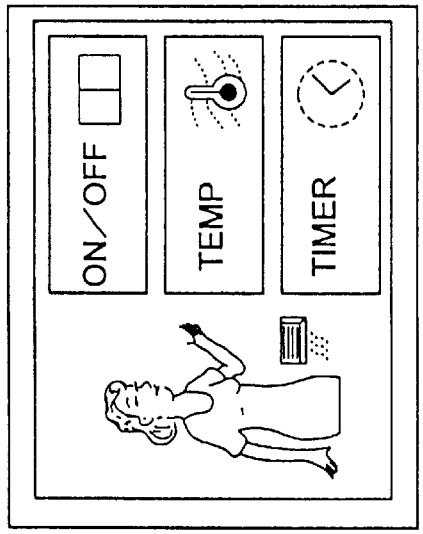
Figure 26A:
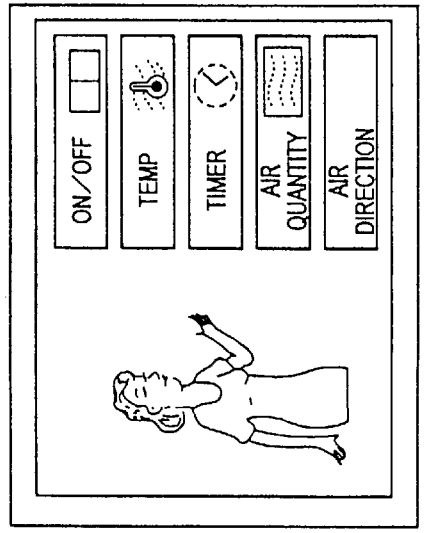
Figure 44:
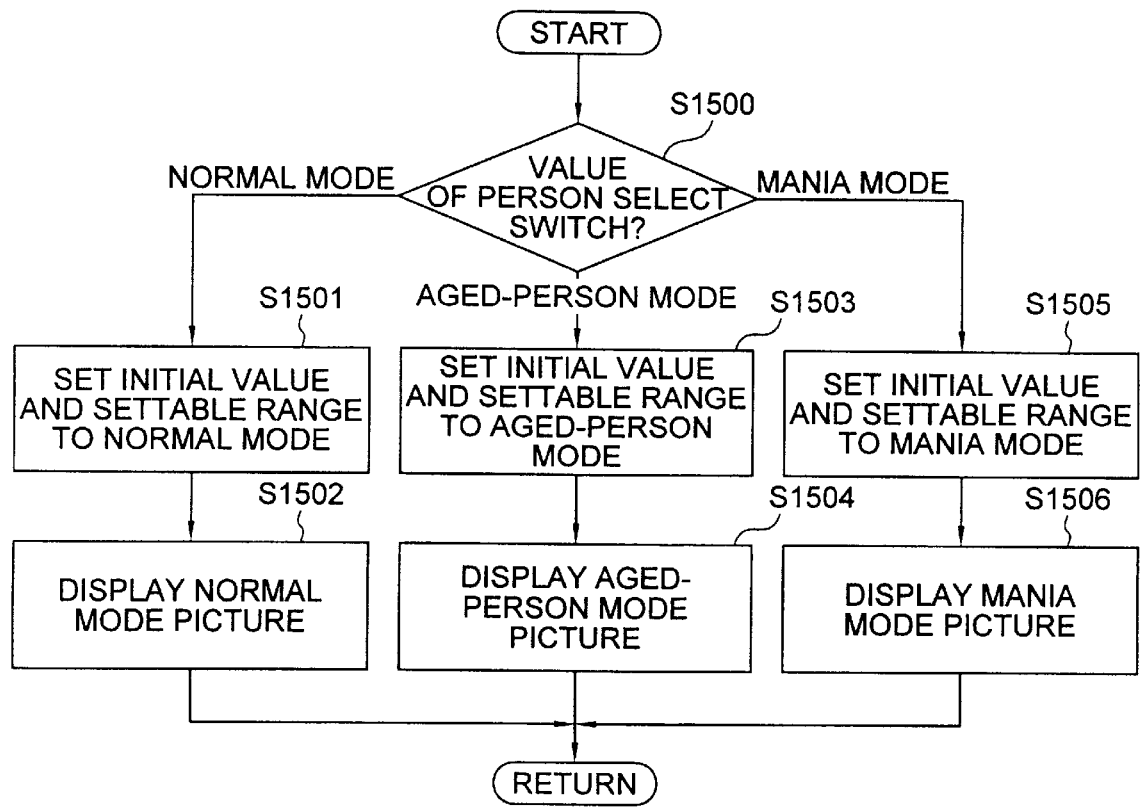
FIG. 44 is a flowchart showing the operation of a control processing section in a remote control unit according to Embodiment 15 of the present invention.

FIGS. 26(*a*) to 26(*c*) show an example of displaying a picture according to the operation of the person select switch 13. FIGS. 25 and 26 show an example in which the air conditioner is selected as a device to be remotely controlled. Also, FIG. 44 is a flowchart showing the operation of a control processing section in the remote control unit according to Embodiment 15.

Hereinafter, the picture display of the person select switch 13 will be described. The operator sets the person select switch 13 to "normal mode". Upon judging that the normal mode is selected by the person select switch 13, the control processing section 51D searches the memory section 52D and allows the display picture shown in FIG. 26(*b*) to be displayed on the display unit 1 (steps S1500 to S1502). In the case of setting in the normal mode, setting of "on/off", "temp." and "timer" which are standard function items high in use frequency is displayed with a normal standard size.

For example, in the case where the operator is an aged person, the person select switch 13 is set to "aged-person mode". Upon judging that the aged-person mode is selected by the person select switch 13, the control processing section 51D searches the memory section 52D and allows the display picture shown in FIG. 26(*c*) to be displayed on the display unit 1 (steps S1500 to S1503 to S1504). In the case of setting in the aged-person mode, setting of "on/off" and "temp." which are the most basic functions as the air conditioner is largely displayed so that they are viewed easily more than those in the normal mode.

For example, in the case where the operator is a young person, the person select switch 13 is set to "mania mode". Upon judging that the mania mode is selected by the person select switch 13, the control processing section 51D searches the memory section 52D and allows the display picture shown in FIG. 26(*a*) to be displayed on the display unit 1 (steps S1500 to S1505 to S1506). In the case of setting in the mania mode, not only the standard function items but also fine function items such as setting of "air quantity" and "air direction" are additionally displayed. Because the number of the function items to be displayed is increased, the display is unavoidably reduced but more detailed setting of the air conditioning can be made.

Also, if the initial value or the settable range of the function items is variable with respect to each of the modes of the person select switch 13, a remote control unit having greater safety and higher operability can be obtained.

For example, in the case where the person select switch 13 is set to "normal mode", a temperature set range of the air conditioner is set to "18 to 28 C" so that the control processing section 51D prevents numerals other than those numerals from being displayed. Also, in the case where the person select switch 13 is set to "aged-person mode", a temperature set range of the air conditioner is set to "20 to 24 C". Thus, if the set value is varied according to the respective modes, the fine processing operability can be provided. The temperature setting of the air conditioner is described in the above, but the above feature is effective means for initial setting of the volume of a television, etc.

As described above, according to Embodiment 15, the display numerals of the function items are varied according to the characteristics, plans and so on of the operator so that the selection of the display picture and the size of the display can be selected. As a result, if a person who prefers that display is large and can be easily viewed, or who satisfies only the basic functions selects "aged-person mode", the picture which is easily viewed and allows only the basic functions to be easily selected can be displayed.

Embodiment 16

Figure 27:
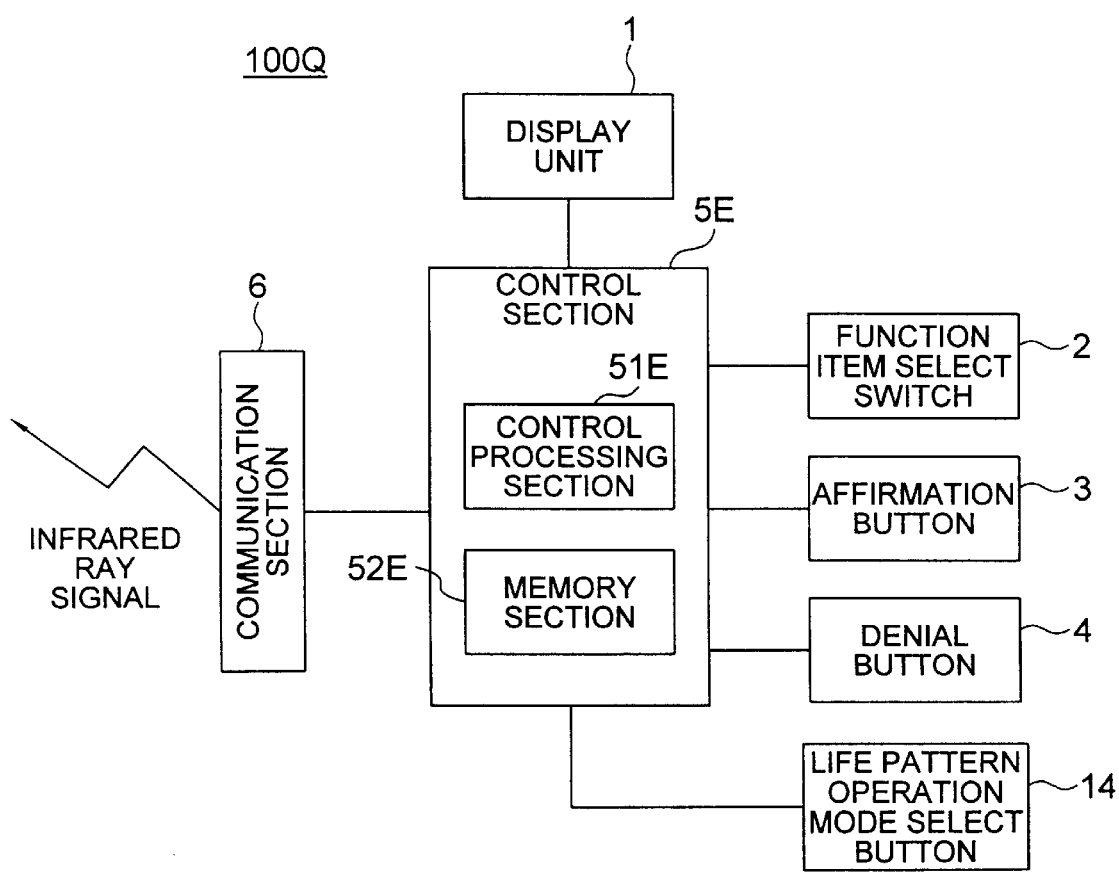
FIG. 27 is a block diagram showing the structure of a remote control unit according to Embodiment 16 of the present invention.
Figure 28:
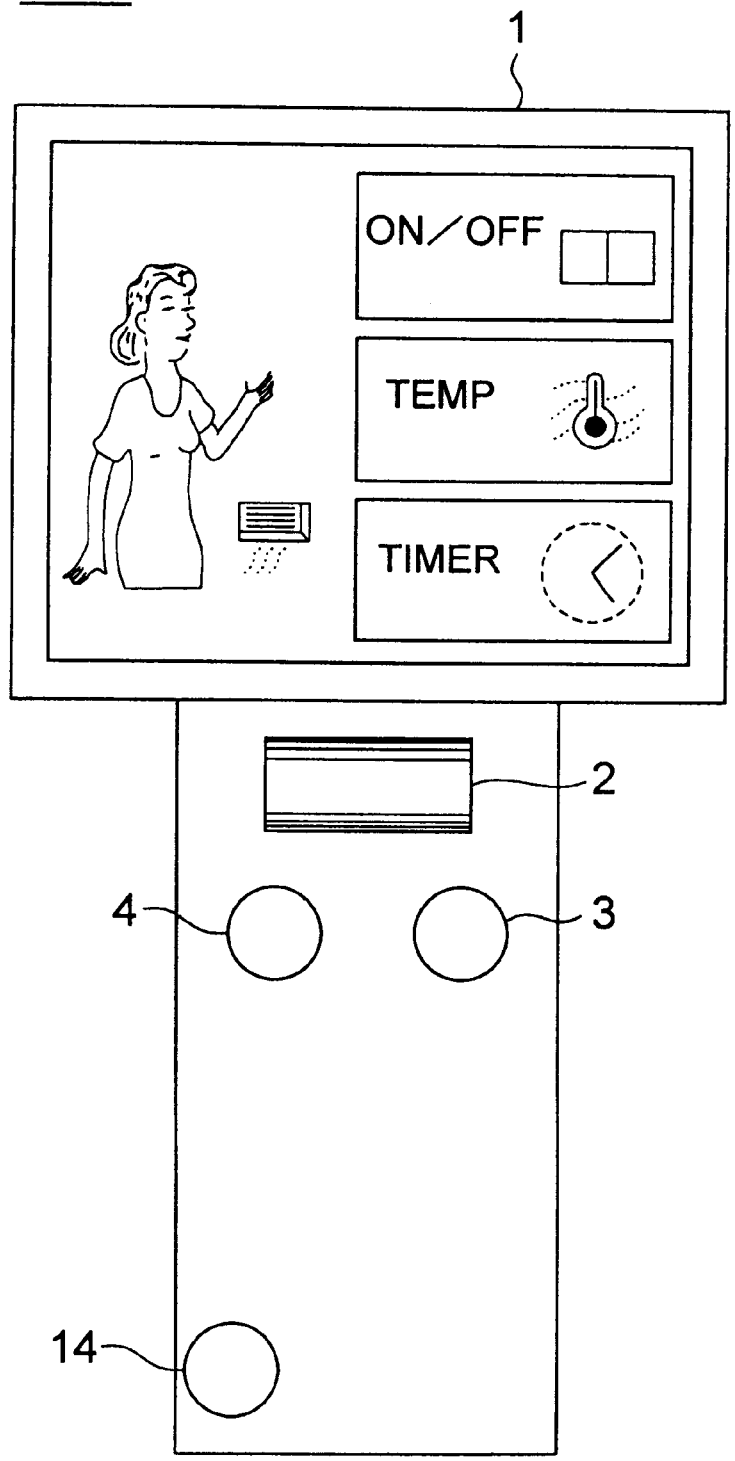
FIG. 28 is a diagram showing the appearance of the remote control unit according to Embodiment 16 of the present invention.
Figure 45:
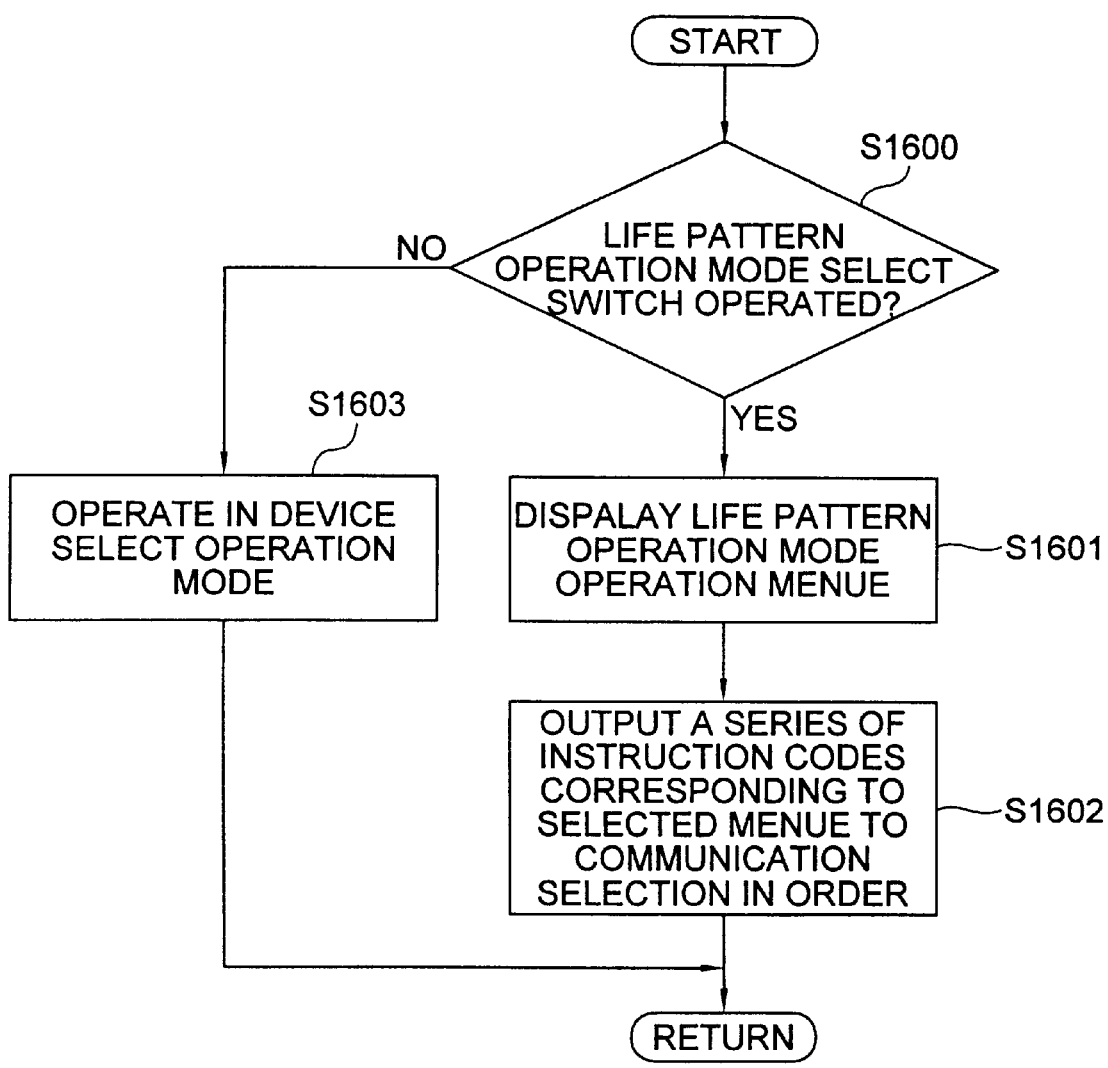
FIG. 45 is a flowchart showing the operation of a control processing section in the remote control unit according to Embodiment 16 of the present invention.

A remote control unit according to Embodiment 16 of the present invention will be described with reference to FIGS. 27 to 29 and FIG. 45. FIG. 27 is a block diagram showing a structure of the remote control unit according to Embodiment 16 of the present invention. FIG. 28 is a diagram showing the appearance of the remote control unit according to Embodiment 16 of the present invention. FIG. 45 is a flowchart showing the operation of a control processing section in the remote control unit according to Embodiment 16.

In FIGS. 27 and 28, the display unit 1, the function item select switch 2, the affirmation button 3, the denial button 4 and the communication section 6 have the same functions as those described in the above-described Embodiment 1, and therefore their description will be omitted.

In those figures, reference numeral 14 denotes a life pattern operation mode select button that serves as pattern operation mode selecting means which is designed to select any one of "life pattern operation mode" and "device select operation mode".

The device select operation mode is a mode for conducting the remote control operation for each of the devices as described in the above Embodiment 1 and so on. Also, the life pattern operation mode is designed to conduct the remote control of a plurality of devices which is set according to the life pattern of the operator in advance with the reduced number of buttons to be depressed.

In FIG. 27, the control section 5E is made up of a control processing section 51E and a memory section 52E. The control processing section 51E is designed to conduct processing on the basis of the selected mode by the life pattern operation mode select button 14 in addition to the operation of the control processing section 51 in FIG. 1. Also, the memory section 52E latches the instruction code of a procedure executed in the life pattern mode in addition to the data latched in the memory section 52.

In the usual life, there is a case where a plurality of devices are operated according a certain pattern. For example, in the case where the operator intends to view a video, the power supply of a television and the power supply of the video are turned on, and operation for setting the channel of the television to an external input is conducted. To operate the remote control unit according to a given pattern every time in order to operate the plural devices requires troublesomeness and time.

For that reason, in Embodiment 16, there is provided a life pattern operation mode select button 14, so that the function items for each of the devices are displayed as in the above-described Embodiment 1, so as to select any one of a device select operation mode where only a subject device is remotely controlled and a life pattern operation mode where a plurality of devices are remotely controlled according to the usual life scene by one operation.

Figure 29A:
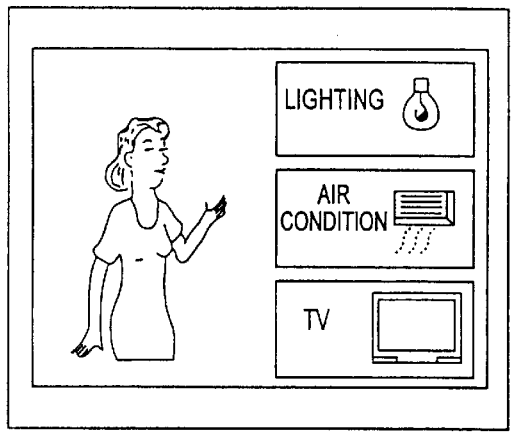
FIG. 29 is a diagram showing a display example of the remote control unit according to Embodiment 16 of the present invention.
Figure 29B:
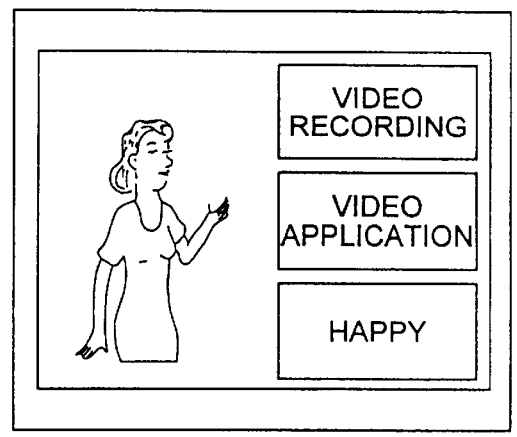

FIG. 29 is a diagram showing a picture display example of the remote control unit to which the life pattern operation mode select button 14 is added. At the time of selecting "device select operation mode", as shown in FIG. 29(a), the same display and operation as those described in the above-described Embodiment 1 are conducted (steps S1600 to S1601). Upon operating the life pattern operation mode select button 14, the control processing section 51E reads data (display picture) shown in FIG. 29(b) from the memory section 52E and allows the data to be displayed on the display unit 1 (step S1603).

In this example, it is assumed that the following instruction codes corresponding to the function item "video appreciation" are latched in the memory section 52E:

(1) turning on television power supply;
(2) turning on video power supply;
(3) selecting television input source video; and
(4) adjusting lighting 70%.

Upon the selection of the function item of the video appreciation from the function item select switch 2, the control processing section 51E searches the memory section 52E and reads the instruction codes (1) to (4) corresponding to the video appreciation to output those codes to the communication section 6 in order (step S1602) The communication section 6 converts those instruction codes into infrared ray codes and transmits the infrared ray codes as infrared ray signals.

As described above, according to Embodiment 16, the function items of "life pattern operation mode" for operating a plurality of devices on the basis of a certain pattern according to the life scene are preset, the life pattern operation mode select button 14 is provided, and the life pattern operation mode is set. Then, the control processing section 51E transmits an infrared ray signal converted from the instruction code to a device set on the basis of the set information stored in the memory section 52E so that a plurality of devices can be remotely controlled by one operation. Therefore, the procedure and operation become simple so that troublesomeness and time can be saved.

Embodiment 17

In the above-described respective embodiments, there is shown examples in which the function item select switch 2 and the affirmation button 3 are made up of individual switches. However, the present invention is not limited to or by those examples, but is applicable to a structure in which the affirmation button 3 is assembled with the function item select switch 2 so that the number of the operation buttons on the remote control unit can be further reduced.

Embodiment 18

Also, in the above-described respective embodiments, the function item select switch 2 is made up of a one-dimensional rotary encoder. However, the present invention is not limited by or to such a structure but may be designed to select the function items using a rotary encoder which is two-dimensionally movable. Also, the function item select switch 2 made up of the rotary encoder may be made up of, for example, a button so that the function items are identified and displayed every time the button is depressed.

Embodiment 19

Further, in the above-described respective embodiments, the function items selected by the function item select switch 2 is identified and displayed. However, the present invention is not limited by or to such a structure, but the entire picture displayed on the display unit 1 may be changed and displayed according to the selection by the function item select switch 2.

Embodiment 20

Figure 30:
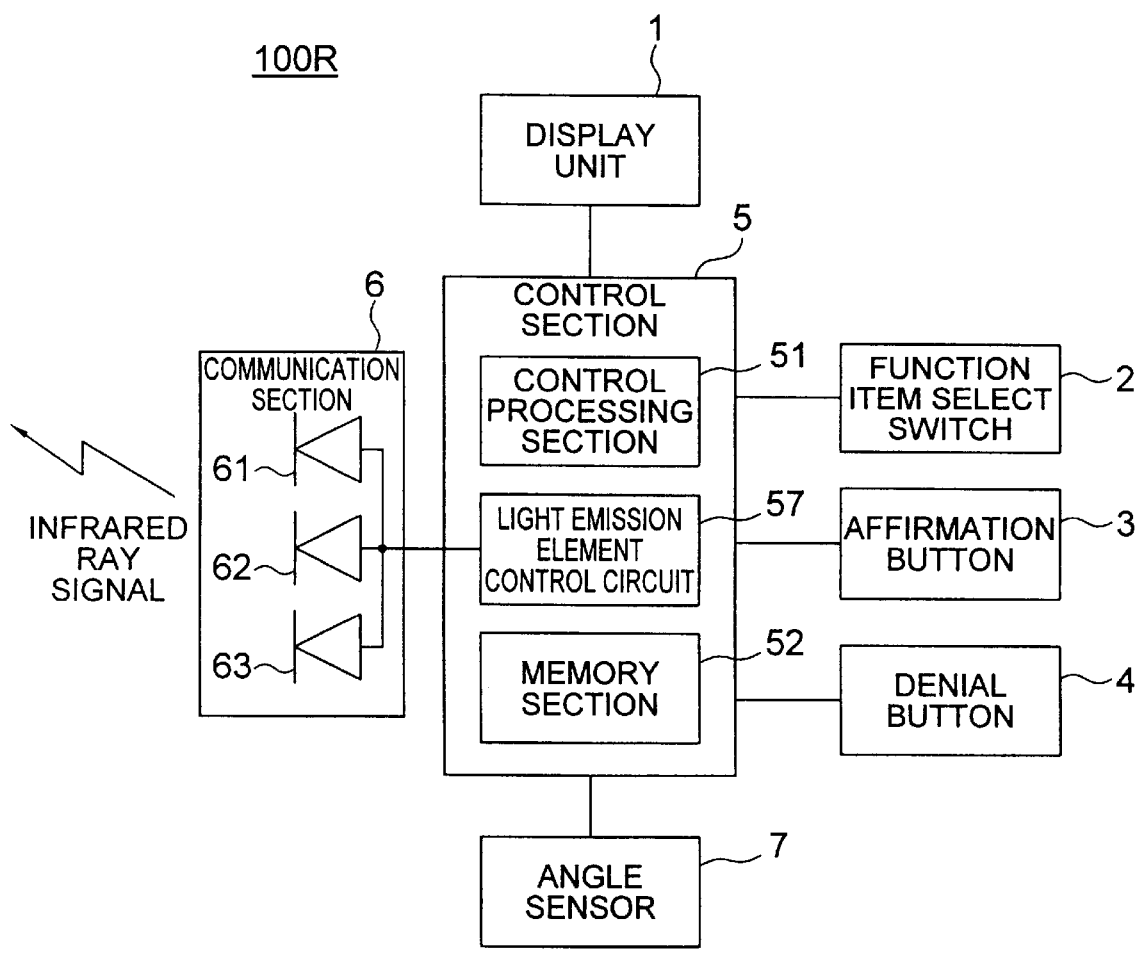
FIG. 30 is a block diagram showing the structure of a remote control unit according to Embodiment 20 of the present invention.
Figure 46:
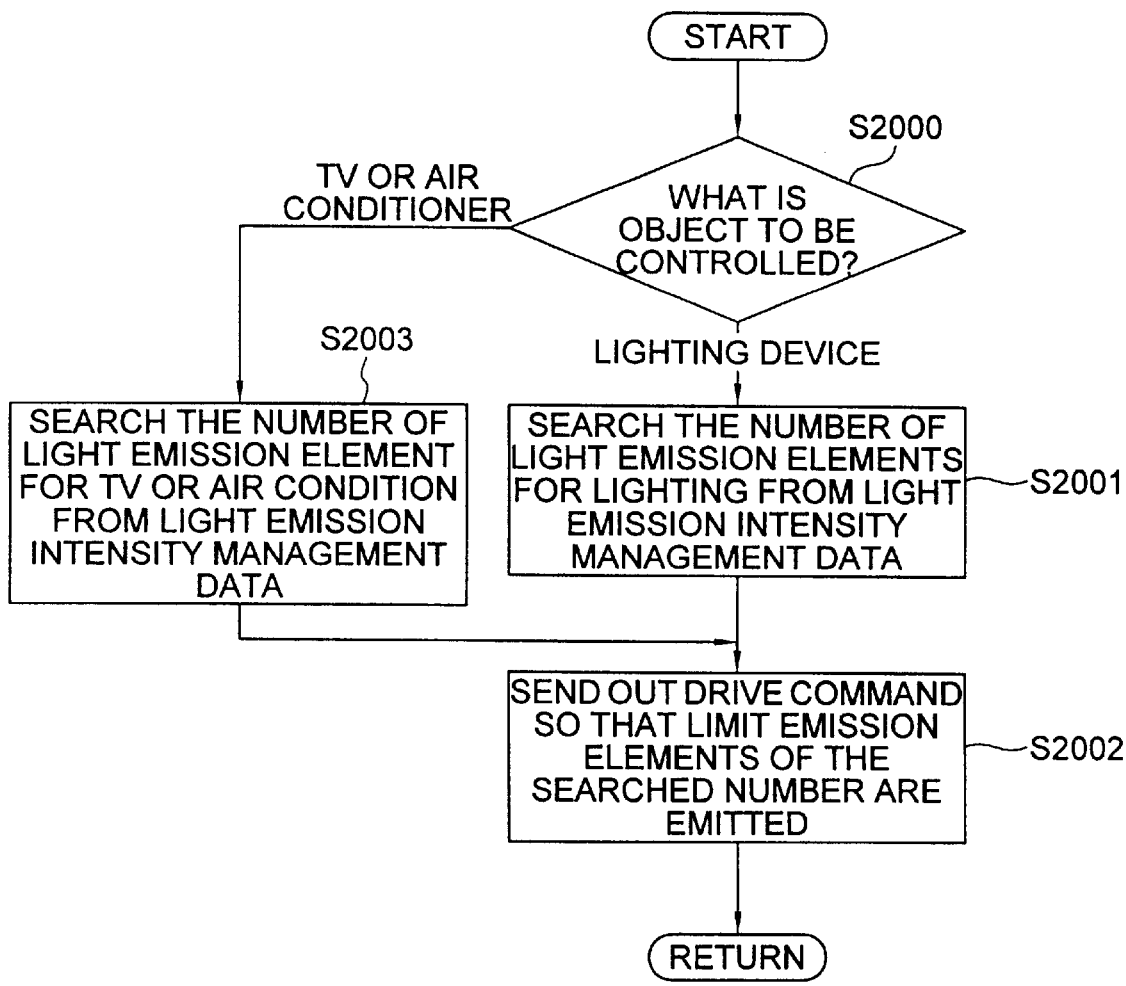
FIG. 46 is a flowchart showing the operation of a light emission element control circuit in the remote control unit according to Embodiment 20 of the present invention.

A remote control unit according to Embodiment 20 of the present invention will be described with reference to FIGS. 30 and FIG. 46. FIG. 30 is a block diagram showing a structure of the remote control unit according to Embodiment 20 of the present invention. FIG. 46 is a flowchart showing the operation of a light emission element control circuit in the remote control unit according to Embodiment 20.

In FIG. 30, reference numerals 61, 62 and 63 denote infrared ray light emission elements forming a communication section 6C, which are driven by the light emission element control circuit 57 in response to the communication control signal from the control processing section 51 to emit an infrared ray, thereby conducting communication. Also, reference character 100R denotes a remote control unit according to Embodiment 20.

Hereinafter, the operation of Embodiment 20 will be described assuming that objects to be controlled are a lighting device, an air conditioner and a television set (TV).

There has been known that the lighting device using a fluorescent lamp emits an infrared ray with a high intensity immediately after the lighting device turns on. Therefore, in the case of controlling the device using the infrared ray, it is necessary to use for communication a more intense infrared ray than the infrared ray emitted from a main body of the above lighting device. For that reason, in usual, three infrared ray light emission elements 61 to 63 are turned on at the same time to transmit signals using the more intense infrared ray.

Compared with the above lighting device, the air conditioner and the television set use a weak infrared ray (usually, one or two infrared ray elements) because the amount of emitted infrared rays that obstructs communication is little.

In the remote control unit for a plurality of devices, in order to surely conduct communication with any devices under control, the amount of emitted infrared rays necessary with reference to a device that requires the most intensity is designed. However, in the remote control unit, for the purpose of carriage convenience, a battery is used as its power supply. However, the battery is consumed because high intense light is emitted. This leads to such inconvenience that the lifetime of the battery is shortened. Also, because a plurality of devices are operated by one remote control unit, the number of times of operation is increased in comparison with the remote control unit that controls a single device, resulting in a problem that the lifetime of the battery is remarkably shortened.

The remote control unit 100R according to Embodiment 20 is designed to control the number of infrared ray emission elements necessary for each of the devices to be controlled to conduct sure communication with minimum power consumption.

In the case of controlling the lighting operation of the lighting device or the like by selecting the lighting device as a device to be controlled through the function item select switch 2 or by identifying the lighting device as the device to be controlled through the angle sensor 7, the control processing section 51 notifies the light emission element control circuit 57 of the communication control signal and that what is controlled is the lighting device.

The light emission element control circuit 57 selects the number of elements by which the light emission intensity as required is obtained, from the management data relating to a predetermined light emission intensity for each of the devices on the basis of the above notification to send out a drive command to the respective light emission elements 61, 62 and 63 of the communication section 6C (steps S2000 to S2002). In the case of the lighting device, for the above-mentioned reason, because the largest amount of emitted light in design is required, all of the infrared ray light emission elements 61, 62 and 63 are used for transmission.

In the case where the television or the air conditioner is selected as the device to be controlled by the function select switch 2, or in the case where the television or the air conditioner is identified as the device to be controlled by the angle sensor 7, the control processing section 51 notifies the light emission element control circuit 58 of the communication control signal and that what is controlled is the television or the air conditioner. The light emission element control circuit 57 selects the number of elements by which the light emission intensity as required is obtained, from the management data relating to the predetermined light emission intensity for each of the devices on the basis of the above notification to send out a drive command to the respective light emission elements 61, 62 and 63 of the communication section 6C (step S2003). In the case of the television and the air conditioner, for the above-mentioned reason, because communication is enabled with the small amount of emitted infrared rays, for example, only the light emission element 61 is used for communication.

As described above, since the number of infrared ray emission elements to be used is appropriately controlled for the device to be controlled, there can be obtained a remote control unit which conducts communication surely and with the minimum power consumption, thereby being capable of elongating the lifetime of the battery.

Embodiment 21

The above-described Embodiment 20 is structured to adjust the amount of emitted infrared rays according to the number of infrared ray emission elements. Alternatively, the drive current to the light emission elements may be so controlled as to limit the amount of emitted infrared rays with the result that the same effect can be obtained.

Embodiment 22

Figure 31:
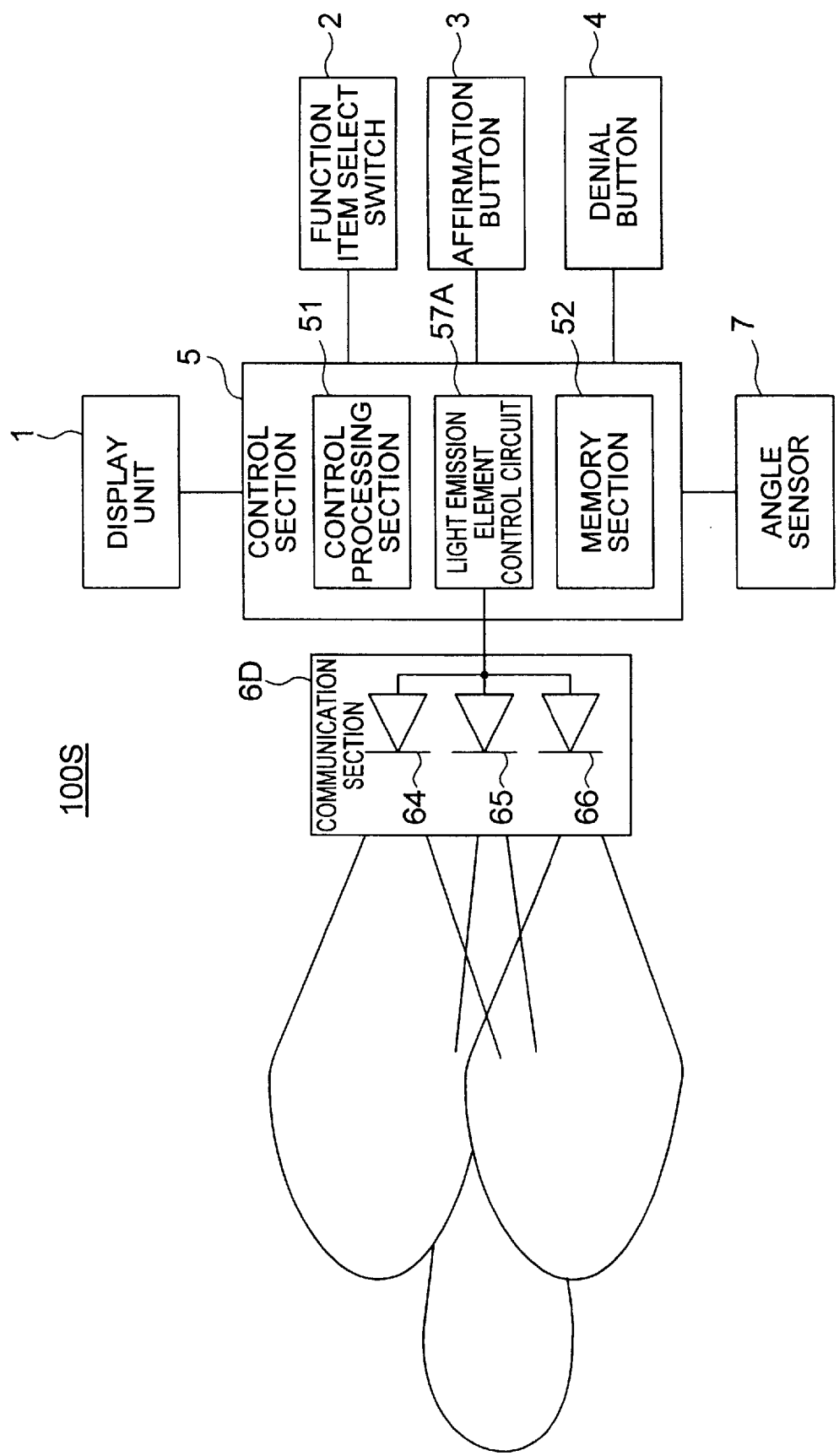
FIG. 31 is a block diagram showing the structure of a remote control unit according to Embodiment 22 of the present invention.
Figure 47:
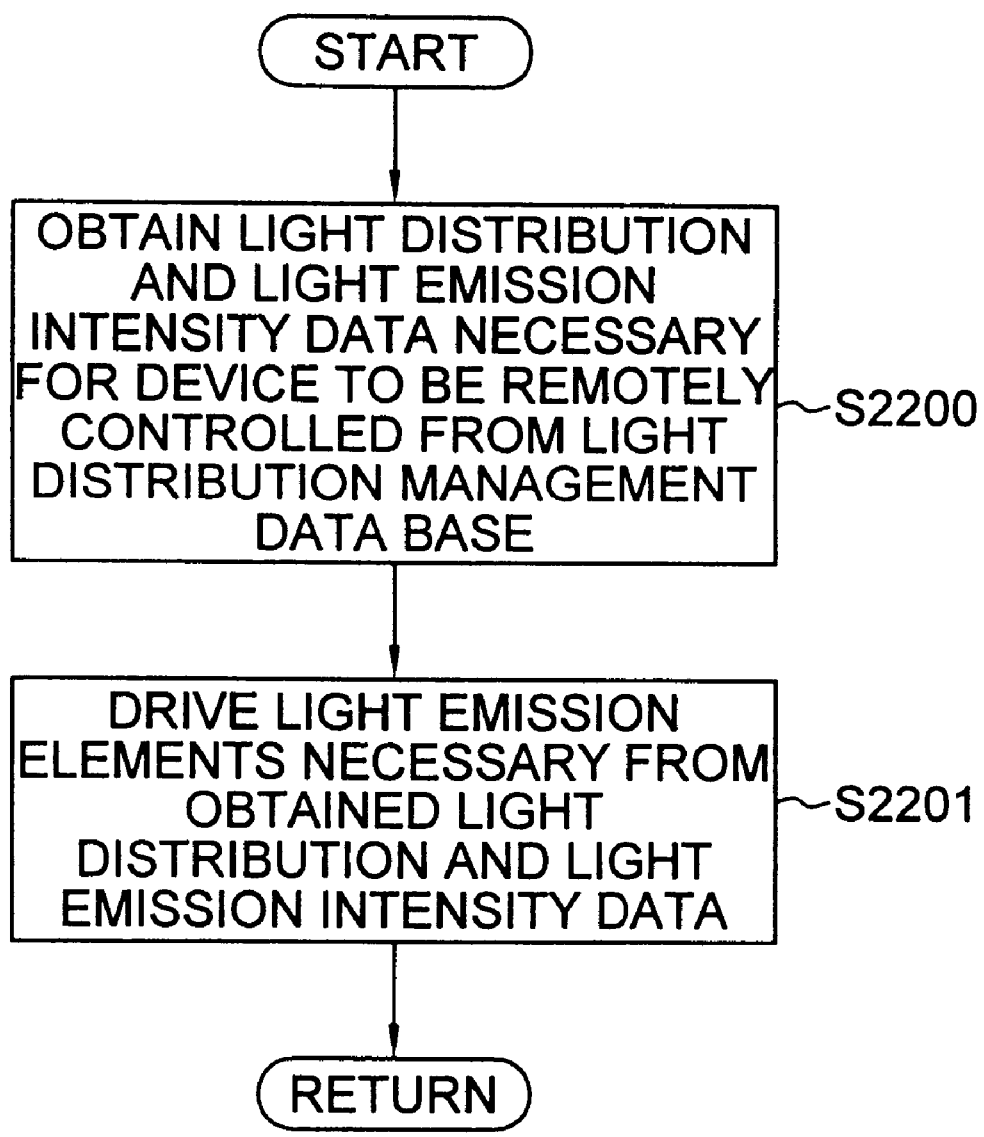
FIG. 47 is a flowchart showing the operation of a light emission element control circuit in the remote control unit according to Embodiment 22 of the present invention.

A remote control unit according to Embodiment 22 of the present invention will be described with reference to FIGS. 31 and FIG. 47. FIG. 31 is a block diagram showing a structure of the remote control unit according to Embodiment 22 of the present invention. FIG. 47 is a flowchart showing the operation of a light emission element control circuit in the remote control unit according to Embodiment 22.

As a countermeasure against the shortened lifetime of the battery, there are many cases in which in order to operate the device as far as possible from the remote control unit with as small amount of light as possible, LEDs a light distribution range of which is narrowed are used. In this example, because the light distribution is narrowed, it is required that the remote control unit is accurately directed toward the device and operated.

Also, vibrations caused when button operation is made by hands makes the center of an optical axis shift, as a result of which there arises such a problem that the device cannot be stably operated.

In the case of the television set located horizontally, the remote control unit is relatively easily directed to the device and operated. On the other hand, in the case of operating the air conditioner and the lighting device, the operation gets unstable depending on a position where the device is located, such that the center of an optical axis is shifted due to parallax to disenable the operation.

In particular, in the case where the operator is an aged-person, the operation of the air conditioner and the lighting device which must be conducted by raising his hand and arm causes large vibrations to be generated by the weaken power of the arm and finger due to aging. Thus, those problems remarkably appear.

In FIG. 31, reference numerals 64 and 66 denote infrared ray emission elements wide in light distribution, and 65 is an infrared ray emission element narrow in light distribution. Also, reference character 100S denotes a remote control unit according to Embodiment 22.

Hereinafter, the operation of the remote control unit 100S according to Embodiment 22 will be described assuming that the devices to be controlled are the air conditioner, the lighting device and the television.

For example, in the case where the lighting device is selected as the device to be remotely controlled by the function select switch 2, or in the case where the lighting device is identified as the device to be remotely controlled by the angle sensor 7, the control processing section 51 notifies the light emission element control circuit 57A of the communication control signal and that what is controlled is the lighting device.

The light emission element control circuit 57A selects the elements by which the light distribution and the light emission intensity as required are obtained, referring to a predetermined light distribution management data base for each of the devices on the basis of the above notification to send out a drive command to the respective light emission elements of the communication section 6D (steps S2200 to S2201). In the case of the lighting device, for the above-mentioned reason, because the wide light distribution and the maximum amount of emitted light are required, all of the light emission elements 64, 65 and 66 are driven.

In the case where the air conditioner is selected as the device to be remotely controlled by the function select switch 2, or in the case where the air conditioner is identified as the device to be remotely controlled by the angle sensor 7, the control processing section 51 notifies the light emission element control circuit 57A of the communication control signal and that what is controlled is the air conditioner.

The light emission element control circuit 57A selects a combination of the elements by which the light distribution and the light emission intensity as required are obtained, referring to a predetermined light distribution management data base for each of the devices on the basis of the above notification to send out a drive command to the respective light emission elements of the communication section 6D (steps S2200 to S2201). In the case of the air conditioner, for the above-mentioned reason, because the relatively wider light distribution is required, the light emission elements 64 and 66 are driven. Also, in the case of the television, because the light emission of the relatively small amount and a narrow light emission range is sufficiently required, only the light emission element 65 is driven.

Since the infrared ray emission elements with different light emission characteristic are driven for the device to be controlled, there can be obtained a remote control unit which conducts remote control on each of the devices surely and with the minimum power consumption, thereby elongating the lifetime of the battery.

Embodiment 23

Figure 32:
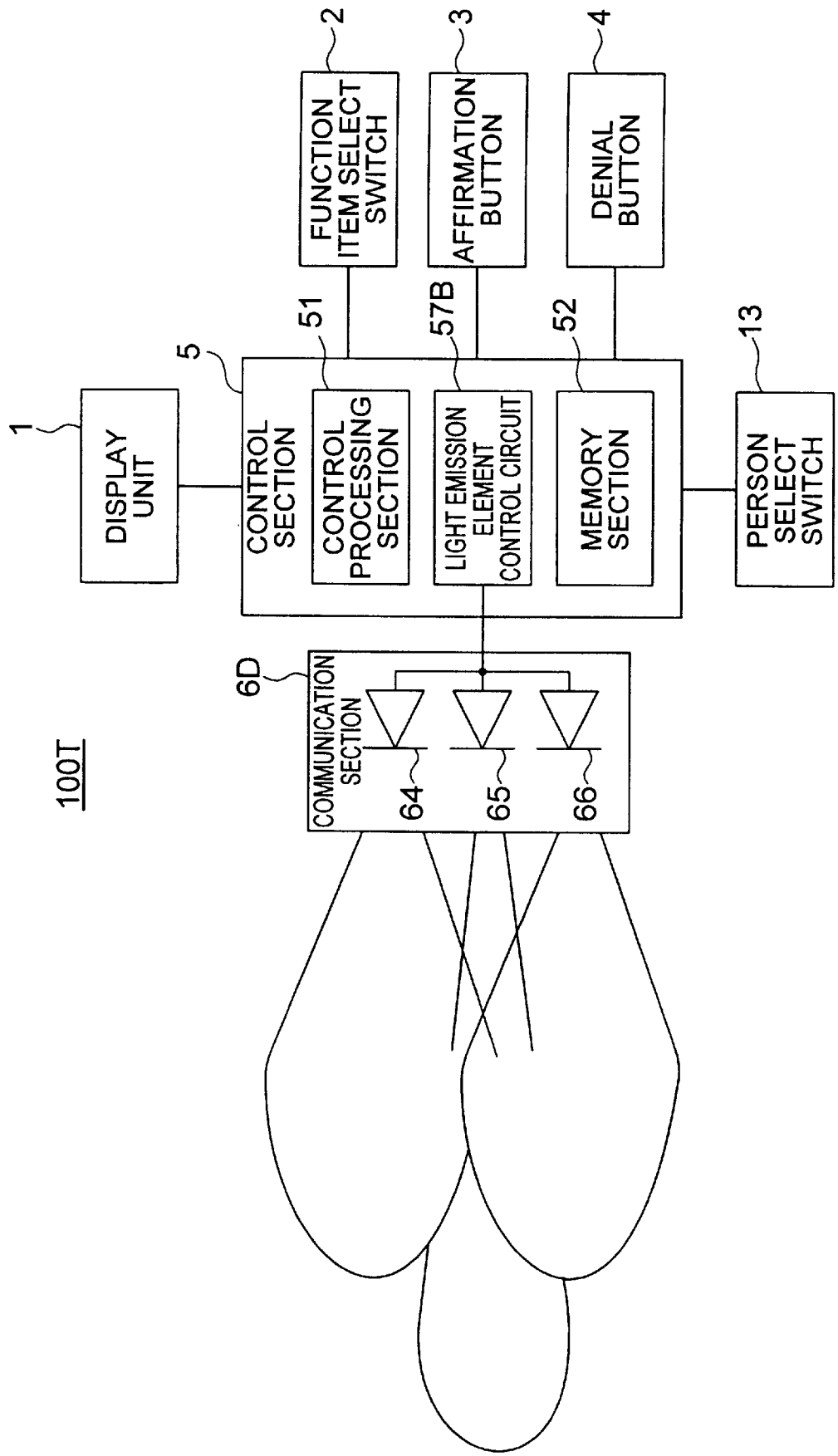
FIG. 32 is a block diagram showing the structure of a remote control unit according to Embodiment 23 of the present invention.

A remote control unit according to Embodiment 23 of the present invention will be described with reference to FIG. 32. FIG. 32 is a block diagram showing a structure of the remote control unit according to Embodiment 23 of the present invention.

Since the operation by the person select switch 13 is identical with the contents described in the above-described Embodiment 15, its description will be omitted. There is provided the person select switch 13 that enables a change in the function items according to the functions required by the operator, and the light distribution and the light emission intensity of the communication section 6D are conducted according to information (aged-person mode, normal mode and mania mode) set in the person select switch 13 and information relating to the selected device, thereby being capable of obtaining a remote control unit that makes the operability more sure and the lifetime of the battery improve.

Embodiment 24

Figure 33:
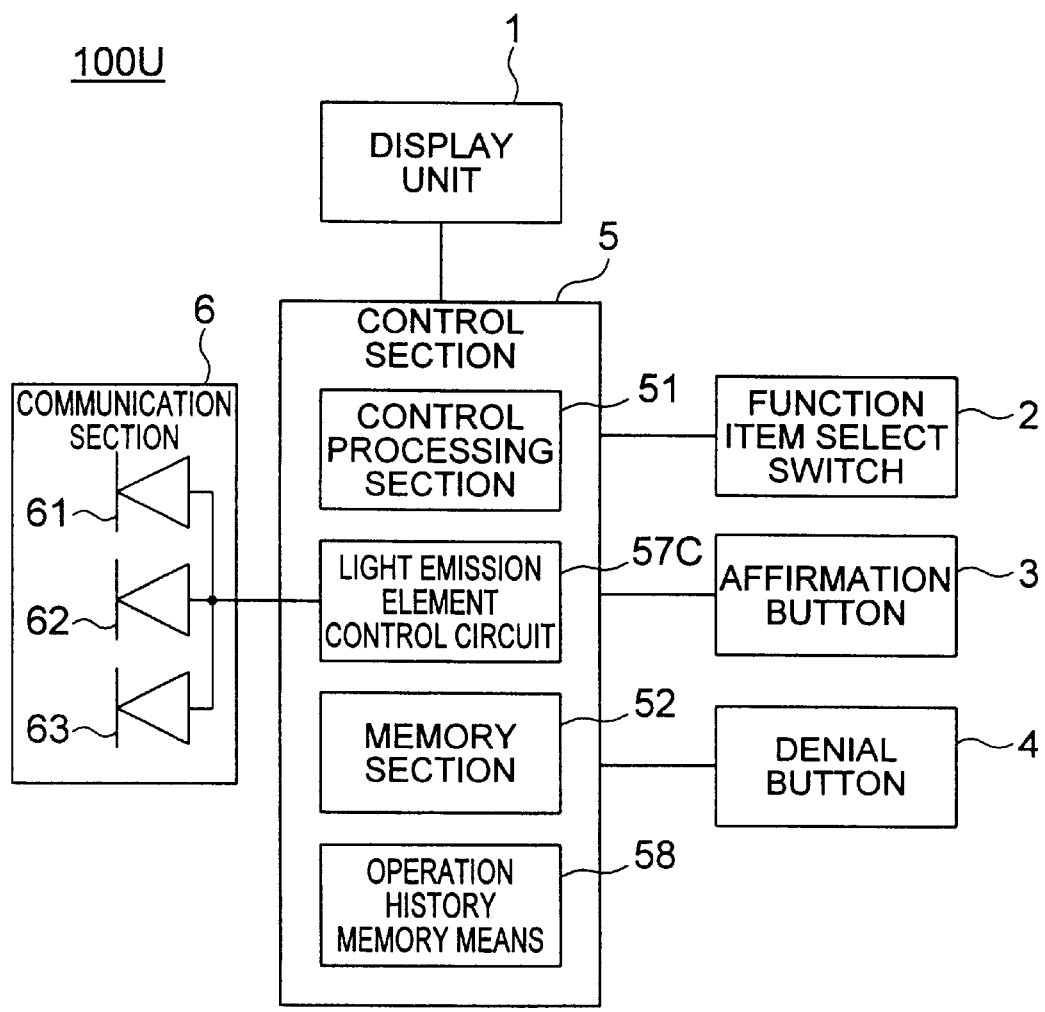
FIG. 33 is a block diagram showing the structure of a remote control unit according to Embodiment 24 of the present invention.
Figure 48:
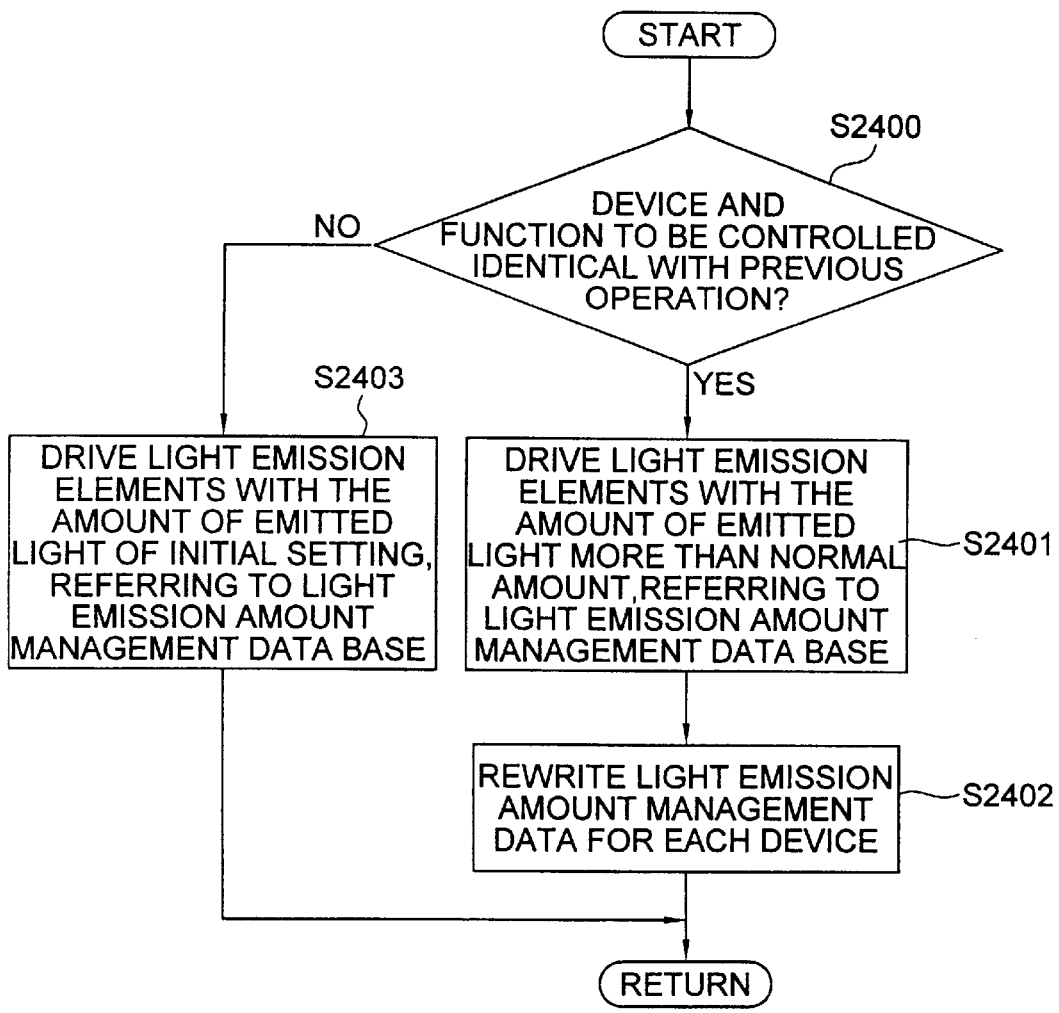
FIG. 48 is a flowchart showing the operation of a light emission element control circuit in the remote control unit according to Embodiment 24 of the present invention.

A remote control unit according to Embodiment 24 of the present invention will be described with reference to FIGS. 33 and FIG. 48. FIG. 33 is a block diagram showing a structure of the remote control unit according to Embodiment 24 of the present invention. FIG. 48 is a flowchart showing the operation of a light emission element control circuit in the remote control unit according to Embodiment 24.

In FIG. 33, reference numeral 58 denotes an operation history memory means which stores a past (previous) controlled device and controlled function and a present device to be controlled and function to be controlled.

When the operator rotationally operates the function item select switch 2, the control processing section 51 allows a picture stored in the memory section 52 in advance to be displayed on the display unit 1. On the basis of that display, the control processing section 51, upon being inputted with an instruction of the operator as instruction data from the function item select switch 2, the affirmation button 3 or the denial button 4, allows the contents of the instruction data to be displayed or another picture stored in the memory section 52 to be displayed on the basis of the instruction data. Further, when the instruction data is established, the control processing section 51 outputs an instruction code to the light emission element control circuit 57C.

The light emission element control circuit 57C compares, from the instruction data, a device to be controlled and a function to be controlled which are the contents of instruction data with a device controlled and a function controlled at the time of the previous operation which are stored in an operation history memory means 58, and if they are different, the light emission element control circuit 57C refers to the management data relating to the light emission intensity for each of the devices to instruct drive with the amount of emitted light at the initial set value (for example, only the light emission element 61 is driven) to the communication section 6C (step S2403). The communication section 6C outputs an infrared ray signal obtained by converting the instruction code into the infrared ray code according to the instruction.

Also, the light emission element control circuit 57C compares a device to be controlled and a function to be controlled which are the contents of instruction data with a device controlled and a function controlled at the time of the previous operation which are stored in an operation history memory means 58, and if they are identical, the light emission element control circuit 57C instructs drive with the amount of emitted light more than the normal amount of emitted amount (for example, the light emission elements 61 and 62 are driven) to the communication section 6C, and rewrites the management data relating to the light emission intensity for each of the devices (steps S2400 to S2402). The communication section 6C outputs an infrared ray signal obtained by converting the instruction code into the infrared ray code according to the instruction. In the subsequent process, the infrared ray communication is executed with the amount of emitted light based on the rewritten management data relating to the light emission intensity.

As described above, according to Embodiment 24, a case in which the amount of emitted light for infrared ray communication lacks for control of the device to be remotely controlled to fail the remote control of the device is replaceably detected by repeating the same operation for the same device, and in the case where the same operation is repeated, the amount of emitted light is sequentially increase, thereby being capable of obtaining a remote control unit which can be operated surely and stably.

Embodiment 25

Figure 34:
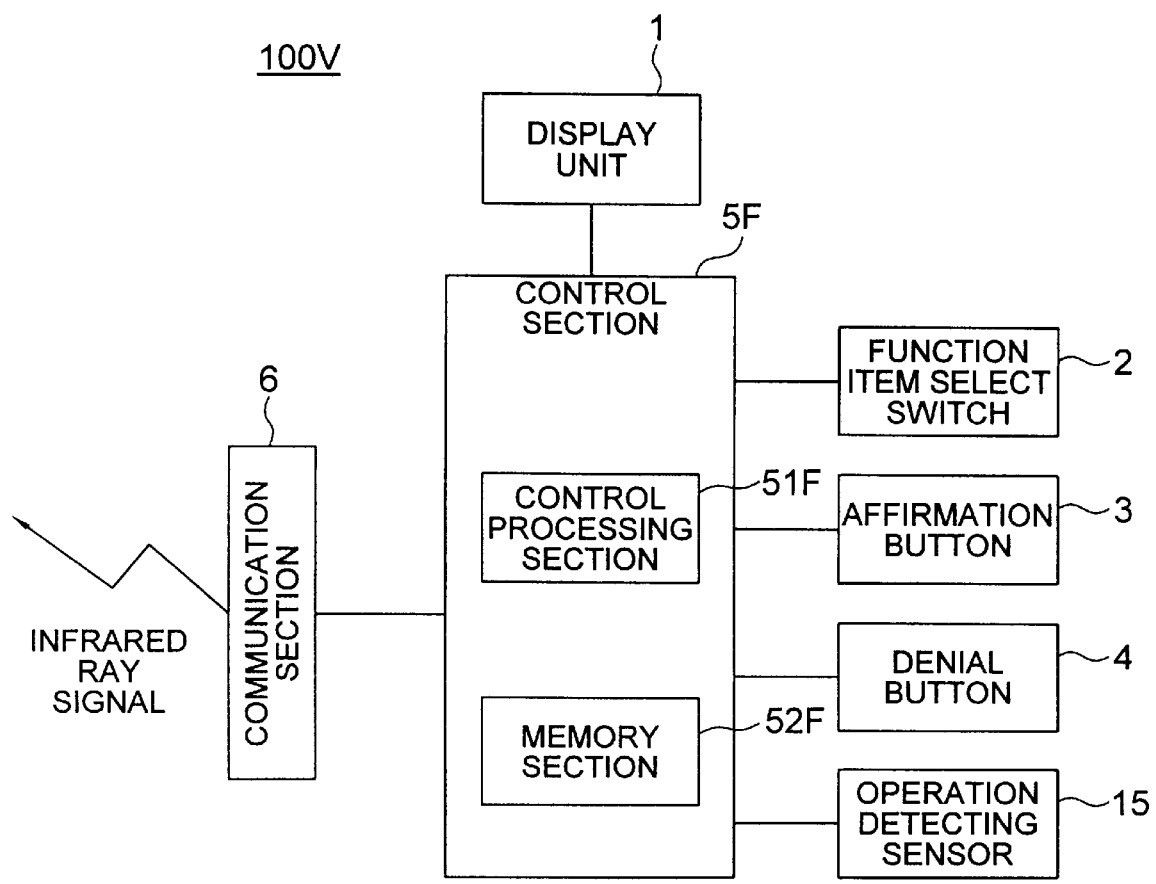
FIG. 34 is a block diagram showing the structure of a remote control unit according to Embodiment 25 of the present invention.
Figure 35:
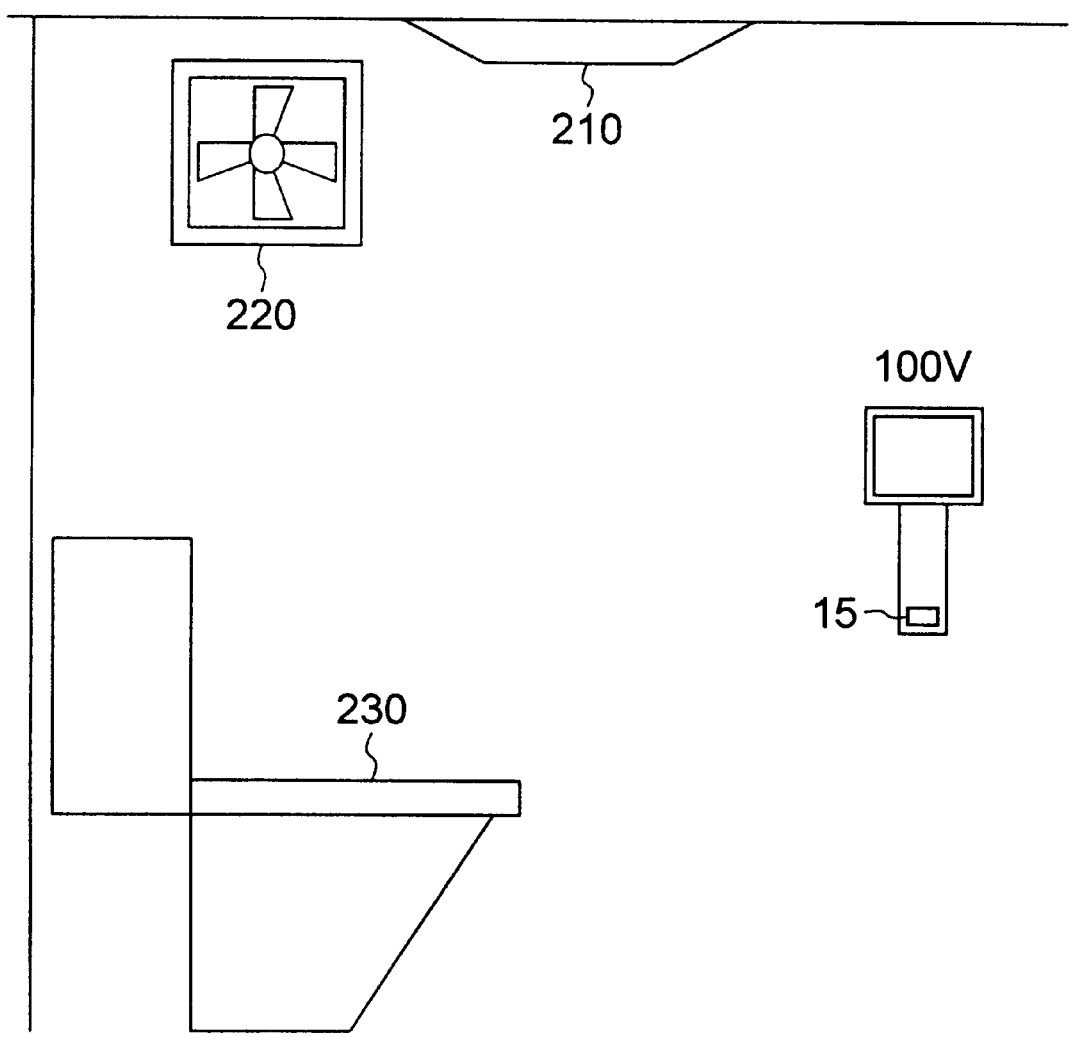
FIG. 35 is a diagram showing the operating state of the remote control unit according to Embodiment 25 of the present invention.
Figure 49:
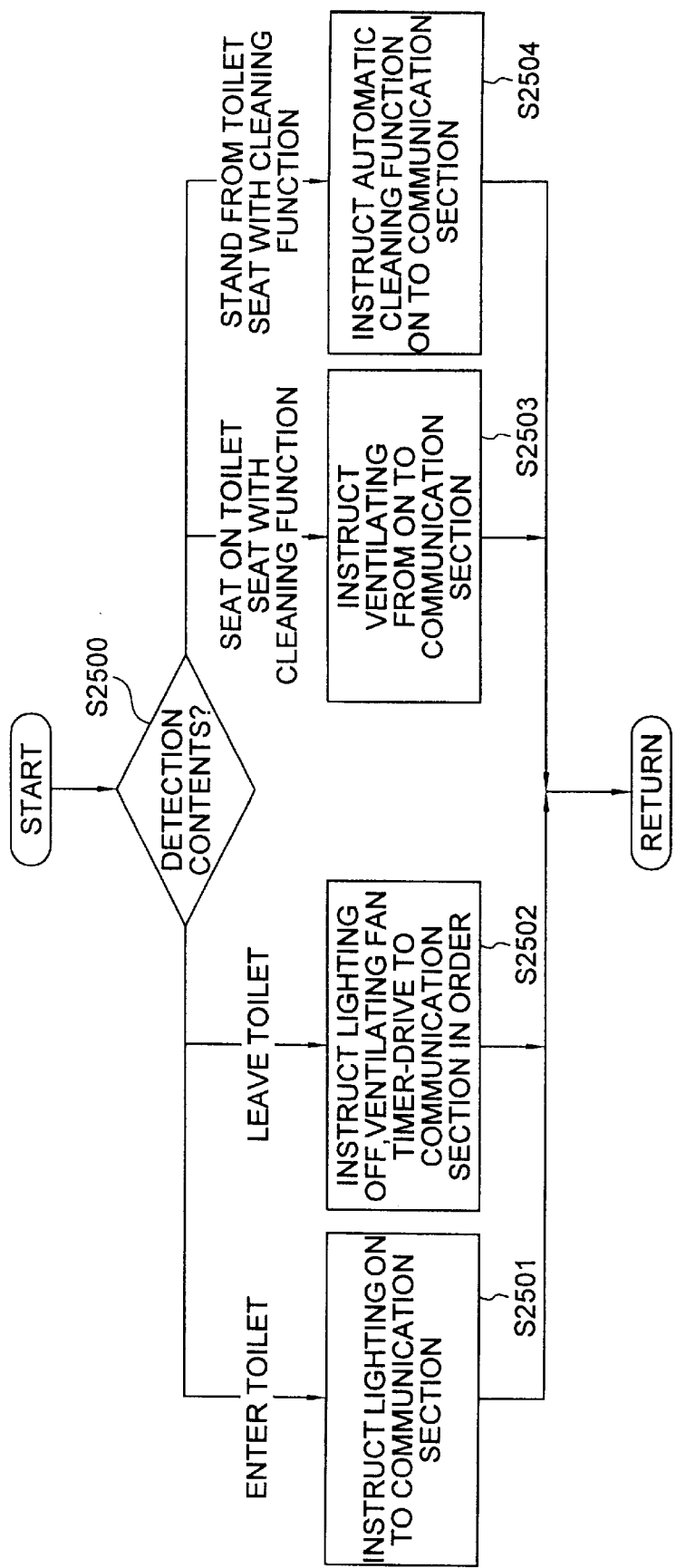
FIG. 49 is a flowchart showing the operation of a light emission element control circuit in the remote control unit according to Embodiment 25 of the present invention.

A remote control unit according to Embodiment 25 of the present invention will be described with reference to FIGS. 34, 35 and 49. FIG. 34 is a block diagram showing a structure of the remote control unit according to Embodiment 25 of the present invention. FIG. 35 is a diagram showing the arrangement of the respective devices in the case where the remote control unit according to Embodiment 25 is applied to a toilet space. FIG. 49 is a flowchart showing the operation of a control processing section in the remote control unit according to Embodiment 25.

In FIGS. 34 and 35, reference numeral 15 denotes an operation detecting sensor; and 100V is a remote control unit according to Embodiment 25. Also, reference numeral 210 denotes a lighting device; 220, a ventilating fan; and 230, a toilet seat with a cleaning function. The operation detecting sensor 15 is, for example, a sensor for detecting the action of a person by a light such as an infrared light, a sensor for detecting entering/leaving by open/close of an inlet door, a sensor for detecting seating/standing by contact/non-contact with the toilet seat, etc.

The operation detecting sensor 15 detects the entering/leaving of a person with respect to a toilet space and seating/standing with respect to the toilet seat 230 with a cleaning function. The operation instruction to the respective devices responsive to the respective operation detections of the operation detecting sensor 15 are predetermined as follows:

In the case of detecting that a person enters the toilet space, the lighting device 210 is turned on.

In the case of detecting that the person seats the toilet seat with a cleaning function 230, the ventilating fan 220 is turned on.

In the case of detecting that the person stands up from the toilet seat with a cleaning function 230, an automatic cleaning function of the toilet seat 230 is turned on.

In the case of detecting that the person leaves the toilet space, the lighting device 210 is turned off, and the ventilating fan 220 is driven by a timer (turned off after a predetermined period).

Hereinafter, the operation of the remote control unit according to Embodiment 25 will be described. When a person enters a toilet space as shown in FIG. 35, the operation detecting sensor 15 detects that the person enters the space and sends out an entry detection signal to the control processing section 51F. After that, the control processing section 51F instructs the instruction code representing that the lighting device 210 is turned on to the communication section 6 from the operation contents at the time when the person enters the toilet space (step S2501). The communication section 6 outputs the infrared ray signal obtained by converting the instruction code into the infrared ray code according to the instruction. The operation at the time of seating/standing and leaving the toilet space (steps S2502 to S2504) are also identical in operation with the above example except that the device to be controlled is different, and therefore its description will be omitted.

As described above, according to Embodiment 25, there can be obtained a remote control unit which is capable of transmitting the instruction code which has been converted into a radio signal such as an infrared ray in a non-contact manner instead of the respective remote control operation by hand, for the respective operation detection, when by-hand operation cannot be conducted for the reasons that the hand is unclean or wet.

POSSIBILITY OF INDUSTRIAL APPLICATION

As is described above, the remote control unit according to the present invention includes display means for displaying a function item select picture where a plurality of function items are arranged; function item select means for selecting any function item in the above-described function item select picture; decision instruction input means for deciding the above-described selected function item; cancel instruction input means for canceling the above-described selected function item; control means for allowing another function item select picture where a plurality of other function items are arranged to be displayed on the display means when a specific function item is decided and instructed by the above-described decision instruction input means, to output an instruction code of the above-described specific function item as decided and instructed; and communication means for converting the above-described outputted instruction code into a radio signal to transmit the radio signal to a device to be remotely controlled. With this structure, the number of switches and buttons to be manipulated can be reduced, and an increased area of the respective function items which are displayed on the display means makes search and operation easy. Further, the operation procedure of the respective devices to be remotely controlled can be unified to enable the operation procedure to be simplified. Thus, it is advantageous that high operability can be obtained.

Also, as is described above, in the remote control unit according to the present invention, the above-described control means includes a control processing section and a memory section. The above-described control processing section first reads the function item select picture where a plurality of devices to be remotely controlled are arranged as the plurality of function items from the above-described memory section and allows the function item select picture to be displayed on the above-described display means as an initial picture. Then, when a specific device to be remotely controlled is selected by the above-described function item select means, the above-described control processing section allows the above-described specific device to be remotely controlled to be displayed on the above-described display means in a specific manner so that the above-described specific device is distinguishable from other devices to be remotely controlled. When the above-described specific device to be remotely controlled is decided and instructed by the above-described decision instruction input means, the above-described control processing section reads another function item select picture where a plurality of set functions for the above-described decided and instructed device to be remotely controlled are arranged as the plurality of other function items from the above-described memory section and allows another function item select picture to be displayed on the above-described display means. When a transmission instruction is provided, the above-described control processing section outputs the instruction code of the above-described decided and instructed device to be remotely controlled to the above-described communication means. When a specific set function is selected by the above-described function item select means, the above-described control processing section allows the above-described specific set function to be displayed on the above-described display means in a specific manner so that the above-described specific set function is distinguishable from other set functions. When the above-described specific set function is decided and instructed by the above-described decision instruction input means, the above-described control processing section reads a set-value input picture of the above-described decided and instructed set function from the above-described memory section when a set-value input is necessary and allows the set-value input picture to be displayed on the above-described display means. When a transmission instruction is provided, the above-described control processing section outputs the instruction code of the above-described decided and instructed set function to the above-described communication means, and the above-described communication means converts the above-described instruction code into an infrared signal to transmit the infrared signal to the above-described decided and instructed device to be remotely controlled. With this structure, the number of switches and buttons to be manipulated can be reduced. Further, the operation procedure of the respective devices to be remotely controlled can be unified to enable the operation procedure to be simplified. Thus, it is advantageous that high operability can be obtained.

Also, as is described above, in the remote control unit according to the present invention, the above-described function item select means includes a first function item select switch for moving a cursor of the above-described display means upward, and a second function item select switch for moving the cursor of the above-described display means downward. With this structure, intuitive operation can be conducted with the advantage that operation can be conducted without any hesitation at the time of selecting any one of the items.

Further, as is described above, in the remote control unit according to the present invention, the above-described control means includes timer means for measuring a continuous operation period of the above-described first function item select switch and measuring a continuous operation period of the above-described second function item select switch, and a continuous-operation judging section for generating a signal equivalent to the operation of a predetermined number of times so that the picture of the above-described display means is scrolled when the continuous operation period measured by the above-described timer means reaches a predetermined period. With this structure, it is advantageous that the function items can be selected rapidly without operating the function select item switches several times.

Still further, as is described above, in the remote control unit according to the present invention, the above-described control means further includes continuous-operation acceptance advisability judging means for returning an acceptance enable signal or an acceptance disenable signal referring to a continuous-operation acceptance advisability data base in which continuous-operation acceptance advisability is described for each of the function items, when receiving an inquiry about the advisability of continuous operation acceptance from the above-described continuous-operation judging section, wherein the above-described continuous-operation judging section generates no signal equivalent to the operation of the predetermined number of times even if the continuous operation period measured by the above-described timer means reaches the predetermined period, when receiving the acceptance disenable signal from the above-described continuous-operation acceptance advisability judging means. With this structure, it is advantageous that the function items can be prevented from being scrolled unintentionally by continuous operation, thereby being capable of reducing misoperation.

Further, as is described above, in the remote control unit according to the present invention, the above-described control means includes item display order managing means for updating the select frequency of a select frequency management table in which a select frequency is described for each of the function items every time any function item is decided and instructed by the above-described decision instruction input means, and for rearranging the function item display order of a function item display list for the function item select picture into the select frequency order of the above-described select frequency management table. This structure results in an advantage that the operation can be efficiently conducted through minimum select operation at the time of use.

Also, as is described above, the remote control unit according to the present invention further comprises subject-device identifying means for identifying a device to be remotely controlled on the basis of a direction of a unit body which is directed to the device to be remotely controlled, wherein the above-described control means allows the function item select picture in which a plurality of set functions for the device to be remotely controlled which is identified by the above-described subject-device identifying means are arranged to be displayed on the above-described display means as the initial picture. This structure enables the operation procedure to be reduced with the advantage that high operability can be obtained.

Further, as is described above, in the remote control unit according to the present invention, the above-described subject-device identifying means is an angle sensor for identifying the device to be remotely controlled on the basis of an elevation angle of the unit body when the above-described subject-device identifying means is directed to the device to be remotely controlled. As a result, it is advantageous that high operability can be obtained with a simple structure.

Also, as is described above, in the remote control unit according to the present invention, the above-described control means identifies the device to be remotely controlled on the basis of a device identification code received by the above-described communication means, and allows the function item select picture in which a plurality of set functions for the above-described identified device to be remotely controlled are arranged to be displayed on the above-described display means as the initial picture. This structure enables identification with a high accuracy, resulting in an advantage that high operability can be obtained.

Also, as is described above, the remote control unit according to the present invention further comprises vibration generating means for generating vibrations, wherein the above-described control means allows the above-described vibration generating means to generate the vibrations every time the picture of the above-described display means is updated and displayed. This structure enables tactile teaching in addition to visual teaching due to the display means to be conducted, resulting in an advantage that misoperation can be prevented by giving more real feeling of the device operation.

Further, as is described above, in the remote control unit according to the present invention, the above-described vibration generating means is a touch-sense response device for generating vibration by beating the unit body. This provides an advantage that tactile teaching can be conducted.

Also, as is described above, the remote control unit according to the present invention further comprises sounding means for outputting a sound, wherein the above-described control means allows the above-described sounding means to output the sound every time the picture of the above-described display means is updated and displayed. This structure enables tactile teaching in addition to visual teaching due to the display means to be conducted, resulting in an advantage that misoperation can be prevented by giving more real feeling of the device operation.

Further, as is described above, in the remote control unit according to the present invention, when any function item in the function item select picture displayed on the above-described display means is selected, the above-described sounding means reads out the above-described selected function item. Therefore, it is advantageous that audible teaching can be conducted.

Also, as is described above, the remote control unit according to the present invention further comprises characteristic selecting means for selecting modes according to the number of function items, wherein when one of the above-described modes is selected by the above-described characteristic selecting means, the above-described control means allows the function item select picture where the function items of the number corresponding to the above-described selected mode are arranged to be displayed on the above-described display means. This structure enables the kind of items, the number of items and an display area to be altered according to the characteristic, the idea or the like of the operator. Thus, it is advantageous that high operability can be obtained.

Also, as is described above, the remote control unit according to the present invention further comprises pattern operation mode selecting means for selecting an operation mode in which a plurality of devices to be remotely controlled with a predetermined relation can be operated at the same time, wherein when the above-described operation mode is selected by the above-described pattern operation mode selecting means, the above-described control means allows the function item select picture where the function items for operating the plurality of devices to be remotely controlled with the predetermined relation at the same time are arranged to be displayed on the above-described display means. This enables a plurality of devices to be remotely controlled to be remotely controlled together through one operation according to a predetermined order at the time of conducting an operation pattern which is substantially determined in a certain life situation, as a result of which the operation procedure is reduced, thereby being capable of obtaining high operability.

Also, as is described above, in the remote control unit according to the present invention, the above-described communication means includes a plurality of infrared ray emission elements, and the above-described control means includes light emission element control means for controlling a light emission intensity of the infrared ray signal transmitted from the above-described communication means in correspondence with the selected device to be remotely controlled, referring to light emission intensity management data where a light emission intensity is described for each of the devices to be remotely controlled in advance. As a result, communication can be conducted surely and with minimum power consumption with the advantage that the lifetime of a battery can be elongated.

Also, as is described above, in the remote control unit according to the present invention, the above-described communication means includes a plurality of infrared ray emission elements different in light distribution characteristic, and the above-described control means includes light emission element control means for controlling a light distribution of the infrared ray signal transmitted from the above-described communication means in correspondence with the selected device to be remotely controlled, referring to light distribution management data base where a light distribution characteristic is described for each of the devices to be remotely controlled in advance. As a result, communication can be conducted surely and with minimum power consumption with the advantage that the lifetime of a battery can be elongated.

Further, as is described above, in the remote control unit according to the present invention, the above-described communication means includes a plurality of infrared ray emission elements different in light distribution characteristic, and the above-described control means includes light emission element control means for controlling a light distribution of the infrared ray signal transmitted from the above-described communication means in correspondence with the selected device to be remotely controlled and the mode selected by the above-described characteristic selecting means, referring to light distribution management data base where a light distribution characteristic is described for each of the devices to be remotely controlled in advance. As a result, sure operability can be realized with the advantage that the lifetime of a battery can be elongated.

Further, as is described above, in the remote control unit according to the present invention, the above-described control means further includes operation history memory means for storing the device to be remotely controlled which has been selected previously and its operation function, wherein when a device to be remotely controlled which is selected presently and its operation function are identical with the device to be remotely controlled which has been selected previously and its operation function which are stored in the above-described operation history memory means, the above-described light emission element control means controls the light emission intensity of the infrared ray signal transmitted from the above-described communication means to become larger than the light emission intensity of the above-described light emission intensity management data and rewrites the light emission intensity of the above-described light emission intensity management data. As a result, it is advantageous that operation can be conducted surely and stably.

Also, as is described above, the remote control unit according to the present invention further comprises an operation detecting sensor for detecting specific operation, wherein when the above-described specific operation is detected by the above-described operating detecting sensor, the above-described control means allows the above-described communication means to convert the instruction code of the specific operation of the device to be remotely controlled in correspondence with the above-described specific operation into an infrared ray signal and to transmit the infrared ray signal. As a result, it is advantageous that the devices to be remotely controlled can be operated in a non-contact manner.

What is claimed is:

1. A remote control unit, comprising:

display means for displaying a function item select picture where a plurality of function items are arranged;

function item select means for selecting any function item in said function item select picture;

decision instruction input means for deciding said selected function item;

cancel instruction input means for canceling said selected function item;

control means for allowing another function item select picture, where a plurality of other function items are arranged, to be displayed on the display means when a specific function item is decided and instructed by said decision instruction input means, and for outputting an instruction code of said specific function item as decided and instructed; and communication means for converting said output instruction code into a radio signal to transmit the radio signal to a device to be remotely controlled, wherein said control means includes a control processing section and a memory section, and wherein said control processing section reads the function item select picture where a plurality of devices to be remotely controlled are arranged as the plurality of function items from said memory section and allows the function item select picture to be displayed on said display means as an initial picture.

2. The remote control unit as claimed in claim 1, wherein when a specific device to be remotely controlled is selected by said function item select means, said control processing section allows said specific device to be remotely controlled to be displayed on said display means in a specific manner so that said specific device is distinguishable from other devices to be remotely controlled;

when said specific device to be remotely controlled is decided and instructed by said decision instruction input means, said control processing section reads another function item select picture where a plurality of set functions for said decided and instructed device to be remotely controlled are arranged as the plurality of other functions items from said memory section and allows another function item select picture to be displayed on said display means; and when a transmission instruction is provided, said control processing section outputs the instruction code of said decided and instructed device to be remotely controlled to said communication means.

3. The remote control unit as claimed in claim 1, wherein when a specific set function is selected by said function item select means, said control processing section allows said specific set function to be displayed on said display means in a specific manner so that said specific set function is distinguishable from other set functions;

when said specific set function is decided and instructed by said decision instruction input means, said control processing section reads a set-value input picture of said decided and instructed set functions from said memory section when a set-value input is necessary, and allows the set-value input picture to be displayed on said displayed means; and when a transmission instruction is provided, said control processing section outputs the instruction code of said decided and instructed set function to said communication means.

4. The remote control unit as claimed in claim 1, wherein said function item select means includes a first function item select switch for moving a cursor of said display means upward, and a second function item select switch for moving the cursor of said display means downward.

5. The remote control unit as claimed in claim 4, wherein said control means includes:

timer means for measuring a continuous operation period of said first function item select switch and measuring a continuous operation period of said second function item select switch; and continuous-operation judging section for generating a signal equivalent to the operation of predetermined number of times so that the picture of said display means is scrolled when the continuous operation period measure by said timer means reaches a predetermined period.

6. The remote control unit as claimed in claim 5, wherein said control means further includes continuous-operation acceptance advisability judging means for returning an acceptance enable signal or an acceptance disenable signal referring to a continuous-operation acceptance advisability data base in which continuous-operation acceptance advisability is described for each of the function items, when receiving an inquiry about the advisability of continuous operation acceptance from said continuous-operation judging section; and wherein said continuous-operation judging section generates no signal equivalent to the operation of the predetermined number of times even if the continuous operation period measured by said timer means reaches the predetermined period, when receiving the acceptance disenable signal from said continuous-operation acceptance advisability judging means.

7. The remote control unit as claimed in claim 4, wherein said control means includes item display order managing means for updating the select frequency of a select frequency management table in which a select frequency is described for each of the function items every time any function item is decided and instructed by said decision instruction input means, and for rearranging the function item display order of a function item display list for the function item select picture into the select frequency order of said select frequency management table.

8. The remote control unit as claimed in claim 1, further comprising vibration generating means for generating vibrations;

wherein said control means allows said vibration generating means to generate the vibrations when said function item select means, said decision instruction input means, and said cancel instruction input means are operated.

9. The remote control unit as claimed in claim 8, wherein said vibration generating means is a touch-sense response device for generating vibration by beating the unit body.

10. The remote control unit as claimed in claim 1, further comprising sounding means for outputting a sound;

wherein said control means allows said sounding means to output the sound every time the picture of said display means is updated and displayed.

11. The remote control unit as claimed in claim 10, wherein when any function item in the function item select picture displayed on said display means is selected, said sounding means reads out said selected function item.

12. The remote control unit as claimed in claim 1, further comprising:

vibration generating means for generating vibrations; and sounding means for outputting a sound, wherein said control means generates vibrations by said vibration generating means when said function item select means, said decision instruction input means, and said cancel instruction input means are operated, and by said sounding means, allows to output the sound every time the picture of said display means is updated and displayed and also when any function item in the function item select picture displayed on said display means is selected allows to read out said selected function item.

13. The remote control unit as claimed in claim 1, further comprising characteristic selecting means which can change the number of function items according to the design required from an operator, wherein said control means increases/decreases the number of function items on the basis of the information set by said characteristic selecting means and varies the size of the function item displayed on said display means.

14. The remote control unit as claimed in claim 13, wherein said communication means includes a plurality of infrared ray emission elements different in light distribution characteristic; and wherein said control means includes light emission element control means for controlling a light distribution of the infrared ray signal transmitted from said communication means in correspondence with the selected device to be remotely controlled and the function item selected by said characteristic selecting means, referring to light distribution management data base where a light distribution characteristic is set for each of the devices to be remotely controlled in advance.

15. The remote control unit as claimed in claim 1, further comprising pattern operation mode selecting means for selecting an operation mode in which the plurality of devices to be remotely controlled with a predetermined relation to be operated are operated at the same time;

wherein when said operation mode is selected by said pattern operation mode selecting means, said control means allows the function item select picture where the function items for operating the plurality of devices to be remotely controlled with the predetermined relation to be operated at the same time are arranged to be displayed on said display means.

16. The remote control unit as claimed in claim 1, wherein said communication means includes a plurality of infrared ray emission elements;

wherein said control means includes light emission element control means for controlling a light emission intensity of the infrared ray signal transmitted from said communication means in correspondence with the selected device to be remotely controlled, referring to light emission intensity management data where a light emission intensity is set for each of the devices to be remotely controlled in advance.

17. The remote control unit as claimed in claim 16, wherein said control means further includes operation history memory means for storing the device to be remotely controlled which has been selected previously and its operation function; and wherein when a device to be remotely controlled which is selected presently and its operation function are identical with the device to be remotely controlled which has been selected previously and its operation function which are stored in said operation history memory means, said light emission element control means controls the light emission intensity of the infrared ray signal transmitted from said communication means to become larger than the light emission intensity of said light emission intensity management data and rewrites the light emission intensity of said light emission intensity management data.

18. The remote control unit as claimed in claim 1, wherein said communication means includes a plurality of infrared ray emission elements different in light distribution characteristic; and wherein said control means includes light emission element control means for controlling a light distribution of the infrared ray signal transmitted from said communication means in correspondence with the selected device to be remotely controlled, referring to light distribution management data base where a light distribution characteristic is set for each of the devices to be remotely controlled in advance.

19. The remote control unit as claimed in claim 1, further comprising an operation detecting sensor for detecting specific operation;

wherein when said specific operation is detected by said operating detecting sensor, said control means allows said communication means to convert the instruction code of the specific operation of the device to be remotely controlled in correspondence with said specific operation into an infrared ray signal and to transmit the infrared ray signal.

20. A remote control unit, comprising:

display means for displaying a function item select picture where a plurality of function items are arranged;

function item select means for selecting any function item in said function item select picture;

decision instruction input means for deciding said selected function item;

cancel instruction input means for canceling said selected function item;

control means for allowing another function item select picture, where a plurality of other function items are arranged, to be displayed on the display means when a specific function item is decided and instructed by said decision instruction input means, and for outputting an instruction code of said specific function item as decided and instructed;

communication means for converting said output instruction code into a radio signal to transmit the radio signal to a device to be remotely controlled; and subject-device identifying means for identifying a device to be remotely controlled on the basis of a direction of a unit body which is directed to the device to be remotely controlled;

wherein said control means allows the function item select picture, in which a plurality of set functions are arranged for the device to be remotely controlled which is identified by said subject-device identifying means, to be displayed on said display means as an initial picture.

21. The remote control unit as claimed in claim 20, wherein said subject-device identifying means is an angle sensor for identifying the device to be remotely controlled on the basis of an elevation angle of the unit body when said subject device identifying means is directed to the device to be remotely controlled.

22. A remote control unit, comprising:

display means for displaying a function item select picture where a plurality of function items are arranged;

function item select means for selecting any function item in said function item select picture;

decision instruction input means for deciding said selected function item;

cancel instruction input means for canceling said selected function item;

control means for allowing another function item select picture, where a plurality of other function items are arranged, to be displayed on the display means when a specific function item is decided and instructed by said decision instruction input means, and for outputting an instruction code of said specific function item as decided and instructed; and communication means for converting said output instruction code into a radio signal to transmit the radio signal to a device to be remotely controlled;

wherein said device to be remotely controlled includes a device identification code transmitting section;

wherein said communication means obtains directivity and includes a receiving means for receiving the device identification code transmitted from a plurality of the devices to be remotely controlled; and wherein by facing said receiving means to a specific direction of the device to be remotely controlled, said control means identifies the device to be remotely controlled on the basis of device identification code received by said communication means, and allows the function item select picture, in which a plurality of set functions are arranged for said identified device to be remotely controlled, to be displayed on said display means as the initial picture.

* * * * *